(12) United States Patent
Saito

(10) Patent No.: US 8,797,785 B2
(45) Date of Patent: Aug. 5, 2014

(54) SEMICONDUCTOR DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 242 days.

(21) Appl. No.: 13/293,173

(22) Filed: Nov. 10, 2011

(65) Prior Publication Data

US 2012/0120715 A1      May 17, 2012

(30) Foreign Application Priority Data

Nov. 12, 2010   (JP) ................................. 2010-253476
May 14, 2011   (JP) ................................. 2011-108889

(51) Int. Cl.
*G11C 11/24* (2006.01)

(52) U.S. Cl.
USPC ............................ 365/149; 365/145; 365/174

(58) Field of Classification Search
CPC ...................................................... G11C 11/401
USPC ......................................... 365/149, 145, 174
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,291,251 B1 * | 9/2001 | Nam | 438/3 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,787,835 B2 | 9/2004 | Atwood et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Vu Le
*Assistant Examiner* — Han Yang
(74) *Attorney, Agent, or Firm* — Fish & Richardson P.C.

(57) ABSTRACT

Provided is a memory device in which memory capacity per unit area is increased without making the manufacturing process complicated. The memory device includes a plurality of memory cells, a plurality of word lines, and a plurality of bit lines. Each of the plurality of memory cells includes a switching element and a capacitor including a first electrode and a second electrode. In at least one of the plurality of memory cells, in accordance with a potential applied to one of the plurality of word lines, the switching element controls a connection between one of the plurality of bit lines and the first electrode, and the second electrode is connected to another one of the plurality of word lines.

20 Claims, 32 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0133531 A1* | 6/2010 | Akimoto et al. | 257/43 |
| 2010/0159639 A1* | 6/2010 | Sakata | 438/104 |
| 2011/0216571 A1* | 9/2011 | Yamazaki et al. | 365/72 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-312392 A | 11/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

(56) References Cited

OTHER PUBLICATIONS

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kamiya et al., "Carrier Transport Properties and Electronic Structures of Amorphous Oxide Semiconductors: The present status", Kotai Butsuri (Solid State Physics), 2009, vol. 44, pp. 621-633) with English translation.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, n. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner

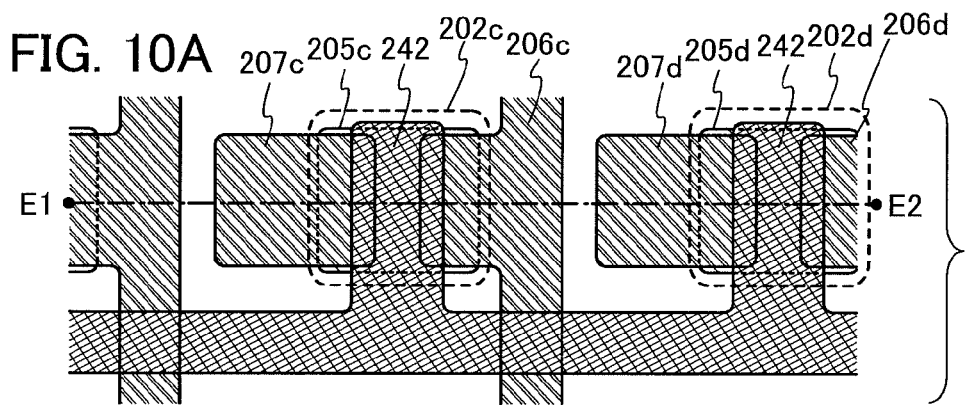
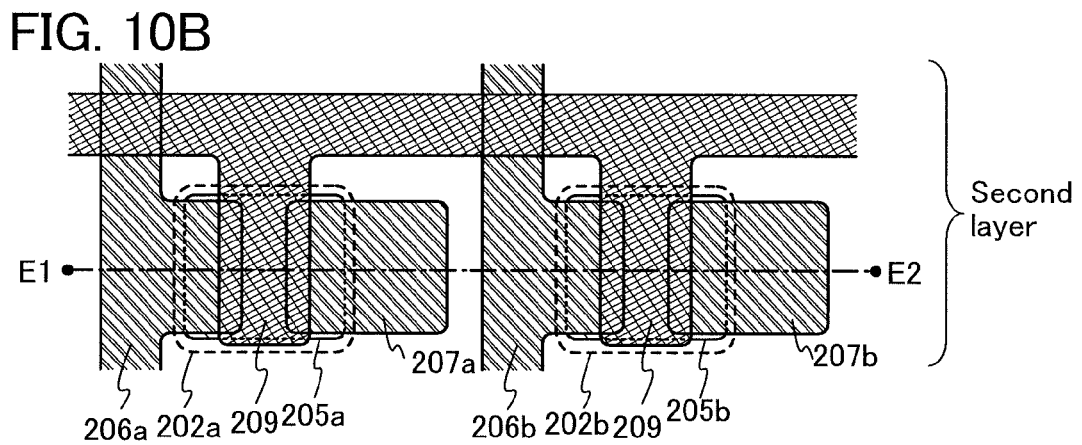
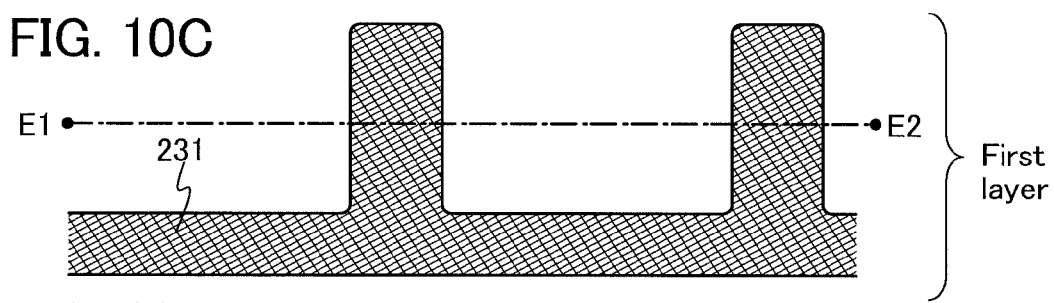
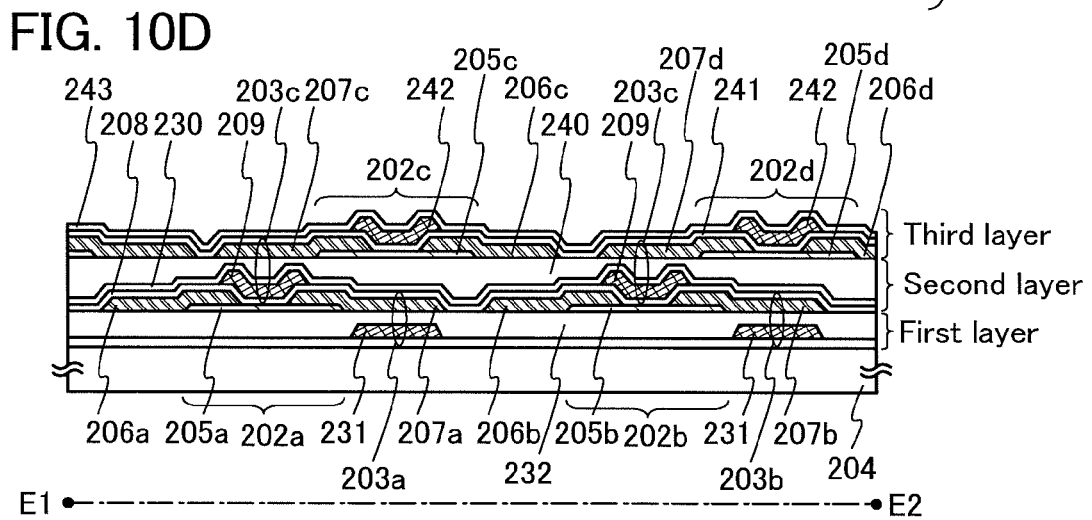

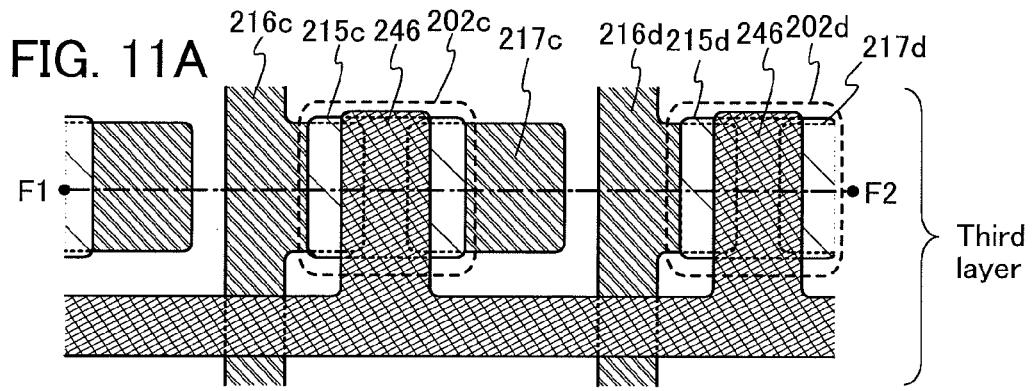
FIG. 11A — Third layer
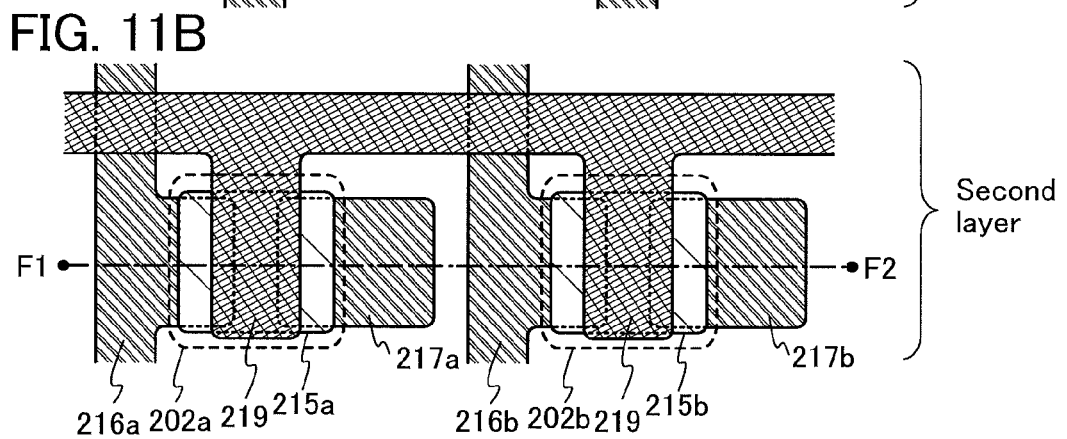
FIG. 11B — Second layer
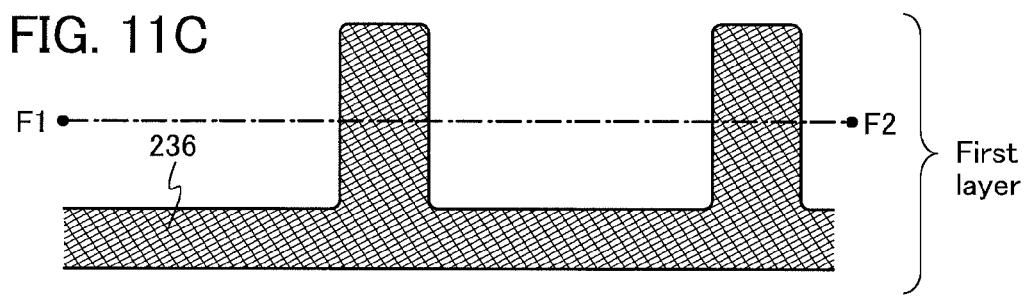
FIG. 11C — First layer
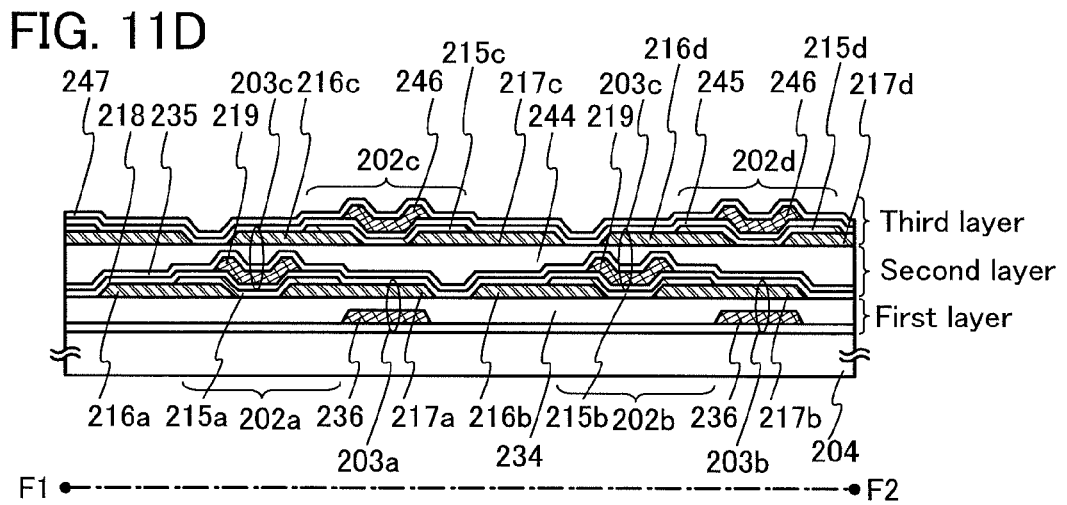
FIG. 11D ● In
☾ Sn
☽ Zn
• O

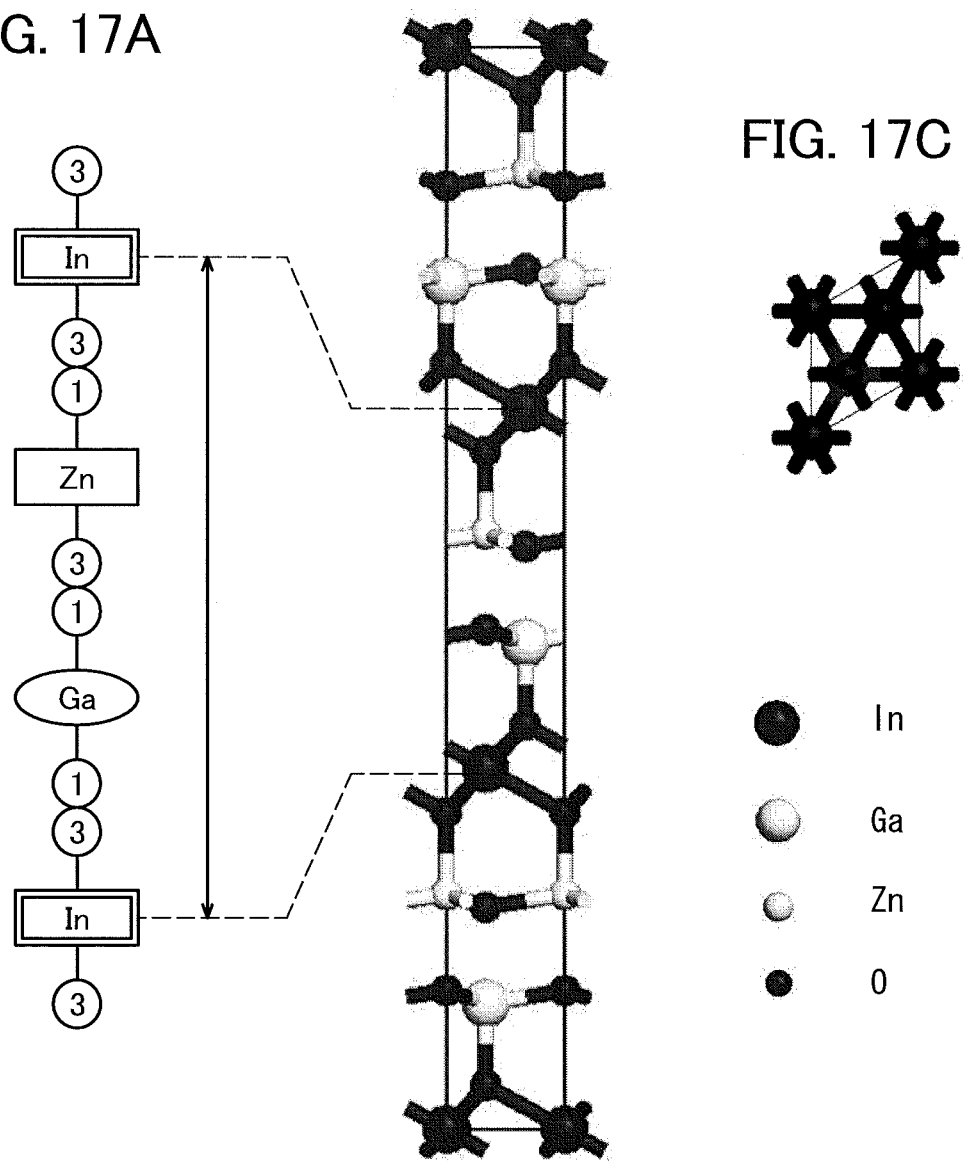

SEMICONDUCTOR DEVICE

BACKGROUND OF THE INVENTION

1. Field of the Invention

The present invention relates to a memory device and a semiconductor device including the memory device.

2. Description of the Related Art

A DRAM (Dynamic Random Access Memory), which is one of semiconductor memory devices (hereinafter, also referred to just as memory devices), has a simple structure in which a memory cell includes a transistor and a capacitor (hereinafter, also referred to as a capacitor element). Thus, a DRAM needs fewer semiconductor elements for forming a memory cell than other memory devices such as an SRAM (Static Random Access Memory); therefore, memory capacity per unit area can be increased and cost can be reduced as compared to other memory devices.

A DRAM is advantageous for large storage capacity as compared to other memory devices; however, memory capacity per unit area needs to be further increased as in other memory devices in order that an LSI having higher degree of integration is realized while an increase in a chip size is suppressed. For that purpose, the area of a memory cell needs to be reduced; however, as the capacitance value is decreased due to reduction in the area of a capacitor element, difference of the amount of electric charge between the digital values becomes smaller. Accordingly, frequency of refresh operations needs to be increased and power consumption is increased. Thus, when memory capacity per unit area in a DRAM is increased, the area of a memory cell needs to be decreased while the capacitance value of a capacitor is ensured above a certain amount.

Patent Document 1 below discloses a structure of DRAM in which a bit line and a word line are shared with each other and the area of a memory cell is decreased with the use of transistors of different conductive types for a first memory cell and a second memory cell.

[Reference]
[Patent Document 1] Japanese Published Patent Application No. 7-312392

SUMMARY OF THE INVENTION

The DRAM described in Patent Document 1 needs to use transistors of different conductivity types and thus has disadvantage of increasing the number of manufacturing steps as compared to a DRAM using a transistor of one conductivity type. In addition, it is difficult for transistors of different conductivity types to have uniform transistor characteristics, such as an on-state current or a threshold voltage. Thus, a data holding time, a voltage which needs to be applied to a transistor in writing, and the like tend to vary among memory cells. In order to have uniform transistor characteristics, process conditions, a transistor layout, and the like need to be controlled exactly, so that a manufacturing process becomes complicated.

In view of the above problems, an object of the present invention is to propose a memory device in which memory capacity per unit area can be increased without making a manufacturing process complicated. Further, an object of the present invention is to propose a semiconductor device including a memory device, which is miniaturized and highly sophisticated by increasing memory capacity per unit area of the memory device without making a manufacturing process complicated while cost is reduced.

Each memory cell included in a DRAM is connected to a word line through which a signal for controlling switching of a switching element is supplied to the memory cell, a bit line for writing data to the memory cell and reading data from the memory cell, and a capacitor line for supplying a common potential which is connected to one electrode of a pair of electrodes of a capacitor. The present inventor has thought that the word line serves as the capacitor line, whereby the number of lines included in a cell array can be reduced.

In view of the above, a memory device according to one embodiment of the present invention controls switching of a switching element and supplies a potential to a capacitor using a word line. When one of the memory cells is focused, a word line for controlling switching of a switching element in the memory cell and a word line for supplying a potential to a capacitor in the memory cell are different word lines. In other words, the memory device according to one embodiment of the present invention has a structure in which one word line is connected to switching elements of memory cells in one row and is connected to capacitors in the other row.

Specifically, the memory device according to one embodiment of the present invention includes a plurality of memory cells and a plurality of word lines. The plurality of memory cells each includes a switching element and a capacitor in which inflow, holding, and outflow of electric charge is controlled by the switching element. Among two of the plurality of word lines, one is connected to the switching element and the other is connected to one electrode of a pair of electrodes of the capacitor.

In the memory device according to one embodiment of the present invention, a channel formation region of the transistor used as the switching element may include a semiconductor whose band gap is wider than that of silicon and whose intrinsic carrier density is lower than that of silicon. As such a semiconductor, for example, an oxide semiconductor, silicon carbide, gallium nitride, or the like which has approximately twice or more as wide band gap as silicon can be given. A transistor including the semiconductor can have much lower off-state current than a transistor including a normal semiconductor material such as silicon or germanium. The transistor having the above structure is used as a switching element for holding charge flowing into a capacitor, whereby leakage of charge from the capacitor can be prevented.

In the memory device according to one embodiment of the present invention, the word line serves as the capacitor line, whereby the number of lines included in a cell array can be reduced. Thus, the conductivity type of the transistors between the memory cells is not needed to be varied. Therefore, a memory device in which memory capacity per unit area is increased can be manufactured without making the manufacturing process complicated.

Further, in one embodiment of the present invention, a semiconductor device including a memory device, which is miniaturized and highly sophisticated by increasing memory capacity per unit area of the memory device without making a manufacturing process complicated while cost is reduced can be formed.

BRIEF DESCRIPTION OF THE DRAWINGS

FIGS. 10A to 10D are top-views and a cross-sectional view in which part of a cell array is enlarged.

FIGS. 11A to 11D are top-views and a cross-sectional view in which part of a cell array is enlarged.

FIGS. 17A to 17C are diagrams showing a crystal structure of an oxide semiconductor.

DETAILED DESCRIPTION OF THE INVENTION

Hereinafter, embodiments of the present invention will be described in detail with reference to the accompanying drawings. Note that the present invention is not limited to the following description and it is easily understood by those skilled in the art that the mode and details can be variously changed without departing from the scope and spirit of the present invention. Accordingly, the present invention should not be construed as being limited to the description of the embodiments below.

The present invention includes in its category the following various kinds of semiconductor devices in which a memory device can be used: integrated circuits such as microprocessors, image processing circuits, digital signal processors (DSPs), and microcontrollers, memory devices such as RF tags and memory cards, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element using a semiconductor film is included in a driver circuit.

(Embodiment 1)

Figure 1:
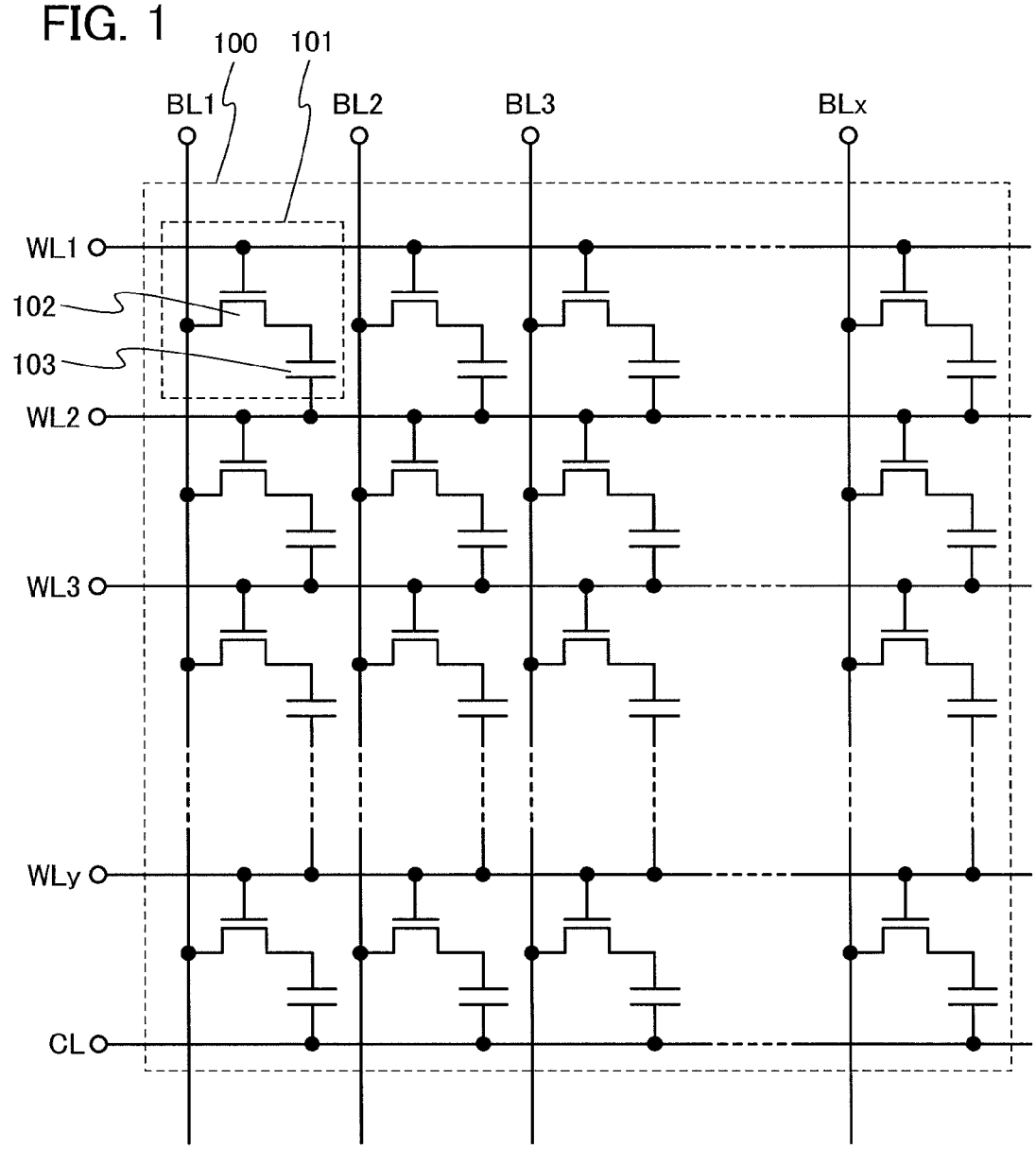
FIG. 1 is a circuit diagram showing a structure of a cell array.

FIG. 1 shows an example of a circuit diagram of a structure of a cell array 100 in the memory device according to one embodiment of the present invention. The cell array 100 shown in FIG. 1 includes a plurality of memory cells 101 arranged in matrix, a plurality of word lines WL, and a plurality of bit lines BL. A signal from a driver circuit is supplied to each memory cell 101 through the plurality of word lines WL and the plurality of bit lines BL.

The number of the word lines WL and the number of the bit lines BL can be determined in accordance with the number of the memory cells 101 and arrangement of the memory cells 101. The cell array 100 shown in FIG. 1 includes memory cells 101 in x rows and y column (x and y are both natural numbers), word lines WL1 to WLy, and bit lines BL1 to BLx.

Each memory cell 101 includes a transistor 102 serving as a switching element and a capacitor 103. Note that the memory cell 101 may further include another circuit element such as a transistor, a diode, a resistor, a capacitor, or an inductor as needed. The switching element using the transistor 102 controls inflow, holding, and outflow of electric charge in the capacitor 103. The switching element determines a digital value of the stored data in accordance with the difference of the amount of electric charge held in the capacitor 103.

The transistor 102 serving as a switching element includes a gate electrode, a semiconductor film serving as an activate layer, a gate insulating film placed between the gate electrode and the semiconductor film, and a source electrode and a drain electrode connected to the semiconductor film. With the potentials of the gate electrode, the source electrode, and the drain electrode of the transistor 102, a various kinds of operation of the memory device can be controlled.

Note that a wide-band-gap semiconductor such as an oxide semiconductor may be used for the semiconductor film of the transistor 102. Alternatively, a semiconductor such as amorphous, microcrystalline, polycrystalline, single crystal of silicon, germanium, silicon germanium, or single crystal silicon carbide may be used. For example, in the case of using silicon for the semiconductor film, a single crystal semiconductor substrate of silicon, a silicon thin film which is formed by an SOI method, a silicon thin film which is formed by a vapor deposition method or the like can be used as the semiconductor film.

As one example of a semiconductor which has a wider band gap than a silicon semiconductor and has a lower intrinsic carrier density than silicon, a compound semiconductor such as silicon carbide (SiC) or gallium nitride (GaN) can be given in addition to an oxide semiconductor. The oxide semiconductor has the advantage of mass productivity because it can be manufactured by a sputtering method or a wet process (e.g., a printing method), unlike the compound semiconductor such as silicon carbide or gallium nitride. In addition, the process temperature of silicon carbide and the process temperature of gallium nitride are approximately 1500° C. and approximately 1100° C., respectively, whereas the oxide semiconductor can be formed even at room temperature. Therefore, the oxide semiconductor can be formed over a glass substrate which is inexpensively available and it is possible to stack a semiconductor element formed using the oxide semiconductor over an integrated circuit including a semiconductor which does not have resistance enough to withstand heat treatment at a high temperature of 1500° C. to 2000° C. Further, the oxide semiconductor can respond to the increase in a substrate size. Therefore, the oxide semiconductor has particularly the advantage of mass productivity over silicon carbide or gallium nitride. Further, in the case where a crystalline oxide semiconductor is used in order to improve the property of a transistor (e.g., mobility), the crystalline oxide semiconductor can be easily obtained by heat treatment at 250° C. to 800° C.

Note that a highly-purified oxide semiconductor (a purified oxide semiconductor) obtained by reduction of impurities such as moisture or hydrogen which serve as electron donors (donors) and reduction of oxygen deficiency is an intrinsic (i-type) semiconductor or a substantially intrinsic semiconductor. Therefore, a transistor including the oxide semiconductor has a characteristic of very small off-state current. Specifically, the hydrogen concentration in the highly-purified oxide semiconductor which is measured by secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$. In addition, the carrier density of the oxide semiconductor film, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. The oxide semiconductor film which is highly purified by sufficiently reducing the concentration of impurities such as moisture or hydrogen and by reducing oxygen defects leads to a reduction of the off-state current of the transistor.

The analysis of the concentration of hydrogen in the oxide semiconductor film is described here. The concentration of hydrogen in the semiconductor film is measured by SIMS. It is known that it is difficult to obtain data in the proximity of a surface of a sample or in the proximity of an interface between stacked films formed using different materials by the SIMS in principle. Thus, in the case where the distribution of the hydrogen concentration of the film in a thickness direction is analyzed by SIMS, an average value in a region of the film, in which the value is not greatly changed and almost the same value can be obtained is employed as the hydrogen concentration. Further, in the case where the thickness of the film is small, a region where almost the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at the inflection point is employed as the hydrogen concentration.

Various experiments can actually prove low off current of the transistor including the highly-purified oxide semiconductor film as an active layer. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it can be found that an off current density corresponding to a value obtained by dividing the off current by the channel width of the transistor is less than or equal to 100 zA/μm. Further, the off-state current density was measured with the use of a circuit in which a capacitor and a transistor are connected to each other and charge that flows in or out from the capacitor is controlled by the transistor. In the measurement, the highly-purified oxide semiconductor film was used as a channel formation region in the transistor, and the off-state current density of the transistor was measured from change in the amount of electric charge of the capacitor per unit time. As a result, it was found that at a voltage between the source electrode and the drain electrode of the transistor of 3 V, a lower off-state current density of several tens yoctoampere per micrometer (yA/μm) was able to be obtained. Accordingly, the transistor including the highly-purified oxide semiconductor film as an active layer has much lower off current than a transistor including silicon having crystallinity.

Unless otherwise specified, in the case of an n-channel transistor, off-state current in this specification is current which flows between a source electrode and a drain electrode when a potential of the drain electrode is higher than that of the source electrode and that of a gate electrode while the potential of the gate electrode is less than or equal to zero when a reference potential is the potential of the source electrode. Alternatively, in this specification, in the case of a p-channel transistor, an off-state current is current which flows between a source electrode and a drain electrode when a potential of the drain electrode is lower than that of the source electrode or that of a gate electrode while the potential of the gate electrode is greater than or equal to zero when a reference potential is the potential of the source electrode.

An oxide semiconductor to be used preferably includes at least indium (In) or zinc (Zn). In particular, both In and Zn are preferably contained. As a stabilizer for reducing variation in electric characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0, and m is not an integer) may be used as an oxide semiconductor. Note that M represents one or more metal elements selected from Ga, Fe, Mn, and Co. Alternatively, as the oxide semiconductor, a material expressed by a chemical formula, $In_3SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on required semiconductor characteristics (e.g., mobility, threshold voltage, and variation). In order to obtain the required semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. Also in the case of using an In—Ga—Zn-based oxide, mobility can be increased by reducing the defect density in a bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced, and mobility higher than that of an amorphous oxide semiconductor can be obtained by increasing the surface planarity. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that $R_a$ is obtained by three-dimensionally expanding centerline average roughness that is defined by JIS B0601 so as to be able to be applied to a surface. $R_a$ can be expressed as an "average value of the absolute values of deviations from a reference surface to a specific surface" and is defined by Equation 1 below.

$$Ra = \frac{1}{S_0} \int_{y_1}^{y_2} \int_{x_1}^{x_2} |f(x, y) - Z_0| dx dy \qquad \text{[Equation 1]}$$

In the above equation, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In addition, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner when seen from the direction perpendicular to the c-axis, and the direction of the a-axis or the b-axis is varied in the a-b plane (the crystal rotates around the c-axis).

An oxide including CAAC means, in a broad sense, a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 15A:
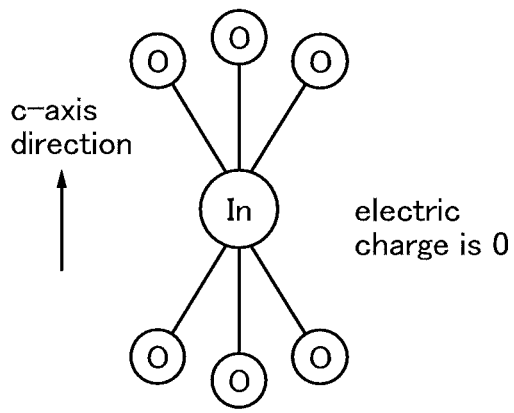
FIGS. 15A to 15E are diagrams showing a crystal structure of an oxide semiconductor.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
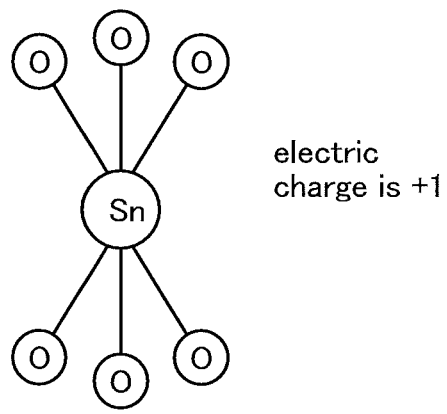
Figure 15B:
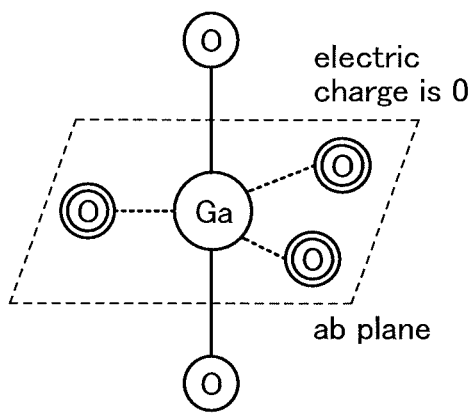

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
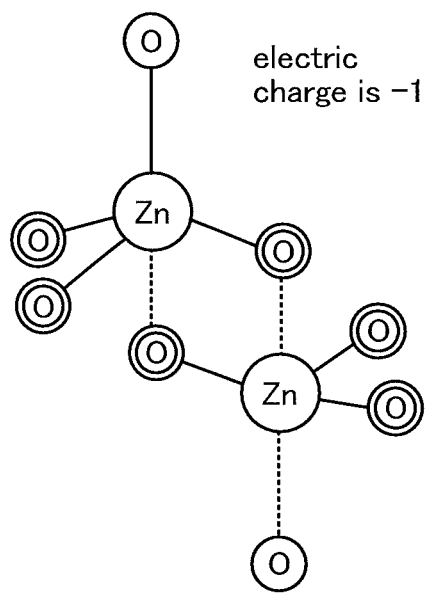
Figure 15C:
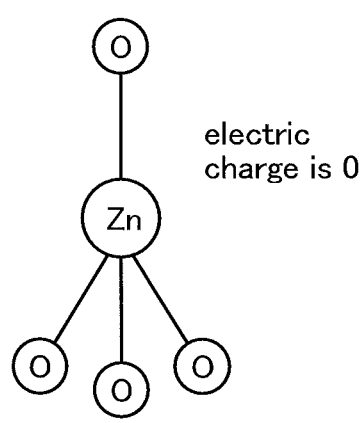

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups foam a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through a tetracoordinate O atom in the lower half, since the number of the tetracoordinate O atoms in the lower half of the hexacoordinate metal (In or Sn) atom is 3, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 16A:
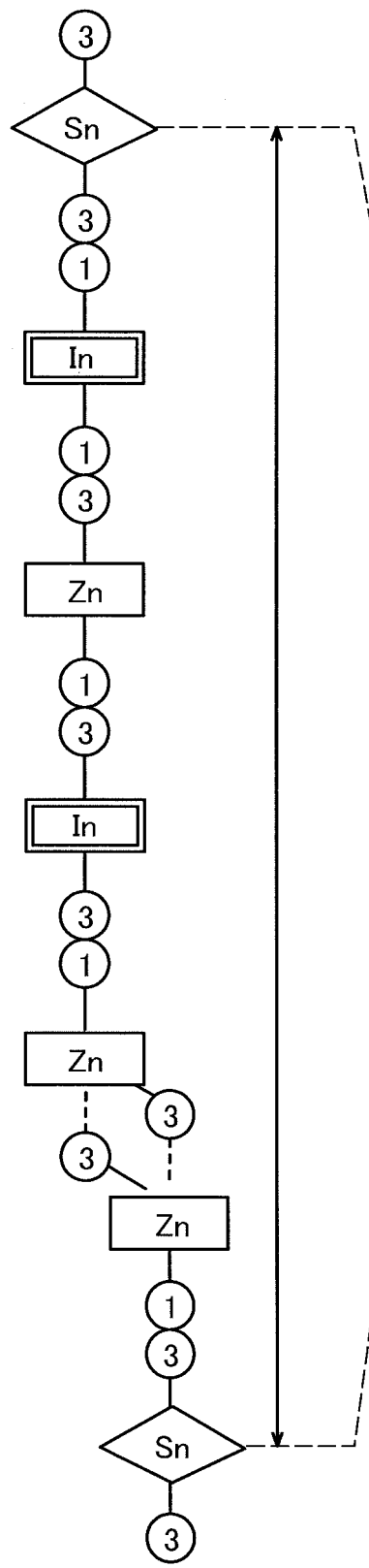
FIGS. 16A to 16C are diagrams showing a crystal structure of an oxide semiconductor.
Figure 16B:
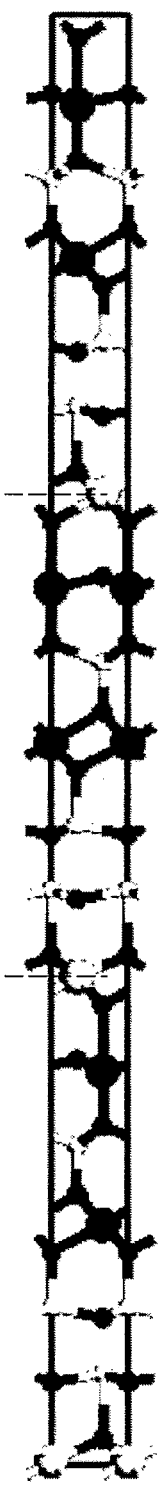
Figure 16C:
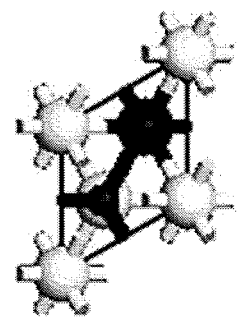

FIG. 16A illustrates a model of a medium group included in a layered structure of an In—Sn—Zn-based oxide. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, an In—Sn—Zn-based oxide crystal ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number). As larger m is, the crystallinity of the In—Sn—Zn—O-based oxide is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 17A illustrates a model of a medium group included in a layered structure of an In—Ga—Zn-based oxide.

In the medium group included in the layered structure of the In—Ga—Zn-based oxide in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 17A but also a medium group in which the arrangement of the In atom, the Ga atom, and the Zn atom is different from that in FIG. 17A.

Note that the terms "source terminal" and "drain terminal" of a transistor interchange with each other depending on the polarity of the transistor or a difference between levels of potentials applied to the electrodes. In general, in an n-channel transistor, an electrode to which a low potential is applied is called a source terminal, and an electrode to which a high potential is applied is called a drain terminal. Further, in a p-channel transistor, an electrode to which a low potential is applied is called a drain terminal, and an electrode to which a high potential is applied is called a source terminal. Hereinafter, one of a source terminal and a drain terminal is referred to as a first terminal and the other is referred to as a second terminal, and a connection relationship of the transistor 102 and the capacitor 103 included in the memory cell 101 is described.

In addition, a "source terminal" of a transistor means a source region that is a part of an active layer or a source electrode connected to an active layer. Similarly, "drain terminal" of a transistor means a drain region that is a part of an active layer or a drain electrode connected to an active layer.

In this specification, the "connection" means electrical connection and corresponds to the state in which current, voltage, or a potential can be supplied or transmitted. Therefore, the connection does not necessarily indicate a direct connection state and includes in its category an indirect connection state via an element such as a wiring, a conductive film, a resistor, a diode, or a transistor, in which current, voltage, or a potential can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In the memory cell 101 shown in FIG. 1, a gate electrode of the transistor 102 is connected to one of the word lines WL. A first terminal of the transistor 102 is connected to one of the bit lines BL, and a second terminal of the transistor 102 is connected to one electrode of the capacitor 103. The other electrode of the capacitor 103 is connected to another word line WL.

Specifically, in the memory cell 101 in a first row and a first column in the cell array 100 shown in FIG. 1, the gate electrode of the transistor 102 is connected to the word line WL1. A first terminal of the transistor 102 is connected to the bit line BL1, and a second terminal of the transistor 102 is connected to one of electrodes of the capacitor 103. The other electrode of the capacitor 103 is connected to a word line WL2.

In each of the memory cells 101 in a y-th row in the cell array 100 shown in FIG. 1, the other electrodes of the capacitors 103 is connected to a capacitor line CL.

The cell array shown in FIG. 1 is an example in which a given memory cell 101 is connected to two adjacent word lines; however, the present invention is not limited to this structure. Two adjacent word lines connected to a given memory cell 101 may be separated from each other.

Note that the memory cell 101 includes only one transistor 102 serving as a switching element in FIG. 1; however, the present invention is not limited to this structure. In one embodiment of the present invention, it is acceptable as long as one transistor serving as a switching element is provided in each memory cell, and the number of such transistors may be plural. In the case where the memory cell 101 includes a plurality of transistors serving as switching elements, the plurality of transistors may be connected to each other in parallel, in series, or in combination of parallel connection and series connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

Next, the operation of the memory device according to one embodiment of the present invention will be described giving the cell array 100 shown in FIG. 1 as an example. The operation of the cell array shown in FIG. 1 is different in a writing period Ta during which data is written, a holding period Ts during which data is held, and a reading period Tr during which data is read. An example of a timing chart of potentials applied to the cell array 100 in each of the periods will be shown in FIG. 4.

Figure 4:
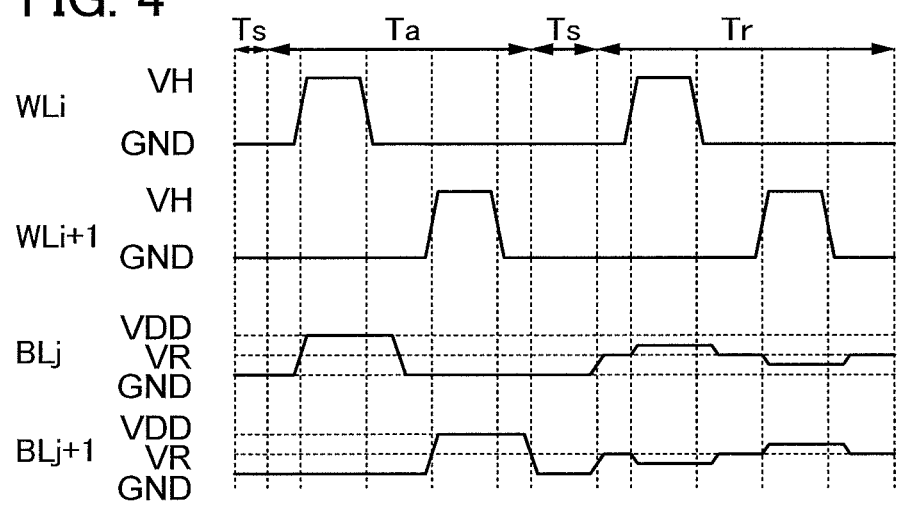
FIG. 4 is a timing chart of potentials applied to the cell array.

Note that FIG. 4 shows the case where data is written, held, and read in a memory cell 101 in an i-th row and a j-th column, a memory cell 101 in the i-th row and a (j+1)-th column, a memory cell 101 in an (i+1)-th row and the j-th column, and a memory cell 101 in the (i+1)-th row and the (j+1)-th column, as an example. These four memory cells 101 are included in memory cells in x rows and y columns.

First, the operation of the cell array 100 in the writing period Ta is described. Data is written row by row. FIG. 4 shows the case where data is written to the memory cell 101 in the i-th row and the j-th column and the memory cell 101 in the i-th row and the (j+1)-th column, and then, the data is written to the memory cell 101 in the (i+1)-th row and the j-th column and the memory cell 101 in the (i+1)-th row and the (j+1)-th column, as an example.

First, a word line WLi which is connected to the memory cells 101 in the i-th row to which data is written is selected. Specifically, a high-level potential VH is applied to the word line WLi and a ground potential GND is applied to the word lines other than the word line WLi, including the word line WL(i+1), in FIG. 4. Thus, only the transistors 102 whose gate electrodes are connected to the word line WLi are selectively turned on.

In the period during which the word line WLi is selected, potentials of signals including data are applied to a bit line BLj and a bit line BL(j+1). The levels of the potentials applied to the bit line BLj and the bit line BL(j+1) are naturally different depending on the content of data. FIG. 4 illustrates the case where the high-level potential VDD is applied to the bit line BLj and the ground potential GND is applied to the bit line BL(j+1). The potentials applied to the bit lines BLj and BL(j+1) are applied to one electrode of the capacitor 103 through the transistors 102 that are ON.

Note that the potential VH is equal to or higher than the potential VDD. Specifically, a potential difference between the potential VH and the potential VDD is equal to or higher than a threshold voltage of the transistor 102.

Figure 2A:
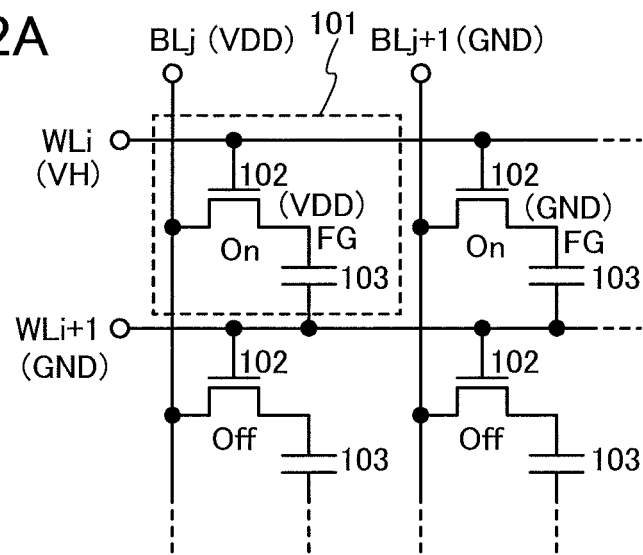
FIGS. 2A and 2B are diagrams schematically showing operation of a memory cell.

FIG. 2A schematically shows the operation of each of the memory cells 101 when data is written to the memory cells 101 in the i-th row. As shown in FIG. 2A, a node where the second terminal of the transistor 102 and one electrode of the capacitor 103 is connected is referred to as a node FG. In accordance with the above potentials, the potential of the node FG becomes the potential VDD in the memory cell 101 in the i-th row and the j-th column and the ground potential GND in the memory cell 101 in the i-th row and (j+1)-th column. The amount of electric charge flowing into the capacitor 103 is controlled in accordance with the potential of the node FG so that data is written to the memory cell 101 in the i-th row and the j-th column and the memory cell 101 in the i-th row and the (j+1)-th column.

Next, the ground potential GND is applied to the word line WLi. Thus, the transistors 102 whose gate electrodes are connected to the word line WLi are turned off and the charge is held in the capacitors 103.

Note that in the case where an oxide semiconductor is used for the semiconductor film of the transistor 102, the transistor 102 has a feature that the off-state current is extremely small. Therefore, the charge held in the capacitors 103 is difficult to leak, and thus, the data can be held for a long period of time as compared to the case where a semiconductor such as silicon is used for the transistor 102.

Next, a word line WL(i+1) which is connected to the memory cells 101 in the (i+1)-th row to which data is written is selected. Specifically, a high-level potential VH is applied to the word line WL(i+1) and a ground potential GND is applied to the word lines other than the word line WL(i+1), including the word line WLi, in FIG. 4. Thus, only the transistors 102 whose gate electrodes are connected to the word line WL(i+1) are selectively turned on.

Figure 2B:
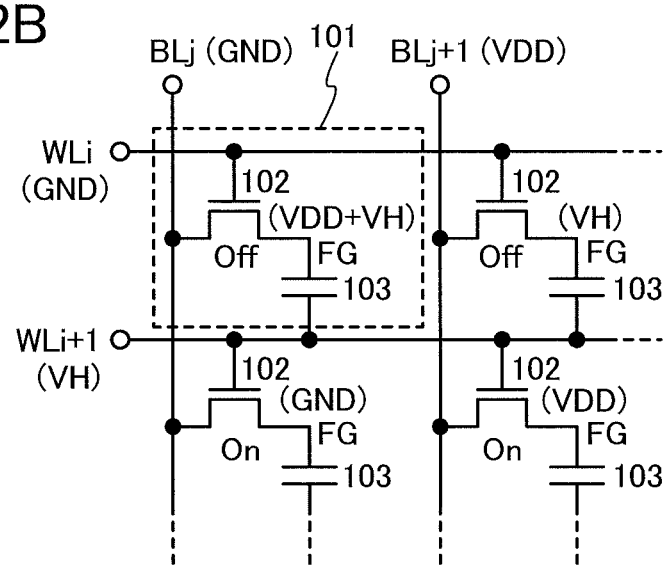

In the period during which the word line WL(i+1) is selected, potentials of signals including data are applied to the bit line BLj and the bit line BL(j+1). The levels of the potentials applied to the bit line BLj and the bit line BL(j+1) are naturally different depending on the content of data. FIG. 4 shows the case where the ground potential GND is applied to the bit line BLj and the high-level potential VDD is applied to the bit line BL(j+1), as an example. The potentials applied to the bit lines BLj and BL(j+1) are applied to one electrode of the capacitor 103 through the transistors 102 that are ON. FIG. 2B schematically shows the operation of each memory cell 101 when data is written to the memory cells 101 in the (i+1)-th row. As shown in FIG. 2B, in accordance with the above potentials, the potential of the node FG becomes the ground potential GND in the memory cell 101 in the (i+1)-th row and the j-th column and becomes the potential VDD in the memory cell 101 in the (i+1)-th row and the (j+1)-th column. The amount of electric charge flowing into the capacitor 103 is controlled in accordance with the potential of the node FG so that data is written to the memory cell 101 in the (i+1)-th row and the j-th column and the memory cell 101 in the (i+1)-th row and the (j+1)-th column.

Note that in the cell array 100 shown in FIG. 1, the word line WL(i+1) is connected to not only the memory cells 101 in the (i+1)-th row but also the memory cells 101 in the i-th row. Specifically, the word line WL(i+1) is connected to the other electrodes of the capacitors 103 included in the memory cells 101 in the i-th row. The ground potential GND is applied to the other electrodes of the capacitors 103 in the period during which the word line WLi is selected; however, the potential VH is applied in the period during which the word line WL(i+1) is selected, as shown in FIG. 2B. The potential difference between the pair of electrodes of the capacitor 103 is kept in accordance with the law of conservation of charge; thus, the potential difference between the potential VH and the ground potential GND is applied to the nodes FG of the memory cells 101 in the i-th row in the period during which the word line WL(i+1) is selected. As a result, the potential of the node FG in the memory cell 101 in the i-th row and the j-th column becomes the potential VDD+VH and the potential of the node FG in the memory cell 101 in the i-th row and the (j+1)-th column becomes the potential VH.

Next, the ground potential GND is applied to the word line WL(i+1). Thus, the transistors 102 whose gate electrodes are connected to the word line WL(i+1) are turned off and the charge is held in the capacitors 103. The potential difference between the pair of electrodes of the capacitor 103 is kept in accordance with the law of conservation of charge; thus, when the ground potential GND is applied to the word line WL(i+1), the node FG of the memory cell 101 in the i-th row and j-th column becomes the potential VDD, and the node FG of the memory cell 101 in the i-th row and (j+1)-th column becomes the ground potential GND.

In order to prevent writing of erroneous data to the memory cell 101, it is preferable to terminate a supply of potential including data to the bit line BL after each word line WL is selected.

Next, the operation of the cell array 100 in a data holding period Ts is described.

Figure 3A:
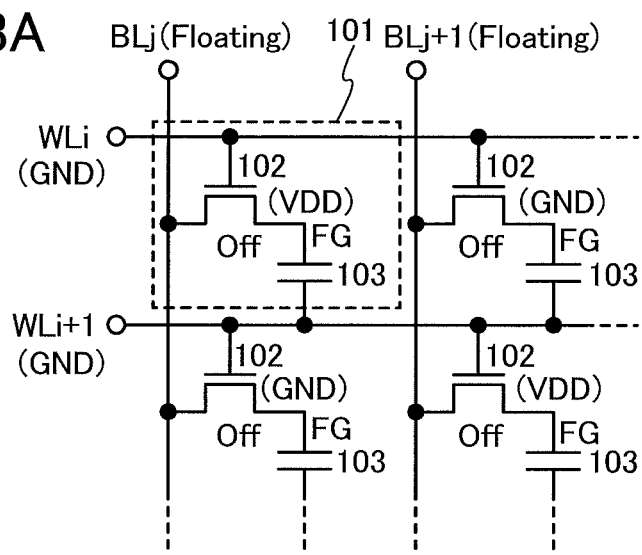
FIGS. 3A and 3B are diagrams schematically showing operation of a memory cell.

In the holding period Ts, a potential at which the transistor 102 is turned off, specifically, the ground potential GND is applied to all the word lines WL. FIG. 3A schematically shows the operation of each memory cell 101 when data is held in the memory cells in the i-th row and the memory cells 101 in the (i+1)-th row. As shown in FIG. 3A, data is held in a period during which the charge flowing into the capacitor 103 is held.

Then, the operation of the cell array 100 in a data reading period Tr is described.

First, in the reading period Tr, a high-level potential VR is applied to the bit line BL connected to the memory cells 101 from which data is read. Specifically, the high-level potential VR is applied to the bit line BLj connected to the memory cells 101 in the j-th row and the bit line BL(j+1) connected to the memory cells 101 in the (j+1)-th row in FIG. 4. Note that the potential VR is equal to the potential VDD, or lower than the potential VDD and higher than the ground potential GND. After the potential VR is applied, both of the bit line BLj and the bit line BL(j+1) are turned into a floating state.

Then, the word line WLi connected to the memory cells 101 in the i-th row from which data is read is selected. Specifically, the high-level potential VH is applied to the word line WLi and the ground potential GND is applied to the word lines other than the word line WLi, including the word line WL(i+1), in FIG. 4. Thus, only the transistors 102 whose gate electrodes are connected to the word line WLi are selectively turned on.

When the transistors 102 are turned on, the charge held in the capacitors 103 flows out to the bit lines BL through which data is read or the charge from the bit line BL through which data is read flows into the capacitors 103. Whether which operation is performed is determined in accordance with the potential of the node FG in the holding period.

Figure 3B:
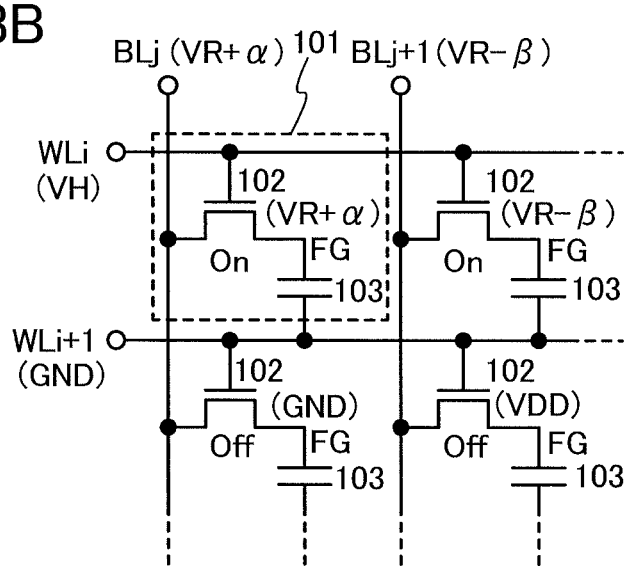

FIG. 3B schematically shows the operation of the memory cells 101 when data is read in the memory cells 101 in the i-th row. Specifically, in accordance with the timing chart shown in FIG. 4, the potential of the node FG in the memory cell 101 in the i-th row and the j-th column in the holding period before a reading period is the potential VDD. Thus, as shown in FIG. 3B, when the transistors 102 are turned off in the reading period, the charge flows from the capacitor 103 in the memory cell 101 in the i-th row and the j-th column into the bit line BLj, so that the potential of the bit line BLj increases to be a potential VR+α. In the holding period before the reading period, the potential of the node FG in the memory cell 101 in the i-th row and the (j+1)-th column is the ground potential GND. Thus, when the transistors 102 are turned on in the reading period, the charge flows from the bit line BL(j+1) into the capacitor 103 in the memory cell 101 in the i-th row and the (j+1)-th row, so that the potential of the bit line BL(j+1) decreases to be a potential VR-β.

Therefore, the potential of the bit line BLj and the potential of the BL(j+1) depend on the amount of charge held in the capacitor 103 in the memory cell 101 in the i-th row and the j-th column and the capacitor 103 in the memory cell 101 in the i-th row and the (j+1)-th column, respectively. Then, the difference between the amount of charge of the potentials is read, whereby data can be read from the memory cell 101 in the i-th row and the j-th column and the memory cell 101 in the i-th row and the (j+1)-th column.

After the data is read from the memory cell 101 in the i-th row and j-th column and the memory cell 101 in the i-th row and the (j+1)-th column, the high-level potential VR is applied again to the bit line BLj and the bit line BL(j+1) so that the bit line BLj and the bit line BL(j+1) are in the floating state.

Then, the word line WL(i+1) connected to the memory cells 101 in the i-th row from which data is read is selected. Specifically, the high-level potential VH is applied to the word line WL(i+1) and the ground potential GND is applied to the word lines other than word line WL(i+1), including the word line WLi, in FIG. 4. Thus, only the transistors 102 whose gate electrodes are connected to the word line WL(i+1) are selectively turned on.

When the transistors 102 are turned on, the charge held in the capacitors 103 flows out to the bit lines BL through which data is read or the charge from the bit line BL through which data is read flows into the capacitors 103. Whether which operation is performed is determined in accordance with the potential of the node FG in the holding period.

Specifically, in accordance with the timing chart shown in FIG. 4, the potential of the node FG in the memory cell 101 in the (i+1)-th row and the j-th column in the holding period before a reading period is the ground potential GND. Thus, when the transistors 102 are turned on in the reading period, the charge flows from the bit line BLj into the capacitor 103 in the memory cell 101 in the (i+1)-th row and the j-th row, so that the potential of the bit line BLj decreases to be a potential VR-β. In the holding period before the reading period, the potential of the node FG in the memory cell 101 in the (i+1)-th row and the (j+1)-th column is the potential VDD. Thus, when the transistors 102 are turned off in the reading period, the charge flows from the capacitor 103 in the memory cell 101 in the (i+1)-th row and the (j+1)-th column into the bit line BL(j+1), so that the potential of the bit line BL(j+1) increases to be a potential VR+α.

Therefore, the potential of the bit line BLj and the potential of the BL(j+1) depend on the amount of charge held in the capacitor 103 in the memory cell 101 in the (i+1)-th row and the j-th column and the capacitor 103 in the memory cell 101 in the (i+1)-th row and the (j+1)-th column, respectively. Then, the difference between the amount of charge of the potentials is read, whereby data can be read from the memory cell 101 in the (i+1)-th row and the j-th column and the memory cell 101 in the (i+1)-th row and the (j+1)-th column.

Note that a reading circuit is connected to an end of each bit line BL, and a signal output from the reading circuit includes data which is actually read from the cell array 100.

The operation of writing, holding, and reading in four memory cells 101 adjacent to one another is described in this embodiment; however, the present invention is not limited to this structure. The operation can be performed in a memory cell 101 with the specified address.

Note that the potential of the capacitor line CL is fixed at the ground potential GND or the like through all the period.

The memory device shown in one embodiment of the present invention has a structure in which one word line is connected to switching elements of memory cells in one row and is connected to capacitors in the other row. Therefore, the number of lines connected to memory cells can be reduced. However, as described above, when the word line connected to the capacitor element is selected, the potential of the node FG increases in accordance with the increase of the potential of the word line. For example, in the case where the high-level potential VDD has already applied to the node FG before data is written to (i+1)-th row, the potential of the node FG increases to be a potential VDD+VH in the memory cell 101 in the i-th row and the j-th column in accordance with the increase of the potential of the word line WL(i+1) as shown in FIG. 2B. Thus, a potential difference between a source terminal and a drain terminal is large in the transistor 102 in the memory cell 101 in the i-th row and the j-th column, which leads to an increase in the off-state current. For this reason, a wide-band-gap semiconductor, such as an oxide semiconductor, is preferably used for the semiconductor film of the transistor 102 so that the off-state current in the transistor 102 is extremely lowered. With the off-state current in the transistor 102 extremely lowered, even when the potential difference between the source terminal and the drain terminal is large, the leak of the charge from the memory cell 101 can be prevented, and the period during which data is held can be secured.

Next, a specific example of the structure of the memory cells 101 is described.

Figure 5A:
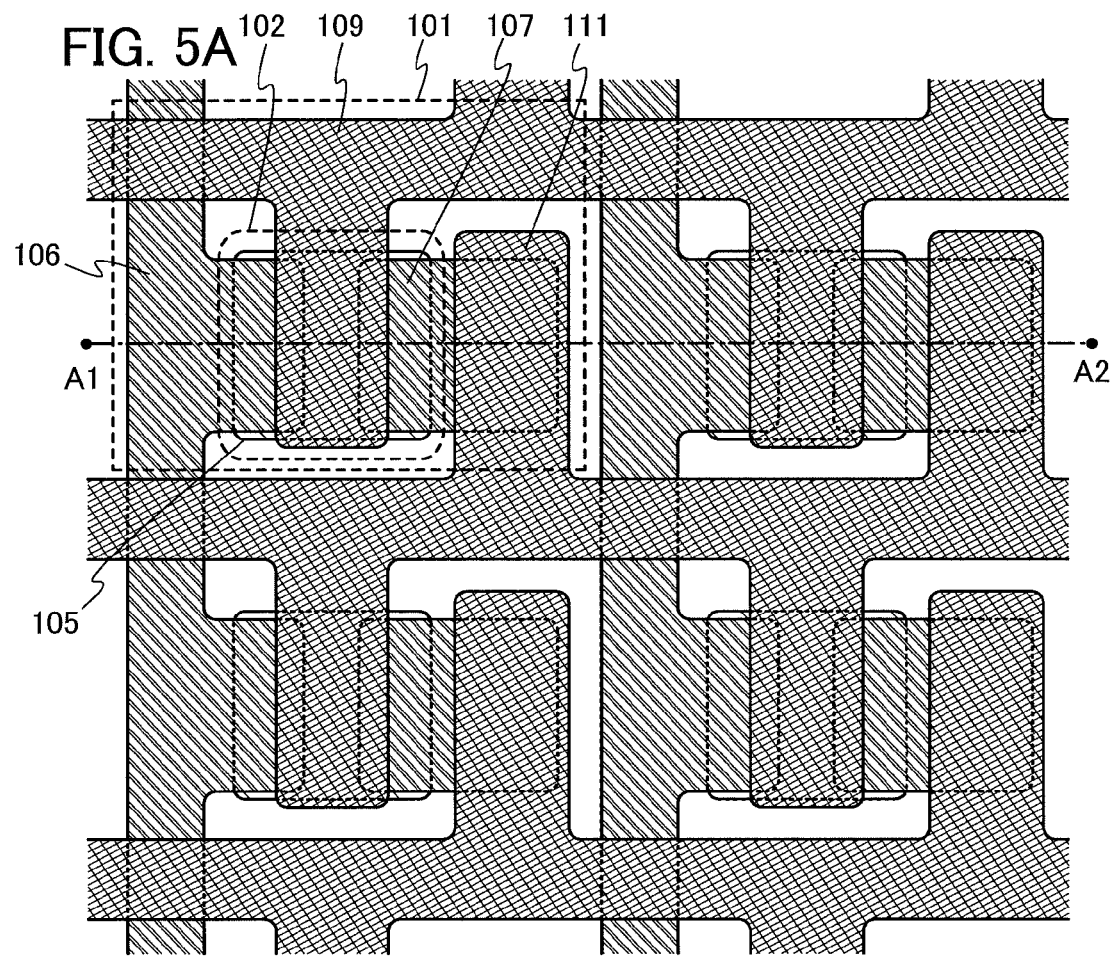
FIGS. 5A and 5B are a top-view and a cross-sectional view in which part of a cell array is enlarged.
Figure 5B:
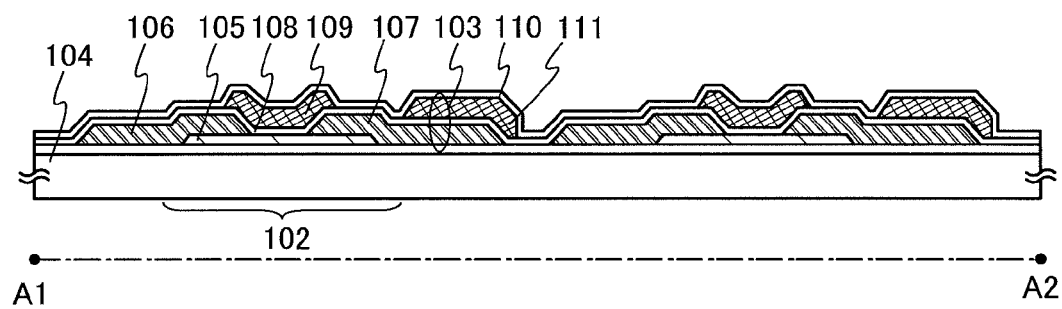

FIG. 5A shows an example of a top view in which part of the cell array 100 shown in FIG. 1 is enlarged. FIG. 5B shows a cross-sectional view along dashed line A1-A2 in FIG. 5A. FIGS. 5A and 5B show the structure in which the transistor 102 and the capacitor 103 are formed over a substrate 104 having an insulating surface.

The transistor 102 includes, over the substrate 104 having an insulating surface, a semiconductor film 105, a conductive film 106 and a conductive film 107 each serving as a source electrode or a drain electrode over the semiconductor film 105, an insulating film 108 over the semiconductor film 105, the conductive film 106, and the conductive film 107, and a conductive film 109 serving as a gate electrode provided in a position overlapping with the semiconductor film 105 with the insulating film 108 provided therebetween. The transistor 102 may further include an insulating film 110 covering the conductive film 109. The transistor 102 shown in FIGS. 5A and 5B has a top-gate top-contact structure.

The capacitor 103 includes a conductive film 107 formed over the substrate 104 having an insulating surface, an insulating film 108 over the conductive film 107, and a conductive film 111 overlapping with the conductive film 107 with the insulating film 108 provided therebetween. A portion in which the conductive film 107, the insulating film 108, and the conductive film 111 overlap one another serves as the capacitor 103.

Note that the conductive film 106 serves as one of a source electrode and a drain electrode of the transistor 102 and also serves as a bit line. The conductive film 109 serves as a gate electrode of the transistor 102 and also serves as a word line. The conductive film 107 serves as the other of the source electrode and the drain electrode of the transistor 102 and also serves as an electrode of the capacitor 103. The conductive film 111 serves as an electrode of the capacitor 103 and also serves as a word line.

Figure 6A:
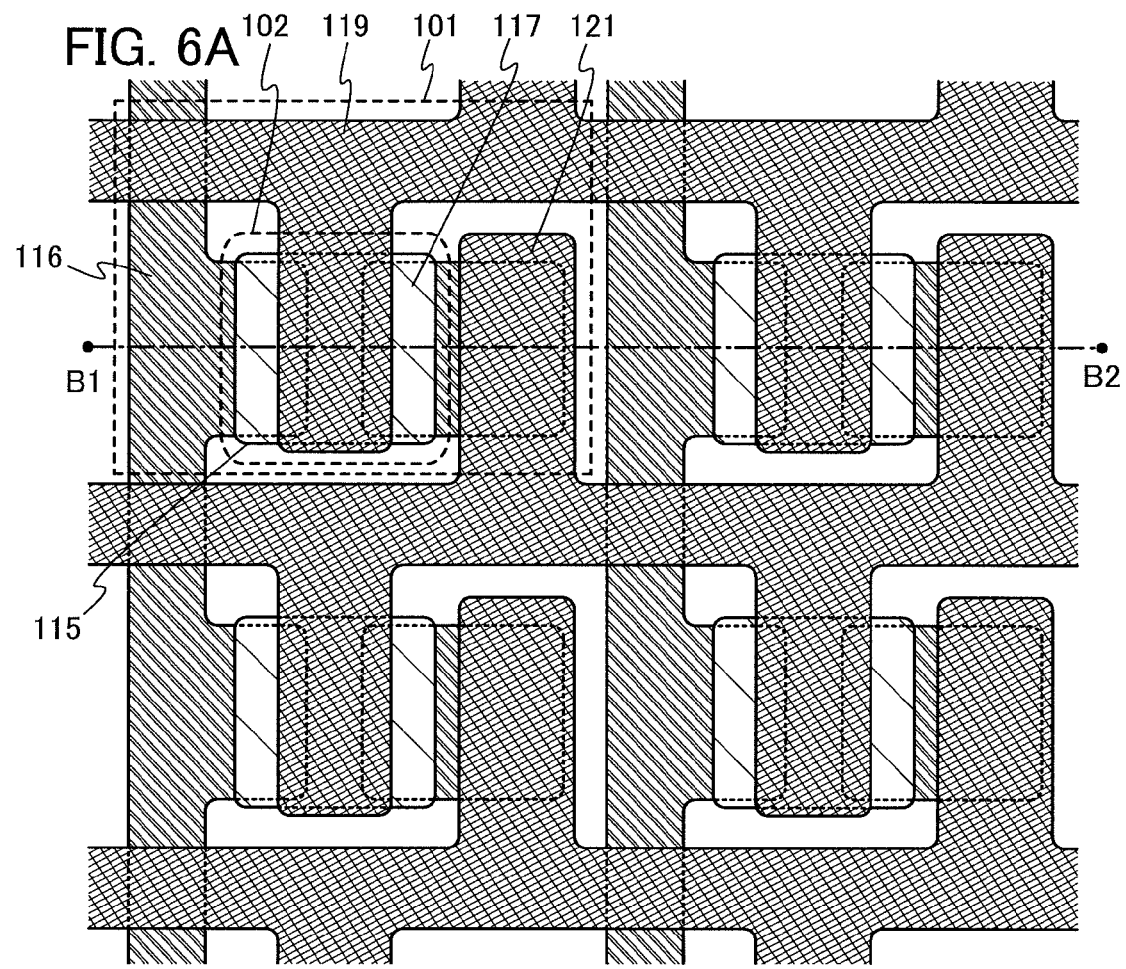
FIGS. 6A and 6B are a top-view and a cross-sectional view in which part of a cell array is enlarged.
Figure 6B:
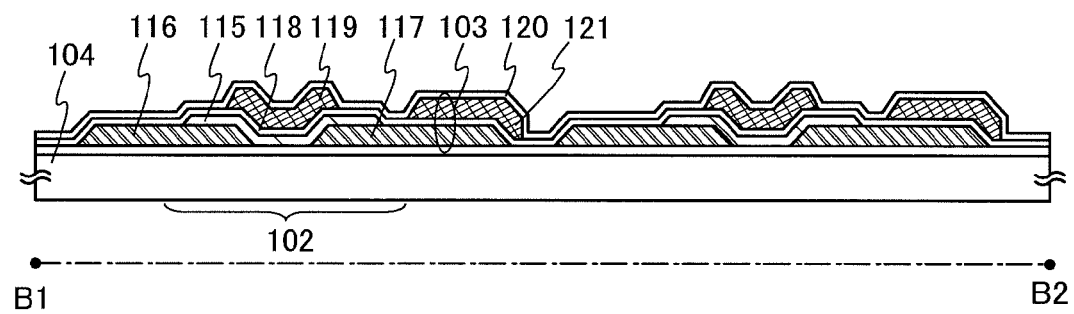

FIG. 6A shows another example of a top view in which part of the cell array 100 shown in FIG. 1 is enlarged. FIG. 6B shows a cross-sectional view along dashed line B1-B2 in FIG. 6A. FIGS. 6A and 6B show the structure in which the transistor 102 and the capacitor 103 are formed over the substrate 104 having an insulating surface.

The transistor 102 includes, over the substrate 104 having an insulating surface, a conductive film 116 and a conductive film 117 each serving as a source electrode or a drain electrode; a semiconductor film 115 over the conductive film 116 and the conductive film 117; an insulating film 118 over the conductive film 116, the conductive film 117, and the semiconductor film 115; and a conductive film 119 serving as a gate electrode provided in a position overlapping with the semiconductor film 115 with the insulating film 118 provided therebetween. The transistor 102 may further include an insulating film 120 covering the conductive film 119. The transistor 102 shown in FIGS. 6A and 6B has a top-gate bottom-contact structure.

The capacitor 103 includes a conductive film 117 formed over the substrate 104 having an insulating surface, an insulating film 118 over the conductive film 117, and a conductive film 121 overlapping with the conductive film 117 with the insulating film 118 provided therebetween. A portion in which the conductive film 117, the insulating film 118, and the conductive film 121 overlap one another serves as the capacitor 103.

Note that the conductive film 116 serves as one of a source electrode and a drain electrode of the transistor 102 and also serves as a bit line. The conductive film 119 serves as a gate electrode of the transistor 102 and also serves as a word line. The conductive film 117 serves as the other of the source electrode and the drain electrode of the transistor 102 and also serves as an electrode of the capacitor 103. The conductive film 121 serves as an electrode of the capacitor 103 and also serves as a word line.

Figure 7A:
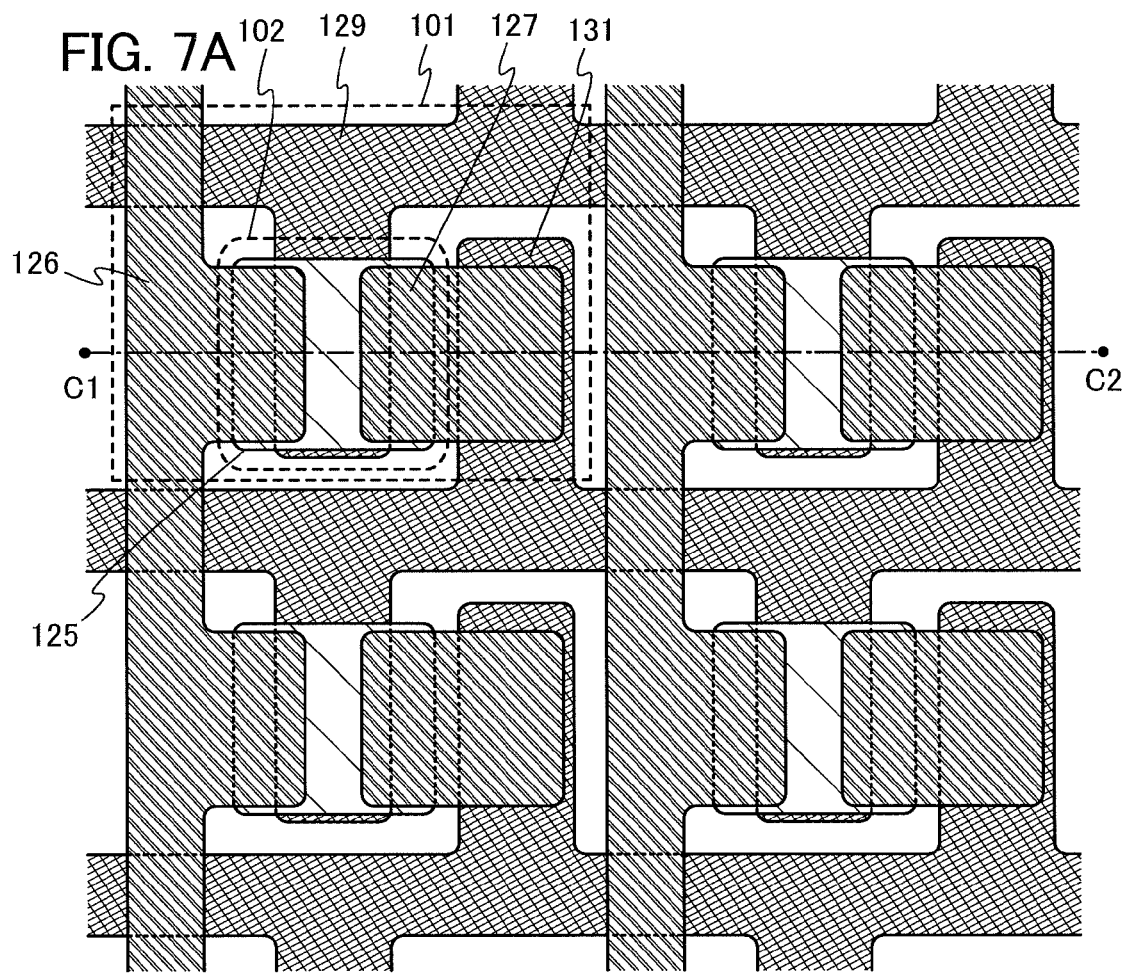
FIGS. 7A and 7B are a top-view and a cross-sectional view in which part of a cell array is enlarged.
Figure 7B:
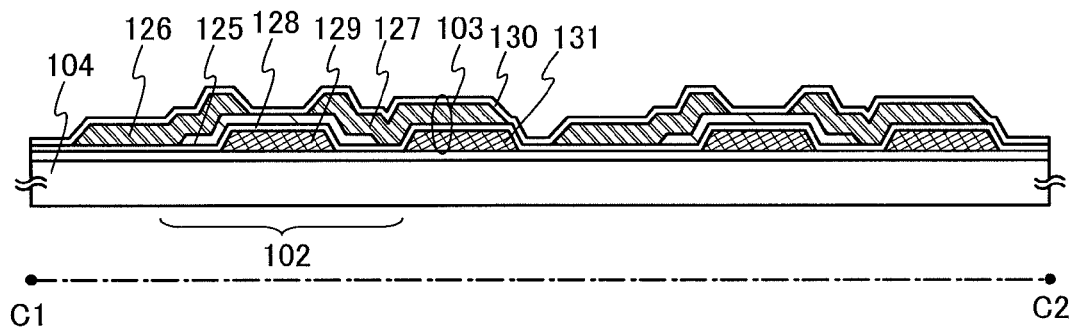

FIG. 7A shows another example of a top view in which part of the cell array 100 shown in FIG. 1 is enlarged. FIG. 7B shows a cross-sectional view along dashed line C1-C2 in FIG. 7A. FIGS. 7A and 7B show the structure in which the transistor 102 and the capacitor 103 are formed over the substrate 104 having an insulating surface.

The transistor 102 include, over the substrate 104 having an insulating surface, a conductive film 129 serving as a gate electrode, an insulating film 128 over the conductive film 129, a semiconductor film 125 provided in a position overlapping with the conductive film 129 with the insulating film 128 provided therebetween, and a conductive film 126 and a conductive film 127 each serving as a source electrode or a drain electrode over the semiconductor film 125. The transistor 102 may further include an insulating film 130 covering the semiconductor film 125, the conductive film 126, and the conductive film 127. The transistor 102 shown in FIGS. 7A and 7B has a bottom-gate top-contact structure.

The transistor 102 includes a channel-etched structure in which the semiconductor film 125 is exposed in a portion between the conductive film 126 and the conductive film 127 and in contact with the insulating film 130. The transistor 102 may further include a channel protective film formed using an insulating film over the semiconductor film 125 between the conductive film 126 and the conductive film 127. The channel protective film can prevent damage such as reduction in thickness due to plasma or an etchant in etching to a portion to be a channel formation region in the semiconductor film 125 when the conductive film 126 and the conductive film 127 are formed. Therefore, reliability of the transistor 102 can be improved.

The capacitor 103 includes a conductive film 131 formed over the substrate 104 having an insulating surface, an insulating film 128 over the conductive film 131, and a conductive film 131 overlapping with the conductive film 127 with the insulating film 128 provided therebetween. A portion in which the conductive film 131, the insulating film 128, and the conductive film 127 overlap one another serves as the capacitor 103.

Note that the conductive film 126 serves as one of a source electrode and a drain electrode of the transistor 102 and also serves as a bit line. The conductive film 129 serves as a gate electrode of the transistor 102 and also serves as a word line. The conductive film 127 serves as the other of the source electrode and the drain electrode of the transistor 102 and also serves as an electrode of the capacitor 103. The conductive film 131 serves as an electrode of the capacitor 103 and also serves as a word line.

Figure 8A:
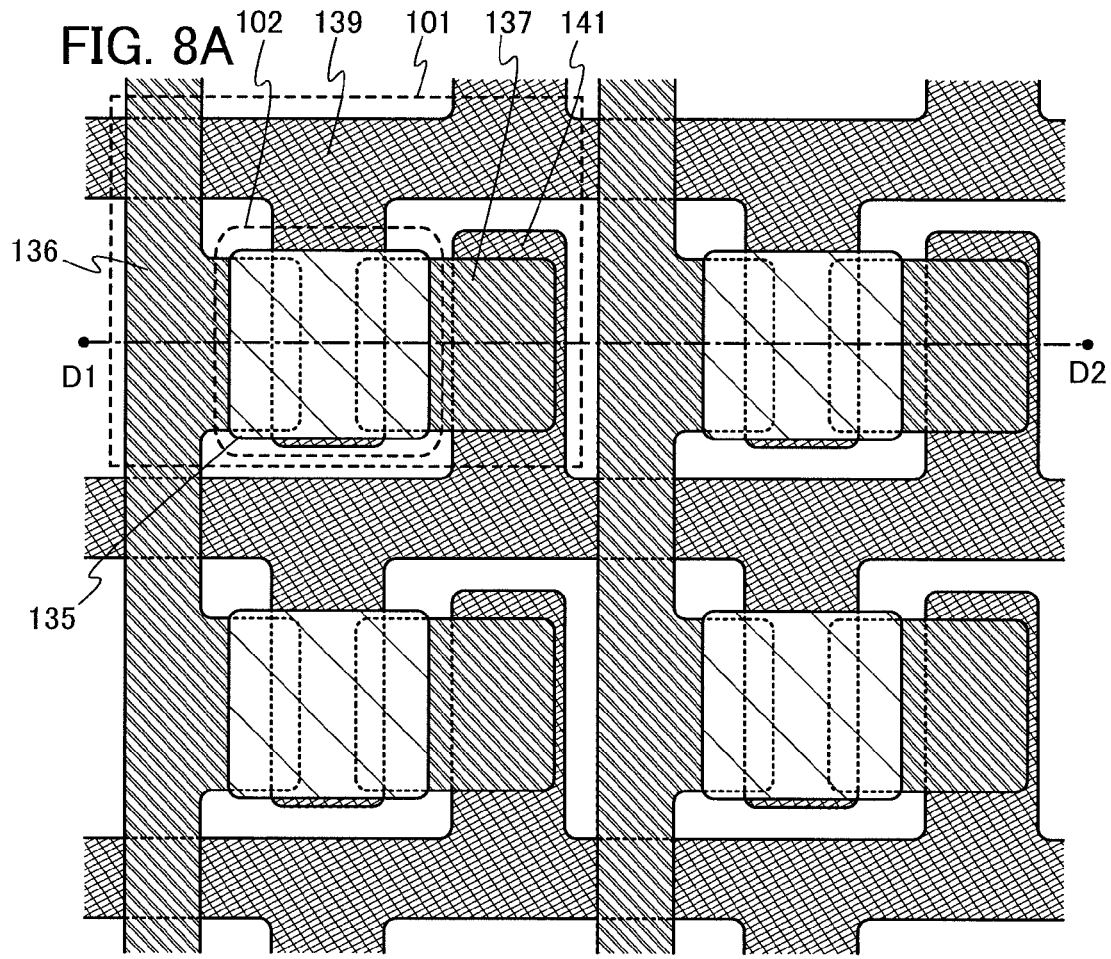
FIGS. 8A and 8B are a top-view and a cross-sectional view in which part of a cell array is enlarged.
Figure 8B:
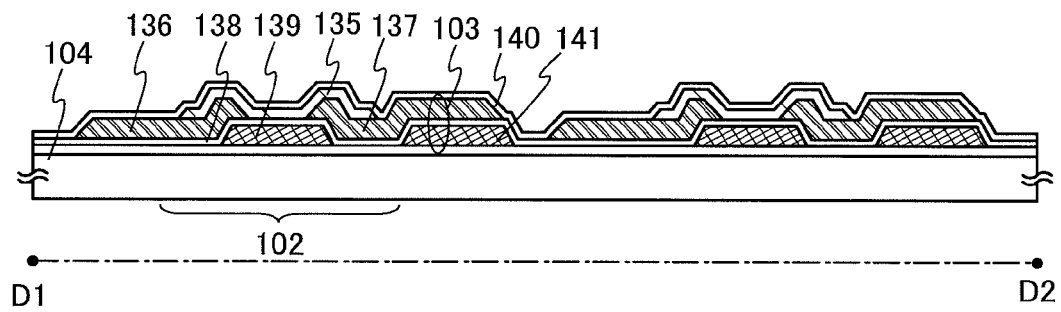

FIG. 8A shows another example of a top view in which part of the cell array 100 shown in FIG. 1 is enlarged. FIG. 8B shows a cross-sectional view along dashed line D1-D2 in FIG. 8A. FIGS. 8A and 8B show the structure in which the transistor 102 and the capacitor 103 are formed over the substrate 104 having an insulating surface.

The transistor 102 includes, over the substrate 104 having an insulating surface, a conductive film 139 serving as a gate electrode, an insulating film 138 over the conductive film 139, a conductive film 136 and a conductive film 137 each serving as a source electrode or a drain electrode over the insulating film 138, and a semiconductor film 135 provided in a position overlapping with the conductive film 139 with the insulating film 138 provided therebetween over the conductive film 136 and the conductive film 137. The transistor 102 may further include an insulating film 140 covering the semiconductor film 135, the conductive film 136, and the conductive film 137. The transistor 102 shown in FIGS. 8A and 8B has a bottom-gate bottom-contact structure.

The capacitor 103 includes a conductive film 141 formed over the substrate 104 having an insulating surface, an insulating film 138 over the conductive film 141, and a conductive film 137 overlapping with the conductive film 141 with the insulating film 138 provided therebetween. A portion in which the conductive film 141, the insulating film 138, and the conductive film 137 overlap one another serves as the capacitor 103.

Note that the conductive film 136 serves as one of a source electrode and a drain electrode of the transistor 102 and also serves as a bit line. The conductive film 139 serves as a gate electrode of the transistor 102 and also serves as a word line. The conductive film 137 serves as the other of the source electrode and the drain electrode of the transistor 102 and also serves as an electrode of the capacitor 103. The conductive film 141 serves as an electrode of the capacitor 103 and also serves as a word line.

Although FIGS. 5A and 5B, FIGS. 6A and 6B, FIGS. 7A and 7B, and FIGS. 8A and 8B each illustrate an example of the case where the transistor 102 has a single-gate structure, the transistor 102 may have a multi-gate structure in which a plurality of electrically connected gate electrodes are included so that a plurality of channel formation regions are included.

The transistors 102 in FIGS. 5A and 5B, FIGS. 6A and 6B, FIGS. 7A and 7B, and FIGS. 8A and 8B each has the gate electrode only on one side of the active layer; however, the present invention is not limited to this structure. The transistors 102 may include a backgate electrode on the other side of the gate electrode with the active layer provided therebetween. Further, the back gate electrode may be electrically insulated and in a floating state, or may be in a state where the back gate electrode is supplied with a potential. In the latter case, the back gate electrode may be supplied with a potential at the same level as that of the gate electrode, or may be supplied with a fixed potential such as a ground potential. The level of the potential applied to the back gate electrode is controlled, so that the threshold voltage of the transistor 102 can be controlled.

As described in this embodiment, in the memory device according to one embodiment of the present invention, the word line serves as the capacitor line, whereby the number of lines included in a cell array can be reduced. Therefore, a memory device in which memory capacity per unit area is increased can be manufactured without making the manufacturing process complicated.

(Embodiment 2)

In this embodiment, a structure of a cell array 200 which is different from that of FIG. 1 in the memory device according to one embodiment of the present invention will be described.

Figure 9:
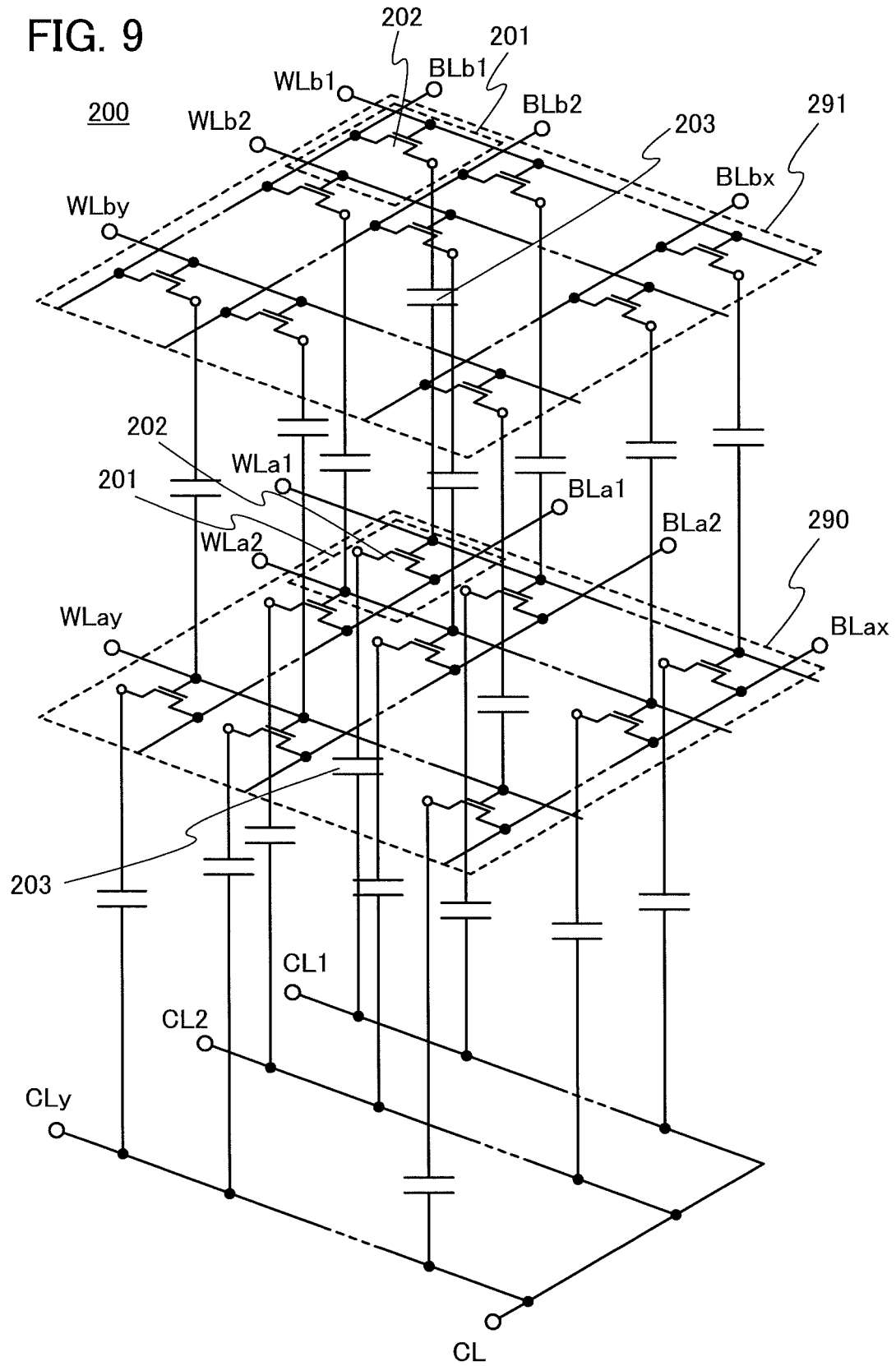
FIG. 9 is a circuit diagram showing a structure of a cell array.

FIG. 9 is an example of a circuit diagram showing a structure of the cell array 200 of this embodiment. In the cell array 200 shown in FIG. 9, a plurality of memory cells 201 is divided into two blocks: a first block 290 and a second block 291. The memory cell 201 included in the second block 291 is provided over a memory cell 201 included in the first block 290. That is, the cell array 200 in this embodiment has a structure in which the memory cells 201 are stacked.

Note that FIG. 9 shows an example in which the plurality of memory cells 201 is divided into two blocks: the first block 290 and the second block 291; however, the present invention is not limited to this structure. The memory device according to one embodiment of the present invention may have a structure in which three or more blocks are stacked.

Each of the plurality of blocks includes a plurality of memory cells 201 arranged in matrix, a plurality of word lines WL, and a plurality of bit lines BL. The number of word lines WL and the number of bit lines BL included in each block can be determined in accordance with the number and the position of the memory cells 201. A signal from a driver circuit is supplied to each memory cell 201 through the plurality of word lines WL and the plurality of bit lines BL.

Specifically, FIG. 9 is an example showing the case where the first block 290 includes the memory cells 201 in x rows and y columns, first word lines Wla1 to WLay, and first bit lines BLa1 to BLax. In addition, FIG. 9 is an example showing the case where the second block 291 includes the memory cells 201 in x rows and y columns, second word lines WLb1 to WLby, and second bit lines BLb1 to BLbx.

Each memory cell 201 includes a transistor 202 serving as a switching element and a capacitor 203, which is similar to the case of the cell array 100 shown in FIG. 1. A gate electrode of the transistor 202 is connected to one of the word lines WL. A first terminal of the transistor 202 is connected to one of the bit lines BL, and a second terminal of the transistor 202 is connected to one electrode of the capacitor 203. Note that in the cell array 200 shown in FIG. 9, the other electrode of the capacitor 203 is connected to one of the word lines of a different block or one of the capacitor lines of a different layer.

Specifically, in the cell array 200 shown in FIG. 9, for example, a gate electrode of the transistor 202 is connected to the second word line WLb1 in the memory cell 201 in a first row and a first column included in the second block 291. A first terminal of the transistor 202 is connected to the second bit line BLb1, and a second terminal of the transistor 202 is connected to one electrode of the capacitor 203. The other electrode of the capacitor 203 is connected to the first word line WLa1 included in the first block 290.

Further, in the cell array 200 shown in FIG. 9, a capacitor line CL is provided below the first block 290. Specifically, the cell array 200 shown in FIG. 9 is an example in which a plurality of capacitor lines CL1 to CLy electrically connected to one another is provided below the first block 290. In addition, a gate electrode of the transistor 202 is connected to the first word line WLa1 in the memory cell 201 in the first row and the first column included in the first block 290, for example. A first terminal of the transistor 202 is connected to a first bit line BLa1, and a second terminal of the transistor 202 is connected to one electrode of the capacitor 203. The other electrode of the capacitor 203 is connected to the capacitor line CL1 provided below the first block 290.

Note that the other electrode of the capacitor 203 included in one of the plurality of blocks is connected to the word line included in the block or the capacitor line provided below the block, in the cell array 200 shown in FIG. 9; however, one embodiment of the present invention is not limited to this structure. The other electrode of the capacitor 203 included in one of the plurality of blocks may be connected to a word line included in the block or a capacitor line provided over the block.

Note that the memory cell 201 may further include another circuit element such as a transistor, a diode, a resistor, a capacitor, or an inductor as needed. The switching element using the transistor 202 controls inflow, holding, and outflow of electric charge in the capacitor 203. The switching element determines a digital value of the stored data in accordance with the difference of the amount of electric charge held in the capacitor 203.

Next, a specific example of the structure of the memory cells 201 is described.

FIGS. 10A to 10C show an example of a top view in which part of each layer of the cell array 200 shown in FIG. 9 is enlarged. Top views of each layer overlap one another along dashed lines E1-E2. FIG. 10D shows a cross-sectional view along the dashed lines E1-E2 in FIGS. 10A to 10C.

A first layer of the cell array 200 is formed over a substrate 204 having an insulating surface. A conductive film 231 serving as a capacitor line is formed in the first layer of the cell array 200.

A second layer of the cell array 200 is formed over an insulating film 232 covering the conductive film 231. A transistor 202a and a transistor 202b included in the first block 290 are formed in the second layer of the cell array 200.

The transistor 202a includes, over the insulating film 232, a semiconductor film 205a; a conductive film 206a and a conductive film 207a each serving as a source electrode or a drain electrode over the semiconductor film 205a; an insulating film 208 over the semiconductor film 205a, the conductive film 206a, and the conductive film 207a; and a conductive film 209 serving as a gate electrode and provided in a position overlapping with the semiconductor film 205a with the insulating film 208 provided therebetween. The transistor 202b includes, over the insulating film 232, a semiconductor film 205b; a conductive film 206b and a conductive film 207b each serving as a source electrode or a drain electrode over the semiconductor film 205b; an insulating film 208 over the semiconductor film 205b, the conductive film 206b, and the conductive film 207b; and a conductive film 209 serving as a gate electrode and provided in a position overlapping with the semiconductor film 205b with the insulating film 208 provided therebetween. The transistor 202a and the transistor 202b may further include an insulating film 230 covering the conductive film 209. The transistor 202a and the transistor 202b shown in FIGS. 10B and 10D each have a top-gate top-contact structure.

A portion in which the conductive film 207a, the insulating film 232, and the conductive film 231 overlap one another serves as the capacitor 203a. A portion in which the conductive film 207b, the insulating film 232, and the conductive film 231 overlap one another serves as the capacitor 203b. The capacitor 203a and the capacitor 203b are included in the first block 290.

Note that the conductive film 206a serves as one of a source electrode and a drain electrode of the transistor 202a and also serves as the first bit line, and the conductive film 206b serves as one of a source electrode and a drain electrode of the transistor 202b and also serves as the first bit line. The conductive film 209 serves as a gate electrode of each of the transistors 202a and 202b, and also serves as the first word lines. The conductive film 207a serves as the other of the source electrode and the drain electrode of the transistor 202a and also serves as an electrode of the capacitor 203a. The conductive film 207b serves as the other of the source electrode and the drain electrode of the transistor 202b and also serves as an electrode of the capacitor 203b.

A third layer of the cell array 200 is formed over an insulating film 240 covering the insulating film 230. A transistor 202c and a transistor 202d included in the second block 291 are formed in the third layer of the cell array 200.

The transistor 202c includes, over the insulating film 240, a semiconductor film 205c; a conductive film 206c and a conductive film 207c each serving as a source electrode or a drain electrode over the semiconductor film 205c; an insulating film 241 over the semiconductor film 205c, the conductive film 206c, and the conductive film 207c; and a conductive film 242 serving as a gate electrode and provided in a position overlapping with the semiconductor film 205c with the insulating film 241 provided therebetween. The transistor 202d includes, over the insulating film 240, a semiconductor film 205d; a conductive film 206d and a conductive film 207d each serving as a source electrode or a drain electrode over the semiconductor film 205d; an insulating film 241 over the semiconductor film 205d, the conductive film 206d, and the conductive film 207d; and a conductive film 242 serving as a gate electrode and provided in a position overlapping with the semiconductor film 205d with the insulating film 241 provided therebetween. The transistor 202c and the transistor 202d may further include an insulating film 243 covering the conductive film 242. The transistor 202c and the transistor 202d shown in FIGS. 10A and 10D each have a top-gate top-contact structure as the transistor 202a and the transistor 202b.

A portion in which the conductive film 207c, the insulating films 230 and 240, and the conductive film 209 overlap one another serves as the capacitor 203c. A portion in which the conductive film 207d, the insulating films 230 and 240, and the conductive film 209 overlap one another serves as the capacitor 203d. The capacitor 203c and the capacitor 203d are included in the second block 291.

Note that the conductive film 206c serves as one of a source electrode and a drain electrode of the transistor 202c and also serves as second bit line, and the conductive film 206d serves as one of a source electrode and a drain electrode of the transistor 202d and also serves as second bit line. The conductive film 242 serves as a gate electrode of each of the transistors 202c and 202d and also serves as the second word lines. The conductive film 207c serves as the other of the source electrode and the drain electrode of the transistor 202c and also serves as an electrode of the capacitor 203c. The conductive film 207d serves as the other of the source electrode and the drain electrode of the transistor 202d and also serves as an electrode of the capacitor 203d.

Note that in FIGS. 10A to 10D, the conductive film 209 and the conductive film 242 are separated from each other, in other words, the conductive film 209 and the conductive film 242 are provided so as not to overlap each other in the direction perpendicular to the substrate 204, in order to reduce parasitic capacitance between the first word line and the second word line. Note that one embodiment of the present invention is not limited to this structure: the conductive film 209 and the conductive film 242 may be provided so as to overlap each other in the direction perpendicular to the substrate 204.

In addition, in FIGS. 10A to 10D, the uppermost surface of the insulating film 232 is preferably planarized in order to uniform characteristics of the transistors 202a and 202b formed thereover. Thus, it is preferable that the surface of the insulating film 232 be planarized by a CMP method or the like after the insulating film 232 is formed, and then, the transistor 202a and the transistor 202b are formed. Similarly, in FIGS. 10A to 10D, the uppermost surface of the insulating film 240 is preferably planarized in order to uniform characteristics of the transistors 202c and 202d formed thereover. Thus, it is preferable that the surface of the insulating film 240 be planarized by a CMP method or the like after the insulating film 240 is formed, and then, the transistor 202c and the transistor 202d are formed.

Next, a specific example of a structure of the memory cells 201 in the case where the structure of the transistor is different from that of FIGS. 10A to 10D.

FIGS. 11A to 11C show an example of a top view in which part of each layer of the cell array 200 shown in FIG. 9 is enlarged. Top views of each layer overlap one another along dashed lines F1-F2. FIG. 11D shows a cross-sectional view along the dashed lines F1-F2 in FIGS. 11A to 11C.

A cell array 200 shown in FIGS. 11A to 11D has the transistor 202a, the transistor 202b, the transistor 202c, and the transistor 202d each of which have different structures from the structures shown in FIGS. 10A to 10D is described.

The cell array 200 shown in FIGS. 11A to 11D has a first layer formed over a substrate 204 having an insulating surface. A conductive film 236 serving as a capacitor line is formed in the first layer of the cell array 200.

A second layer of the cell array 200 is formed over an insulating film 234 covering the conductive film 236. The transistor 202a and the transistor 202b included in the first block 290 are formed in the second layer of the cell array 200.

Specifically, the transistor 202a includes, over an insulating film 234, a conductive film 216a and a conductive film 217a each serving as a source electrode or a drain electrode, and a semiconductor film 215a over the conductive film 216a and the conductive film 217a. The transistor 202b includes, over the insulating film 234, a conductive film 216b and a conductive film 217b each serving as a source electrode or a drain electrode, and a semiconductor film 215b over the conductive film 216b and the conductive film 217b. The transistor 202a and the transistor 202b further include an insulating film 218 over the conductive films 216a and 217b, the conductive films 216b and 217b, the semiconductor film 215a, and the semiconductor film 215b, and each include a conductive film 219 serving as a gate electrode and provided in a position overlapping with the semiconductor film 215a and the semiconductor film 215b with the insulating film 218 provided therebetween. The transistor 202a and the transistor 202b may further include an insulating film 235 covering the conductive film 219. In the cell array 200 shown in FIGS. 11A to 11D, the transistor 202a and the transistor 202b each have a top-gate bottom-contact structure.

As similar to FIGS. 10A to 10D, a portion in which the conductive film 217a, the insulating film 234, and the conductive film 236 overlap one another serves as the capacitor 203a. A portion in which the conductive film 217b, the insulating film 234, and the conductive film 236 overlap one another serves as the capacitor 203b. The capacitor 203a and the capacitor 203b are included in the first block 290.

In addition, specifically, the transistor 202c includes, over an insulating film 244, a conductive film 216c, and a conductive film 217c each serving as a source electrode or a drain electrode, and a semiconductor film 215c over the conductive film 216c and the conductive film 217c. The transistor 202d includes, over the insulating film 244, a conductive film 216d and a conductive film 217d each serving as a source electrode or a drain electrode, and a semiconductor film 215d over the conductive film 216d and the conductive film 217d. The transistor 202c and the transistor 202c further include an insulating film 245 over the conductive films 216c and 217c, the conductive films 216d and 217d, the semiconductor film 215c, and the semiconductor film 215d, and each include a conductive film 246 serving as a gate electrode and provided in a position overlapping with the semiconductor film 215c and the semiconductor film 215d with the insulating film 245 provided therebetween. The transistor 202c and the transistor 202d may further include an insulating film 247 covering the conductive film 246. In the cell array 200 shown in FIGS. 11A to 11D, the transistor 202c and the transistor 202d each have a top-gate bottom-contact structure as the transistor 202a and the transistor 202b.

As similar to FIGS. 10A to 10D, a portion in which the conductive film 216c, the insulating films 235 and 244, and the conductive film 219 overlap one another serves as the capacitor 203c. A portion in which the conductive film 216d, the insulating films 235 and 244, and the conductive film 219 overlap one another serves as the capacitor 203d. The capacitor 203c and the capacitor 203d are included in the second block 291.

Note that in FIGS. 11A to 11D, the conductive film 219 and the conductive film 246 are separated from each other, in other words, the conductive film 219 and the conductive film 246 are provided so as not to overlap each other in the direction perpendicular to the substrate 204, in order to reduce parasitic capacitance between the first word line and the second word line. Note that one embodiment of the present invention is not limited to this structure: the conductive film 219 and the conductive film 246 may be provided to overlap each other in the direction perpendicular to the substrate 204.

In addition, in FIGS. 11A to 11D, the uppermost surface of the insulating film 234 is preferably planarized in order to uniform characteristics of the transistors 202a and 202b formed thereover. Thus, it is preferable that the surface of the insulating film 234 be planarized by a CMP method or the like after the insulating film 234 is formed, and then, the transistor 202a and the transistor 202b are formed. Similarly, in FIGS. 11A to 11D, the uppermost surface of the insulating film 244 is preferably planarized in order to uniform characteristics of the transistors 202c and 202d formed thereover. Thus, it is preferable that the surface of the insulating film 244 be planarized by a CMP method or the like after the insulating film 244 is formed, and then, the transistor 202c and the transistor 202d are formed.

All of the transistors in FIGS. 10A to 10D have a top-gate top-contact structure, and all of the transistors in FIGS. 11A to 11D have a top-gate bottom-contact structure. Note that the present invention is not limited to these structures: the transistors may have a bottom-gate structure.

This embodiment can be implemented in combination with embodiments above mentioned.

(Embodiment 3)

In this embodiment, a manufacturing method of a transistor forming a cell array will be described. Note that in this embodiment, a transistor formed using an oxide semiconductor will be described as an example.

Figure 12A:
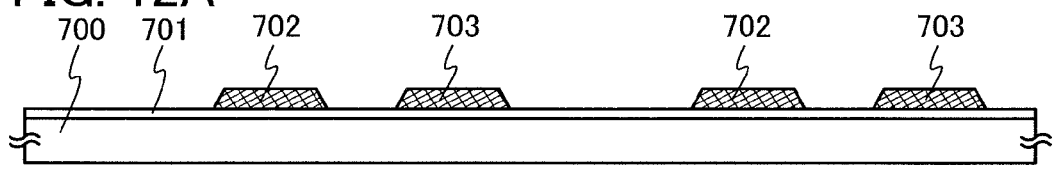
FIGS. 12A to 12D are diagrams showing a method for manufacturing a memory device.

First, as illustrated in FIG. 12A, an insulating film 701 is formed over a substrate 700, and conductive films 702 and conductive films 703 are formed over the insulating film 701. The conductive film 702 serves as a gate electrode of each of a transistor 712 and a transistor 713, and further serves as a word line. The conductive film 703 serves as another word line.

Although there is no particular limitation on a material which can be used as the substrate 700, it is necessary that the material have at least heat resistance high enough to withstand heat treatment to be performed later. For example, a glass substrate manufactured by a fusion process or a float process, a quartz substrate, a semiconductor substrate, a ceramic substrate, or the like can be used as the substrate 700. When the temperature of the heat treatment performed later is high, a substrate having a strain point of 730° C. or higher is preferably used as the glass substrate. Although a substrate formed of a flexible synthetic resin such as plastic generally has a lower resistance temperature than the aforementioned substrates, it may be used as long as being resistant to a processing temperature during a manufacturing process.

The insulating film 701 is formed using a material which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 701.

In this specification, an oxynitride refers to a substance in which the amount of oxygen is larger than that of nitrogen, and a nitride oxide refers to a substance in which the amount of nitrogen is larger than that of oxygen.

The thickness of the conductive films 702 and the conductive films 703 is in the range of 10 nm to 400 nm, preferably 100 nm to 200 nm. In this embodiment, a conductive film with a thickness of 150 nm is formed by a sputtering method using a tungsten target, and then the conductive film is processed (patterned) into a desired shape by etching, whereby the conductive films 702 and the conductive films 703 are formed. Note that the end portions of the formed conductive films 702 and the conductive films 703 are preferably tapered because coverage with a gate insulating film stacked thereover is improved. Note that a resist mask may be formed by an inkjet method. Formation of the resist mask by an inkjet method needs no photomask; thus, manufacturing cost can be reduced.

Figure 12B:
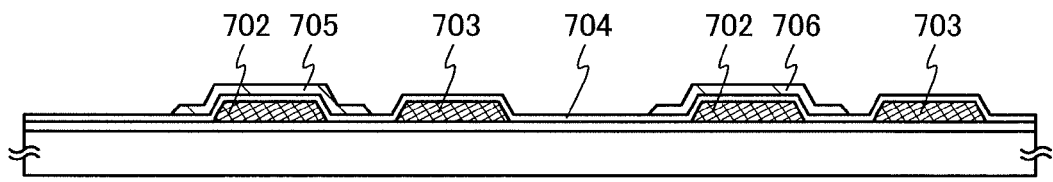

Next, as illustrated in FIG. 12B, a gate insulating film 704 is formed over the conductive films 702 and the conductive films 703, and an oxide semiconductor film 705 and an oxide semiconductor film 706 are formed over the gate insulating film 704 so as to overlap with the conductive film 702.

The gate insulating film 704 may be formed using a single layer or a stack of plural layers of a film including silicon oxide, silicon nitride oxide, silicon oxynitride, silicon nitride, hafnium oxide, gallium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

It is preferable that the gate insulating film 704 include impurities such as moisture or hydrogen as little as possible. In the case of forming a silicon oxide film by sputtering, a silicon target or a quartz target is used as a target, and oxygen or a mixed gas of oxygen and argon is used as a sputtering gas.

The oxide semiconductor which becomes i-type or becomes substantially i-type (an oxide semiconductor which is purified) by removal of an impurity and reduction of oxygen deficiency is extremely sensitive to an interface state. Therefore, when the oxide semiconductor film 705 and the oxide semiconductor film 706 are highly purified in the later process, it is important to reduce the interface state of the interface between the oxide semiconductor film 705 and the gate insulating film 704 and between the oxide semiconductor film 706 and the gate insulating film 704. Therefore, the gate insulating film 704 needs to have higher quality. For example, a high-density plasma CVD using a microwave (frequency: 2.45 GHz) is preferably used, in which case a dense insulating film having high withstand voltage and high quality can be formed. When the purified oxide semiconductor is in contact with the high-quality gate insulating film, the interface state density can be reduced and favorable interface characteristics can be obtained.

Needless to say, other film formation methods, such as a sputtering method or a plasma CVD method, can be applied as long as a high-quality insulating film can be formed as the gate insulating film 704. Moreover, it is possible to use an insulating film whose quality and characteristics of the interface with the oxide semiconductor are improved through heat treatment performed after the formation of the insulating film. In any case, any insulating film can be used as long as it has high quality and can reduce interface state density between the gate insulating film and the oxide semiconductor to form a favorable interface.

The gate insulating film 704 may be formed to have a structure in which an insulating film formed using a material having a high barrier property and an insulating film having low proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film 705 and between the insulating film having a high barrier property and the oxide semiconductor film 706. As the insulating film having a high barrier property, a silicon nitride film, a silicon nitride oxide film, an aluminum nitride film, an aluminum oxide film, an aluminum nitride oxide film, or the like can be used, for example. The insulating film having a high barrier property can prevent impurities in an atmosphere, such as moisture or hydrogen, or impurities in the substrate 700, such as an alkali metal or a heavy metal, from entering the oxide semiconductor film 705 and the oxide semiconductor film 706, the gate insulating film 704, or the interface between the oxide semiconductor film 705 and the oxide semiconductor film 706 and another insulating film and the vicinity thereof. In addition, the insulating film having lower proportion of nitrogen, such as a silicon oxide film or a silicon oxynitride film, is formed so as to be in contact with the oxide semiconductor film 705 and the oxide semiconductor film 706, so that the insulating film having a high barrier property can be prevented from being in contact with the oxide semiconductor film 705 and the oxide semiconductor film 706 directly.

For example, the gate insulating film 704 may be formed to have a thickness of 100 nm in the following manner: a silicon nitride film ($SiN_y$ (y>0)) with a thickness of greater than or equal to 50 nm and less than or equal to 200 nm is formed by a sputtering method as a first gate insulating film, and a silicon oxide film ($SiO_x$ (x>0)) with a thickness of greater than or equal to 5 nm and less than or equal to 300 nm is stacked over the first gate insulating film as a second gate insulating film. The thickness of the gate insulating film 704 may be set as appropriate depending on characteristics required to the transistor In this embodiment, the gate insulating film 704 having a structure in which a silicon oxide film having a thickness of 100 nm formed by a sputtering method is stacked over a silicon nitride film having a thickness of 50 nm formed by a sputtering method is formed.

Note that the gate insulating film 704 is in contact with the oxide semiconductor film 705 and the oxide semiconductor film 706 to be formed later. When hydrogen is contained in the oxide semiconductor film 705 and the oxide semiconductor film 706, electrical characteristics of the transistor are adversely affected; therefore, it is preferable that the gate insulating film 704 does not contain hydrogen, a hydroxyl group, and moisture. In order that the gate insulating film 704 contain hydrogen, a hydroxyl group, and moisture as little as possible, it is preferable that an impurity adsorbed on the substrate 700, such as moisture or hydrogen, be eliminated and removed by preheating the substrate 700, over which the conductive film 702 and the conductive film 703 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

The oxide semiconductor film 705 and the oxide semiconductor film 706 can be formed by processing an oxide semiconductor film formed over the gate insulating film 704 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the gate insulating film 704 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As described above, as the oxide semiconductor film, the following oxide semiconductors can be used: a quaternary metal oxide such as an In—Sn—Ga—Zn-based oxide semiconductor; a ternary metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, and a Sn—Al—Zn-based oxide semiconductor; a binary metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, an In—Ga-based oxide semiconductor; an In-based oxide semiconductor; a Sn-based oxide semiconductor; and a Zn-based oxide semiconductor.

In this embodiment, as the oxide semiconductor film, an In—Ga—Zn-based oxide semiconductor thin film with a thickness of 30 nm, which is obtained by a sputtering method using a target including indium (In), gallium (Ga), and zinc (Zn), is used. In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is fainted using a target of an In—Ga—Zn-based oxide having the aforementioned atomic ratio, a polycrystal or a c-axis-aligned crystal (CAAC) is likely to be formed. The filling rate of the target including In, Ga, and Zn is greater than or equal to 90% and less than or equal to 100%, preferably greater than or equal to 95% and less than or equal to 100%. With the use of the target having high filling rate, a dense oxide semiconductor film is formed.

In the case where an In—Zn-based oxide material is used as an oxide semiconductor, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an oxide semiconductor film formed using an In—Zn-based oxide which has an atomic ratio of In:Zn:O=X:Y:Z, the relation of Z>1.5X+Y is satisfied. The mobility can be improved by keeping the ratio of Zn within the above range.

Further, in the case where an In—Sn—Zn-based oxide referred to as ITZO is formed, a target which has a composition ration of In:Sn:Zn=1:2:2, 2:1:3, 1:1:1, 20:45:35, or the like in an atomic ratio is used.

In this embodiment, the oxide semiconductor film is formed in such a manner that the substrate is held in a treatment chamber kept in a reduced pressure state, a sputtering gas from which hydrogen and moisture are removed is introduced into the treatment chamber while residual moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with the cryopump, for example, a hydrogen atom, a compound containing a hydrogen atom, such as water ($H_2O$), (preferably, also a compound containing a carbon atom), and the like are removed, whereby the concentration of an impurity contained in the oxide semiconductor film formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the gate insulating film 704 is formed in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

Moreover, when the leakage rate of the treatment chamber of the sputtering apparatus is set to lower than or equal to $1\times10^{-10}$ Pa·m$^3$/second, entry of impurities, such as alkali metal or hydride, into the oxide semiconductor film under formation by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed into the oxide semiconductor film can be reduced. In addition, when the target is used, the concentration of alkali metal, such as lithium, sodium, or potassium, can be reduced in the oxide semiconductor film.

Note that etching for forming the oxide semiconductor film 705 and the oxide semiconductor film 706 may be wet etching, dry etching, or both dry etching and wet etching. As the etching gas for dry etching, a gas containing chlorine (chlorine-based gas, such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas, such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas, such as helium (He) or argon (Ar), is added, or the like can be used.

As the dry etching method, a parallel plate RIE (reactive ion etching) method or an ICP (inductively coupled plasma) etching method can be used. In order to etch the film into a desired shape, the etching conditions (e.g., the amount of electric power applied to a coil-shaped electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 705 and the oxide semiconductor film 706 may be formed by an inkjet method. Formation of the resist mask by an inkjet method needs no photomask; thus, manufacturing cost can be reduced.

It is preferable that reverse sputtering be performed before the formation of a conductive film in a subsequent step so that a resist residue or the like left over surfaces of the oxide semiconductor film 705, the oxide semiconductor film 706, and the gate insulating film 704 is removed.

Note that, in some cases, the oxide semiconductor film formed by sputtering or the like includes a large amount of moisture or hydrogen (including a hydroxyl group) as impurities. Moisture or hydrogen easily form a donor level and thus serve as impurities in the oxide semiconductor. Thus, in one embodiment of the present invention, in order to reduce impurities such as moisture or hydrogen in the oxide semiconductor film (dehydration of dehydrogenation), the oxide semiconductor film 705 and the oxide semiconductor film 706 are subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where measurement is performed by a dew point meter in a cavity ring down laser spectroscopy (CRDS) method).

With the heat treatment on the oxide semiconductor film 705 and the oxide semiconductor film 706, moisture or hydrogen in the oxide semiconductor film 705 and the oxide semiconductor film 706 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for 3 to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus, such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp, such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or the rare gas, such as helium, neon, or argon. Alternatively, the purity of nitrogen or the rare gas, such as helium, neon, or argon which is introduced into the heat treatment apparatus is preferably greater than or equal to 6 N (99.9999%), further preferably greater than or equal to 7 N (99.99999%) (i.e., the impurity concentration is preferably less than or equal to 1 ppm, further preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1\times10^{18}/cm^3$, preferably less than or equal to $1\times10^{17}/cm^3$, the concentration of impurity is preferably reduced. Specifically, a measurement value of a Na concentration by secondary ion mass spectrometry is preferably less than or equal to $5\times10^{16}/cm^3$, further preferably less than or equal to $1\times10^{16}/cm^3$, still further preferably less than or equal to $1\times10^{15}/cm^3$. In a similar manner, a measurement value of a Li concentration is preferably less than or equal to $5\times10^{15}/cm^3$, further preferably less than or equal to $1\times10^{15}/cm^3$. In a similar manner, a measurement value of a K concentration is preferably less than or equal to $5\times10^{15}/cm^3$, further preferably less than or equal to $1\times10^{15}/cm^3$.

Through the above process, the concentration of hydrogen in the oxide semiconductor film 705 and the oxide semiconductor film 706 can be reduced and the oxide semiconductor films can be purified. Thus, the oxide semiconductor films can be stabilized. In addition, heat treatment at a temperature lower than or equal to the glass transition temperature makes it possible to form an oxide semiconductor film with a wide band gap in which the density of carriers generated due to a hydrogen defect is extremely low. Therefore, the transistor can be manufactured using a large-sized substrate, so that the productivity can be increased. The above heat treatment can be performed at any time after the oxide semiconductor film is formed.

Note that the oxide semiconductor film 705 and the oxide semiconductor film 706 may be amorphous or may have crystallinity. As an oxide semiconductor film having crystallinity, an oxide semiconductor film including a crystal with c-axis orientation (also referred to as CAAC: c axis aligned crystal) is also preferable because the effect of improving the reliability of a transistor can be obtained.

Sputtering may be performed to form an oxide semiconductor film including CAAC. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., further preferably 200° C. to 400° C., still preferably 250° C. to 300° C. In addition to this, the deposited oxide semiconductor film is subjected to heat treatment at a temperature higher than the substrate heating temperature in the film formation. Therefore, micro-defects in the film and defects at the interface of a stacked layer can be compensated.

Specifically, CAAC has a hexagonal crystal structure including zinc, in which bonds for forming hexagonal lattices are formed in the a-b plane which is parallel to a surface of the insulating film and c-axes are substantially perpendicular to the a-b plane.

In CAAC, metal atoms and oxygen atoms are bonded in an orderly manner in comparison with an amorphous oxide semiconductor. That is, in the case where an oxide semiconductor is amorphous, the coordination numbers might vary between various metal atoms, but the coordination numbers of metal atoms are almost the same as each other in CAAC. Therefore, microscopic defects of oxygen can be reduced and instability and moving of charge that are due to ejection or bonding of hydrogen atoms (including hydrogen ions) or alkali metal atoms can be reduced.

Accordingly, a transistor is formed using an oxide semiconductor film including CAAC, whereby the amount of shift of the threshold voltage of the transistor, which occurs after light irradiation and a bias-temperature (BT) stress test are performed on the transistor, can be reduced. Accordingly, a transistor having stable electric characteristics can be formed.

Figure 12C:
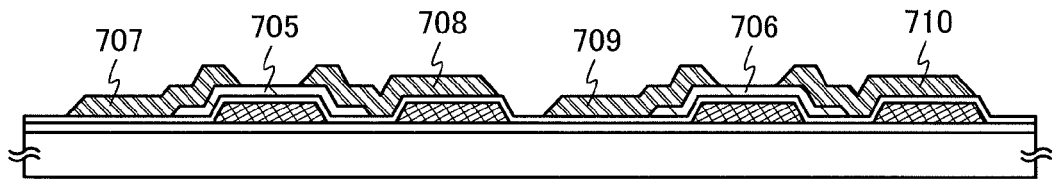

Next, as shown in FIG. 12C, a conductive film 707 and a conductive film 708 each serving as a source electrode or a drain electrode are formed over the oxide semiconductor film 705, and a conductive film 709 and a conductive film 710 each serving as a source electrode or a drain electrode are formed over the oxide semiconductor film 706.

Specifically, the conductive films 707 to 710 can be formed in such a manner that a conductive film is formed over the oxide semiconductor film 705 and the oxide semiconductor film 706 by sputtering or vacuum vapor deposition and then is processed (patterned) into a predetermined shape.

As the conductive film which serves as the conductive films 707 to 710, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably combined with a refractory metal material so as to avoid a heat resistance problem and a corrosive problem. As the refractory metal material, molybdenum, titanium, chromium, tantalum, tungsten, neodymium, scandium, yttrium, or the like can be used.

Alternatively, the conductive film serving as the conductive films 707 to 710 may be formed using a single conductive film or using a stack of a plurality of conductive films. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

Further alternatively, for the conductive film serving as the conductive films 707 to 710, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after the formation of the conductive films 707 to 710, it is preferable that the conductive films 707 to 710 have heat resistance enough to withstand the heat treatment.

Note that the material and etching conditions are adjusted as appropriate so that the oxide semiconductor film 705 and the oxide semiconductor film 706 are not removed in etching of the conductive film as much as possible. Depending on the etching conditions, exposed portions of the oxide semiconductor film 705 and the oxide semiconductor film 706 are partly etched, so that a groove (a recessed portion) is formed in some cases.

In this embodiment, a titanium film is used as a conductive film serving as the conductive films 707 to 710. Therefore, wet etching can be selectively performed on the conductive film using a solution containing ammonia and hydrogen peroxide water (ammonia hydrogen peroxide mixture); however, the oxide semiconductor film 705 and the oxides semiconductor film 706 are partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask which is a light-exposure mask through which light is transmitted to have various intensities. A resist mask formed using a multi-tone mask has various thicknesses and can be changed in shape by etching; thus, the resist mask can be used in a plurality of etching processes for processing films into different patterns. Therefore, a resist mask corresponding to at least two kinds of different patterns can be formed by one multi-tone mask. Thus, the number of light-exposure masks can be reduced and the number of corresponding photolithography steps can be also reduced, whereby simplification of the process can be realized.

Further, an oxide conductive film serving as a source region and a drain region may be provided between the oxide semiconductor film 705 and the conductive films 707 and 708 each serving as a source electrode or a drain electrode or between the oxide semiconductor film 706 and the conductive films 709 and 710 each serving as a source electrode or a drain electrode. The material of the oxide conductive film preferably contains zinc oxide as a component and preferably does not contain indium oxide. For such an oxide conductive film, zinc oxide, zinc aluminum oxide, zinc aluminum oxynitride, or the like can be used.

For example, in the case where the oxide conductive film is formed, patterning for forming the oxide conductive film and patterning for forming the conductive films 707 to 710 may be performed concurrently.

With provision of the oxide conductive film serving as a source region and a drain region, resistance between the oxide semiconductor film 705 and the conductive films 707 and 708 and resistance between the oxide semiconductor film 706 and the conductive films 709 and 710 can be lowered, so that the transistor can operate at high speed. In addition, with provision of the oxide conductive film serving as a source region and a drain region, the withstand voltage of the transistor can be increased.

Next, plasma treatment may be performed using a gas, such as $N_2O$, $N_2$, or Ar. By this plasma treatment, water or the like adhering to an exposed surface of the oxide semiconductor film is removed. Plasma treatment may be performed using a mixture gas of oxygen and argon as well.

Figure 12D:
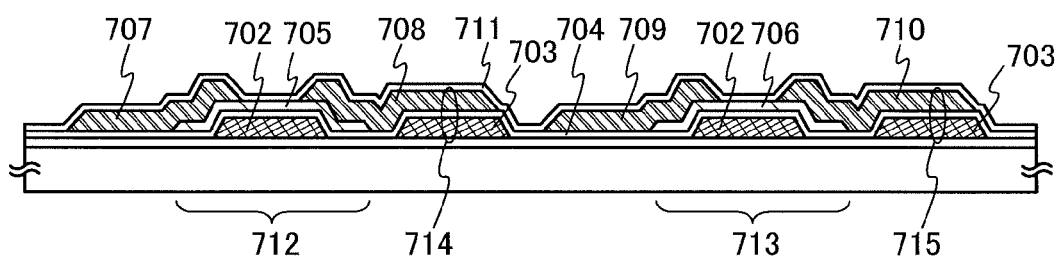

After the plasma treatment is performed, an insulating film 711 is formed so as to cover the conductive films 707 to 710, the oxide semiconductor film 705, and the oxide semiconductor film 706 as shown in FIG. 12D.

The insulating film 711 can be formed using a material and a layered structure which are similar to those of the gate insulating film 704. Further, it is preferable that the insulating film 711 contain impurities, such as moisture or hydrogen as little as possible, which is similar to the gate insulating film 704. When hydrogen is contained in the insulating film 711, the hydrogen enters the oxide semiconductor films 705 and 706 and extracts oxygen in the oxide semiconductor films 705 and 706, whereby the oxide semiconductor films 705 and 706 has lower resistance (n-type conductivity); thus, a parasitic channel might be formed. Therefore, it is important that a formation method without using hydrogen be employed so that the insulating film 711 contains hydrogen as little as possible. A material having a high barrier property is preferably used for the insulating film 711. As the insulating film having a high barrier property, a silicon nitride film, a silicon nitride oxide film, an aluminum nitride film, an aluminum nitride oxide film, or the like can be used, for example. In the case where a plurality of insulating films stacked is used, an insulating film having lower proportion of nitrogen, such as a silicon oxide film or a silicon oxynitride film, is formed on the side closer to the oxide semiconductor films 705 and 706 than to the insulating film having a high barrier property. Then, the insulating film having a high barrier property is formed so as to overlap with the conductive films 707 to 710 and the oxide semiconductor films 705 and 706 with the insulating film having a lower proportion of nitrogen provided therebetween. When the insulating film having a high barrier property is used, impurities such as moisture or hydrogen can be prevented from entering the oxide semiconductor films 705 and 706, the insulating film 711, or the interface between the oxide semiconductor films 705 and 706 and another insulating film and the vicinity thereof. In addition, the insulating film having lower proportion of nitrogen such as a silicon oxide film or a silicon oxynitride film is formed so as to be in contact with the oxide semiconductor films 705 and 706, so that the insulating film formed using a material having a high barrier property can be prevented from being in contact with the oxide semiconductor films 705 and 706 directly.

In this embodiment, the insulating film 711 is formed to have a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

Note that after the insulating film 711 is formed, heat treatment may be performed. The heat treatment is performed in a nitrogen atmosphere, ultra-dry air, or a rare gas (e.g., argon or helium) atmosphere preferably higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment for 1 hour at 250° C. in a nitrogen atmosphere is performed. Alternatively, RTA treatment for a short time at a high temperature may be performed before the formation of the conductive films 707 to 710 in a manner similar to that of the heat treatment performed on the oxide semiconductor film for reduction of moisture or hydrogen. Even when oxygen vacancies are generated in the oxide semiconductor films 705 and 706 by the previous heat treatment performed on the oxide semiconductor films 705 and 706, oxygen is supplied to the oxide semiconductor films 705 and 706 from the insulating film 711 by performing heat treatment after providing the insulating film 711 containing oxygen. By supplying oxygen to the oxide semiconductor films 705 and 706, oxygen defects that serve as donors can be reduced in the oxide semiconductor films 705 and 706 and the stoichiometric ratio can be satisfied. The oxide semiconductor films 705 and 706 preferably contain oxygen whose composition exceeds the stoichiometric composition. As a result, the oxide semiconductor films 705 and 706 can be made to be substantially i-type and variation in electric characteristics of the transistor due to oxygen deficiency can be reduced; thus, electric characteristics can be improved.

Alternatively, heat treatment may be performed on the oxide semiconductor films 705 and 706 in an oxygen atmosphere to add oxygen to the oxide semiconductor so that the oxygen deficiency that serves as a donor in the oxide semiconductor films 705 and 706 is reduced. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor films 705 and 706 by ion implantation, ion doping, or the like so that oxygen defects that serve as donors are reduced. For example, oxygen made to be plasma with a microwave of 2.45 GHz may be added to the oxide semiconductor films 705 and 706.

The transistor 712 and the transistor 713 are formed through the above process. The transistor 712 includes the conductive film 702 serving as a gate electrode, the gate insulating film 704, the oxide semiconductor film 705, and the conductive films 707 and 708 each serving as a source electrode or a drain electrode. The insulating film 711 may be included in the transistor 712. The transistor 713 includes the conductive film 702 serving as a gate electrode, the gate insulating film 704, the oxide semiconductor film 706, and the conductive films 709 and 710 each serving as a source electrode or a drain electrode. The insulating film 711 may be included as a component of the transistor 713.

Note that a portion where the conductive film 703 and the conductive film 708 overlap each other with the gate insulating film 704 provided therebetween corresponds to the capacitor 714. Note that a portion where the conductive film 703 and the conductive film 710 overlap each other with the gate insulating film 704 provided therebetween corresponds to the capacitor 715.

Since many oxide semiconductors contain a Group 13 element, an insulating material including the Group 13 element fits the oxide semiconductor well. Therefore, by using such an insulating material for the insulating film in contact with the oxide semiconductor film (in this embodiment, corresponding to the gate insulating film 704 and the insulating film 711), the interface characteristics between the oxide semiconductor film and the insulating film can be kept well.

An insulating material containing a Group 13 element means an insulating material including one or more Group 13 elements. As the insulating material containing a Group 13 element, a gallium oxide, an aluminum oxide, an aluminum gallium oxide, a gallium aluminum oxide, and the like are given. Here, aluminum gallium oxide refers to a material in which aluminum content is larger than gallium content in atomic percent, and gallium aluminum oxide refers to a material in which gallium content is larger than or equal to aluminum content in atomic percent.

For example, in the case of forming an insulating film in contact with an oxide semiconductor film containing gallium, a material including gallium oxide may be used as an insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor film.

The insulating film in contact with the oxide semiconductor films 705 and 706 preferably contains oxygen in a proportion higher than that in the stoichiometric composition, by heat treatment under an oxygen atmosphere or oxygen doping. "Oxygen doping" means addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen plasma is added to a bulk. The oxygen doping may be performed by ion implantation or ion doping.

For example, in the case where the insulating film in contact with the oxide semiconductor films 705 and 706 is formed using gallium oxide, the composition of gallium oxide can be set to be $Ga_2O_x$ ($x=3+\alpha$, $0<\alpha<1$) by heat treatment under an oxygen atmosphere or by oxygen doping.

In the case where the insulating film in contact with the oxide semiconductor films 705 and 706 is formed using aluminum oxide, the composition of aluminum oxide can be set to be $Al_2O_x$ ($x=3+\alpha$, $0<\alpha<1$) by heat treatment under an oxygen atmosphere or oxygen doping.

In the case where the insulating film in contact with the oxide semiconductor films 705 and 706 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor films 705 and 706; however, it is preferable to apply such an insulating film to both the insulating films which are in contact with the oxide semiconductor films 705 and 706. The above-described effect can be enhanced with a structure where the oxide semiconductor films 705 and 706 are placed between the insulating films which each include a region where the proportion of oxygen is higher than that in the stoichiometric composition, which are used as the insulating films in contact with the oxide semiconductor films 705 and 706 and located on the upper side and the lower side of the oxide semiconductor films 705 and 706.

The insulating films on the upper side and the lower side of the oxide semiconductor films 705 and 706 may contain the same constituent element or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the oxide semiconductor films 705 and 706 may be formed by stacking insulating films which each include a region where the proportion of oxygen is higher than that in the stoichiometric composition. For example, the insulating film on the upper side of the oxide semiconductor films 705 and 706 may be formed as follows: gallium oxide whose composition is $Ga_2O_x$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor films 705 and 706 may be formed by stacking insulating films each including a region where the proportion of oxygen is higher than that in the stoichiometric composition. Further, both of the insulating films on the upper side and the lower side of the oxide semiconductor films 705 and 706 may be formed by stacking insulating films each including a region where the proportion of oxygen is higher than that in the stoichiometric composition.

This embodiment can be implemented in combination with any of the above embodiments.

(Embodiment 4)

Next, an example of a specific structure of the driver circuit in the memory device according to one embodiment of the present invention will be described.

Figure 13:
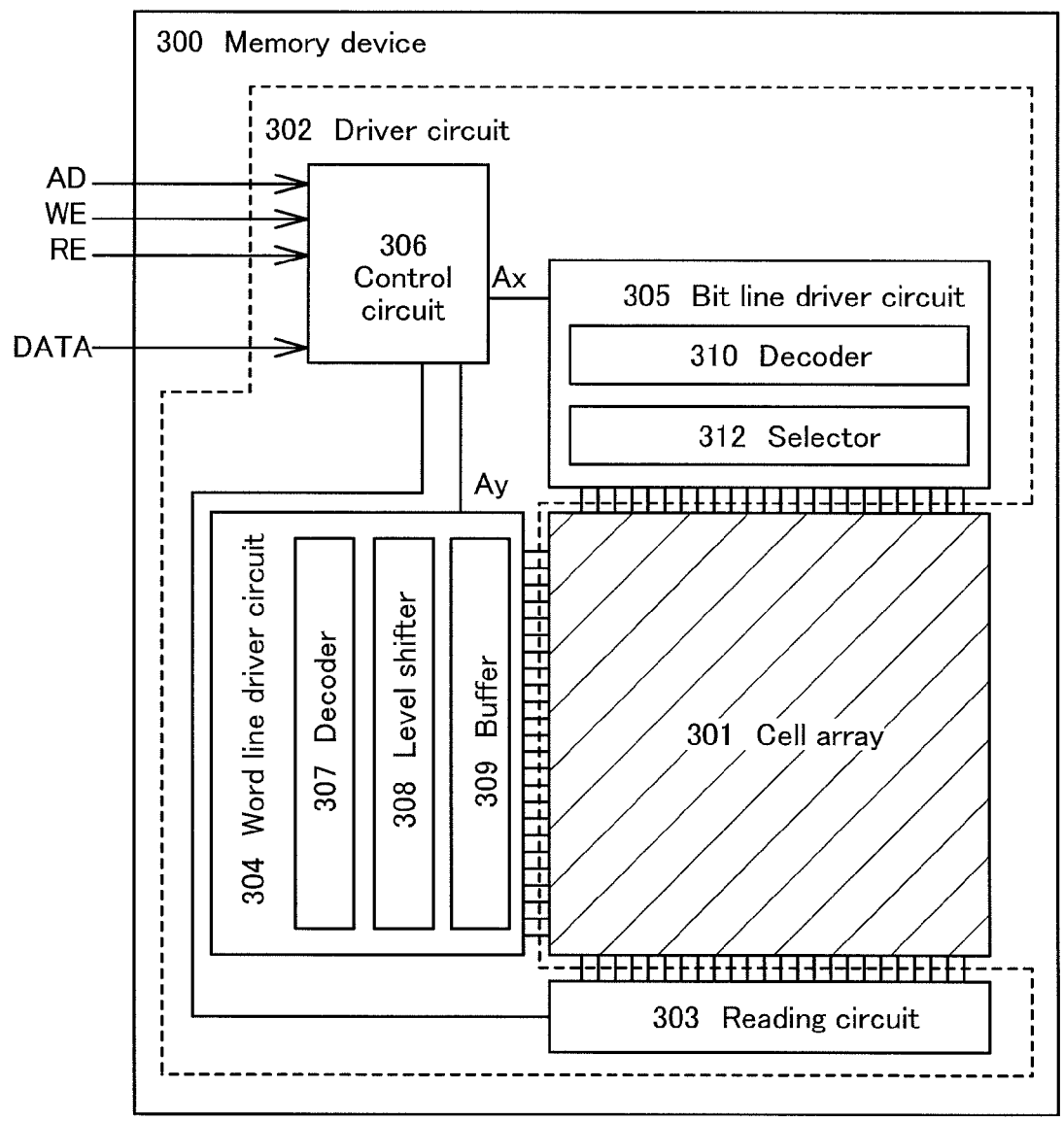
FIG. 13 is a block diagram showing a structure of a memory device.

FIG. 13 illustrates, as an example, a block diagram of a specific structure of a memory device according to one embodiment of the present invention. Note that in the block diagram in FIG. 13, circuits in the memory device are classified in accordance with their functions and separated blocks are illustrated. However, it is difficult to classify actual circuits according to their functions completely and it is possible for one circuit to have a plurality of functions.

A memory device 300 illustrated in FIG. 13 includes a cell array 301 and a driver circuit 302. The driver circuit 302 includes a reading circuit 303 which generates a signal including data read from the cell array 301, a word line driver circuit 304 which controls the potential of a word line, and a bit line driver circuit 305 which controls data writing in a memory cell selected in the cell array 301. The driver circuit 302 further includes a control circuit 306 which controls operation of the reading circuit 303, the word line driver circuit 304, and the bit line driver circuit 305.

Note that in the case where the cell array 301 includes a plurality of blocks as shown in FIG. 9, a word line driver circuit and a bit line driver circuit may be provided corresponding to each block.

In addition, in the memory device 300 shown in FIG. 13, the word line driver circuit 304 includes a decoder 307, a level shifter 308, and a buffer 309. The bit line driver circuit 305 includes a decoder 310 and a selector 312.

Note that it is acceptable as long as the memory device 300 according to one embodiment of the present invention includes at least the cell array 301. Further, the memory device 300 according to one embodiment of the present invention includes, in its category, a memory module in which part of the driver circuit 302 or the entire driver circuit 302 is connected to the cell array 301. The memory module may be provided with a connection terminal which can be mounted on a printed wiring board or the like and may be protected with resin or the like, that is, may be packaged.

The cell array 301, the reading circuit 303, the word line driver circuit 304, the bit line driver circuit 305, and the control circuit 306 may be formed using one substrate. Alternatively, any one of the cell array 301, the reading circuit 303, the word line driver circuit 304, the data line driver circuit 305, and the control circuit 306 may be formed using a substrate different from a substrate for the others, or all of them may be formed using different substrates.

In the case of using different substrates, electrical connection can be ensured with the use of an FPC (flexible printed circuit) or the like. In that case, part of the driver circuit 302 may be connected to an FPC by a COF (chip on film) method. Further, electrical connection can be ensured by COG (chip on glass).

When a signal AD having an address (Ax, Ay) of the cell array 301 as data is input to the memory device 300, the control circuit 306 transmits the address Ax of a column direction and the address Ay of a row direction to the bit line driver circuit 305 and the word line driver circuit 304, respectively. In addition, the control circuit 306 transmits a signal DATA including data input to the memory device 300 to the bit line driver circuit 305.

Operation of writing data and operation of reading data in the cell array 301 is selected in accordance with a signal RE (read enable), a signal WE (write enable), or the like supplied to the control circuit 306. Further, in the case where the cell array 301 includes a plurality of blocks as shown in FIG. 9, a signal CE (chip enable) for selecting the block of the cell array 301 may be input to the control circuit 306. In that case, operation selected in accordance with the signal RE or the signal WE is performed in the block in the cell array 301 selected in accordance with the signal CE.

In the cell array 301, when the writing operation is selected in accordance with the signal WE, a signal for selecting memory cells corresponding to the address Ay is generated in the decoder 307 included in the word line driver circuit 304 in response to an instruction from the control circuit 306. The amplitude of the potential is adjusted by the level shifter 308, and then the waveform is processed in the buffer 309 and is input to the cell array 301. In the bit line driver circuit 305, a signal for selecting a memory cell corresponding to the address Ax among the memory cells selected in the decoder 310 is generated in response to an instruction from the control circuit 306. The signal is input to a selector 312. In the selector 312, the signal DATA is sampled in accordance with the input signal, and the sampled signal is input to a memory cell corresponding to the address (Ax, Ay).

In the cell array 301, when the reading operation is selected in accordance with the signal RE, a signal for selecting memory cells corresponding to the address Ay is generated in the decoder 307 included in the word line driver circuit 304 in response to an instruction from the control circuit 306. The amplitude of the signal is adjusted by the level shifter 308, and then the waveform of the signal is processed in the buffer 309 and the processed signal is input to the cell array 301. In the reading circuit 303, a memory cell corresponding to the address Ax is selected among the memory cells selected by the decoder 307 in response to the instruction from the control circuit 306. Data stored in the memory cell corresponding to the address (Ax, Ay) is read, and a signal including the data is generated.

This embodiment can be combined with any of the above embodiments as appropriate.

(Embodiment 5)

In this embodiment, a specific example of a structure of a reading circuit will be described.

The levels of potentials read from the cell array are determined in accordance with data written to the memory cells. Accordingly, in an ideal view, potentials having the same level should be read from the plurality of memory cells when data with the same digital value is stored in the plurality of memory cells. However, practically, there is a case where the characteristics of transistors functioning as memory elements or transistors functioning as switching elements in reading are varied among the memory cells. In that case, the potentials which are actually read are varied even if all of data to be read has the same digital value, so that the levels of the potentials can be widely distributed. Thus, it is preferable to provide, in the driver circuit, a reading circuit in which a signal including more accurate data and having an amplitude and a waveform processed in accordance with a desired specification can be generated even when potentials read from the cell array are slightly varied.

Figure 14:
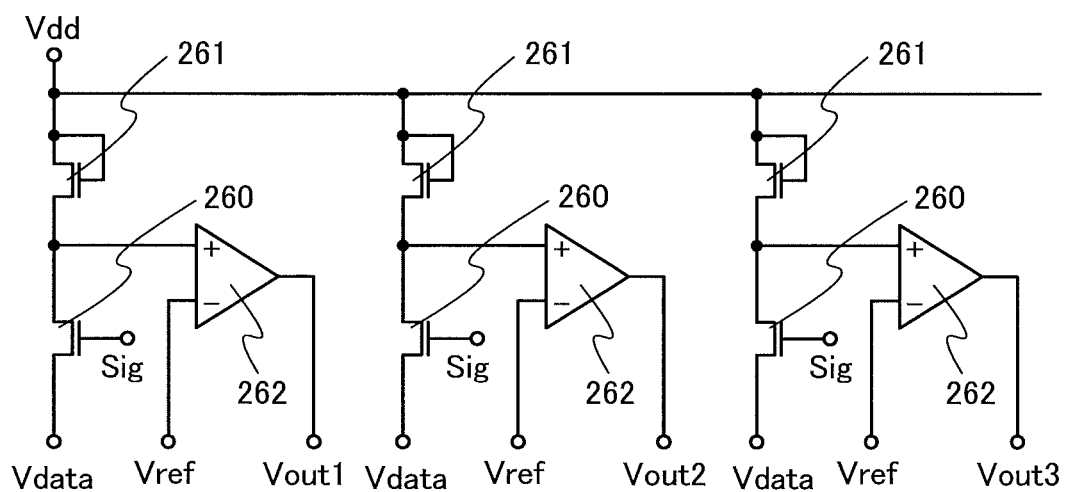
FIG. 14 is a circuit diagram of a reading circuit.

FIG. 14 is an example of a circuit diagram of a reading circuit. The reading circuit illustrated in FIG. 14 includes transistors 260 serving as switching elements for controlling the input of potentials $V_{data}$ read from a cell array to the reading circuit, and transistors 261 serving as resistors. In addition, the reading circuit in FIG. 14 includes operational amplifiers 262.

Specifically, gate electrodes of the transistors 261 are connected to drain terminals of the transistors 261, respectively. In addition, a high-level power supply potential $V_{dd}$ is supplied to the gate electrodes and the drain terminals. Further, source terminals of the transistors 261 are connected to non-inversion input terminals (+) of the operational amplifiers 262, respectively. Accordingly, the transistors 261 function as resistors connected between nodes to which the power supply potential $V_{dd}$ is supplied and the non-inverting input terminals (+) of the operational amplifiers 262. Although, a transistor whose gate electrode is connected to the drain terminal is used as a resistor in FIG. 14, the present invention is not limited thereto: an element serving as a resistor can be used instead.

Further, gate electrodes of the transistors 260 serving as switching elements are connected to respective bit lines. Then, the supply of potentials $V_{data}$ to source electrodes of the transistors 260 is controlled in accordance with potentials of the bit lines.

When the transistor 260 connected to the bit line is turned on, a potential obtained by dividing the potential $V_{data}$ and the power supply potential $V_{dd}$ using resistors, i.e., the transistor 260 and the transistor 261, is supplied to the non-inverting input terminal (+) of the operational amplifier 262. The level of the power supply potential $V_{dd}$ is fixed; thus, the level of the potential obtained by the resistor division reflects the level of the potential $V_{data}$, i.e., a digital value of read data.

In contrast, a reference potential $V_{ref}$ is supplied to inverting input terminals (−) of the operational amplifiers 262. The levels of potentials $V_{out}$ of output terminals can be varied depending on the level of the potential applied to the inversion input terminals (−) with respect to the reference potential $V_{ref}$. Thus, a signal which indirectly includes data can be obtained.

Note that even if data with the same value is stored in memory cells, fluctuation in levels of the read potential $V_{data}$ occurs due to variation in characteristics of the memory cells, so that the levels of potentials can be widely distributed in some cases. The level of the reference potential $V_{ref}$ is determined in consideration of fluctuation in the potential $V_{data}$ of node in order to read the value of data accurately.

Since FIG. 14 illustrates an example of a reading circuit in the case of using a binary digital value, one operational amplifier used for reading data is provided for each node to which the potential $V_{data}$ is supplied. However, the number of operational amplifiers is not limited thereto. When n-valued data (n is a natural number of 2 or more) is used, the number of operational amplifiers used for each node to which the potential $V_{data}$ is supplied is (n−1).

This embodiment can be implemented in combination with any of the above embodiments.

(Embodiment 6)

The actually measured mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the mobility on the assumption that no defect exists inside the semiconductor can be calculated theoretically. In view of this, the mobility of an ideal oxide semiconductor without defects inside the semiconductor is theoretically calculated and calculation results of characteristics of minute transistors which are manufactured using such an oxide semiconductor are shown in this embodiment.

Assuming that the original mobility and the measured mobility of a semiconductor are $\mu_o$ and $\mu$, respectively, and a potential barrier (such as a grain boundary) exists in the semiconductor, the mobility $\mu$ can be expressed as Equation 2 below.

$$\mu = \mu_0 \exp\left(-\frac{E}{kT}\right) \qquad \text{[Equation 2]}$$

Note that E represents the height of the potential barrier, k represents the Boltzmann constant, and T represents the absolute temperature. When the potential barrier is assumed to be attributed to a defect, the height of the potential barrier can be expressed by Equation 3 below according to the Levinson model.

$$E = \frac{e^2 N^2}{8\varepsilon n} = \frac{e^3 N^2 t}{8\varepsilon C_{ox} V_g} \qquad \text{[Equation 3]}$$

Note that e represents the elementary charge, N represents the average defect density per unit area in a channel formation region, $\varepsilon$ represents the permittivity of the semiconductor, n represents the number of carriers per unit area in the channel formation region, $C_{ox}$ represents the capacitance per unit area, $V_g$ represents the gate voltage, and t represents the thickness of the channel formation region. In the case where the thickness of the semiconductor film is less than or equal to 30 nm, the thickness of the channel formation region may be regarded as being the same as the thickness of the semiconductor film. The drain current $I_d$ in a linear region can be expressed as Equation 4 below.

$$I_d = \frac{W\mu V_g V_d C_{ox}}{L} \exp\left(-\frac{E}{kT}\right) \quad \text{[Equation 4]}$$

L represents the channel length and W represents the channel width, and L and W are each 10 μm in this case. $V_d$ represents the drain voltage. When dividing both sides of the above equation by $V_g$ and then taking logarithms of both sides, the Equation 5 below can be obtained.

$$\ln\left(\frac{I_d}{V_g}\right) = \quad \text{[Equation 5]}$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Equation 5 is a function of $V_g$. From Equation 5, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}$/cm².

On the basis of the defect density obtained in this manner, or the like, $\mu_0$ can be calculated to be 120 cm²/Vs from Equation 2 and Equation 3. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel formation region and a gate insulating film affects the transport property of the transistor. In other words, the mobility $\mu_1$ at a position that is distance x away from the interface between the channel and the gate insulating film can be expressed by Equation 6 below.

$$\frac{1}{\mu_1} = \frac{1}{\mu_0} + \frac{D}{B}\exp\left(-\frac{x}{G}\right) \quad \text{[Equation 6]}$$

D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage $V_g$ is increased), the second term of Equation 6 is increased and accordingly the mobility $\mu_1$ is decreased.

Figure 18:
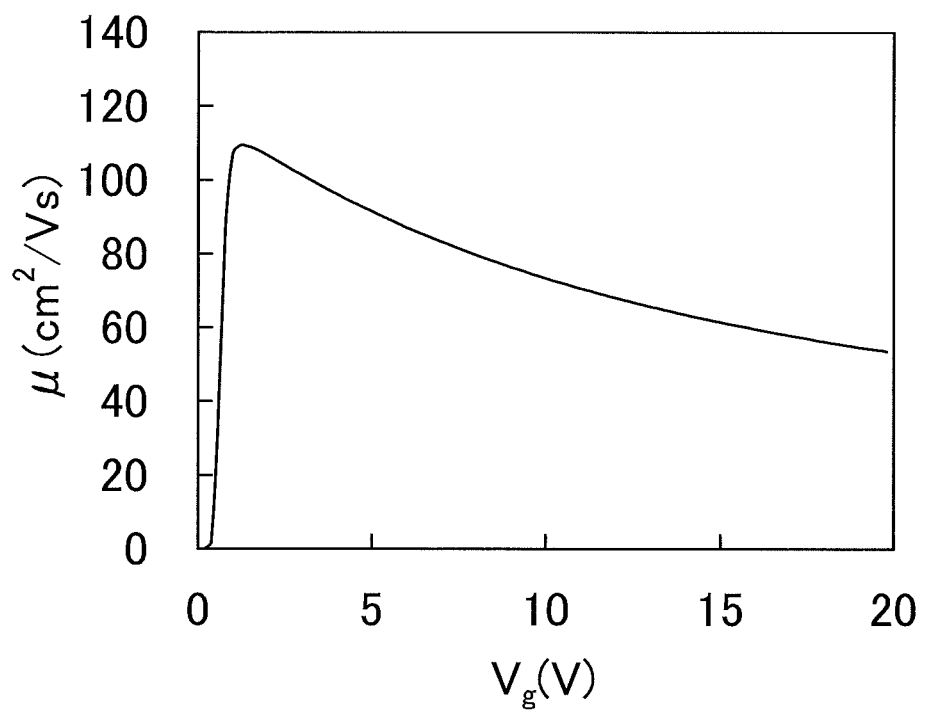
FIG. 18 is a graph showing gate voltage dependence of mobility, which is obtained by calculation.

Calculation results of the mobility $\mu_2$ of a transistor whose channel formation region includes an ideal oxide semiconductor without a defect inside the semiconductor are shown in FIG. 18. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length L and the channel width W were each assumed to be 10 μm, and the drain voltage $V_d$ was assumed to be 0.1 V.

As shown in FIG. 18, the mobility $\mu_2$ has a peak of more than 100 cm²/Vs at a gate voltage $V_g$ that is a little over 1 V and is decreased as the gate voltage $V_g$ becomes higher because the influence of interface scattering is increased. Note that in order to reduce interface scattering, it is preferable that a surface of the semiconductor film be flat at the atomic level (atomic layer flatness).

Calculation results of electric characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 8103a and a semiconductor region 8103c which have n⁺-type conductivity in an oxide semiconductor film. The resistivity of the semiconductor region 8103a and the resistivity of the semiconductor region 8103c are each $2\times10^{-3}$ Ωcm.

The transistor illustrated in FIG. 22A is formed over a base insulating film 8101 and an embedded insulator 8102 which is embedded in the base insulating film 8101 and formed of aluminum oxide. The transistor includes the semiconductor region 8103a, the semiconductor region 8103c, an intrinsic semiconductor region 8103b serving as a channel formation region therebetween, and a gate electrode 8105.

A gate insulating film 8104 is formed between the gate electrode 8105 and the semiconductor region 8103b. In addition, a sidewall insulator 8106a and a sidewall insulator 8106b are formed on both side surfaces of the gate electrode 8105, and an insulator 8107 is formed over the gate electrode 8105 so as to prevent a short circuit between the gate electrode 8105 and another wiring. The sidewall insulator has a width of 5 nm. A source electrode 8108a and a drain electrode 8108b are provided in contact with the semiconductor region 8103a and the semiconductor region 8103c, respectively. Note that the channel width of this transistor is 40 nm.

The transistor of FIG. 22B is the same as the transistor of FIG. 22A in that it is formed over the base insulating film 8101 and the embedded insulator 8102 formed of aluminum oxide and that it includes the semiconductor region 8103a, the semiconductor region 8103c, the intrinsic semiconductor region 8103b provided therebetween, the gate electrode 8105 having a width of 33 nm, the gate insulating film 8104, the sidewall insulator 8106a, the sidewall insulator 8106b, the insulator 8107, the source electrode 8108a, and the drain electrode 8108b.

The transistor illustrated in FIG. 22A is different from the transistor illustrated in FIG. 22B in the conductivity type of semiconductor regions under the sidewall insulator 8106a and the sidewall insulator 8106b. In the transistor illustrated in FIG. 22A, the semiconductor regions under the sidewall insulator 8106a and the sidewall insulator 8106b are part of the semiconductor region 8103a having n⁺-type conductivity and part of the semiconductor region 8103c having n⁺-type conductivity, whereas in the transistor illustrated in FIG. 22B, the semiconductor regions under the sidewall insulator 8106a and the sidewall insulator 8106b are part of the intrinsic semiconductor region 8103b. In other words, in the oxide semiconductor film of FIG. 22B, a region having a width of $L_{off}$ which overlaps with neither the semiconductor region 8103a (the semiconductor region 8103c) nor the gate electrode 8105 is provided. This region is called an offset region, and the width $L_{off}$ is called an offset length. As is seen from FIG. 22B, the offset length $L_{off}$ is equal to the width of the sidewall insulator 8106a (the sidewall insulator 8106b).

Figure 19A:
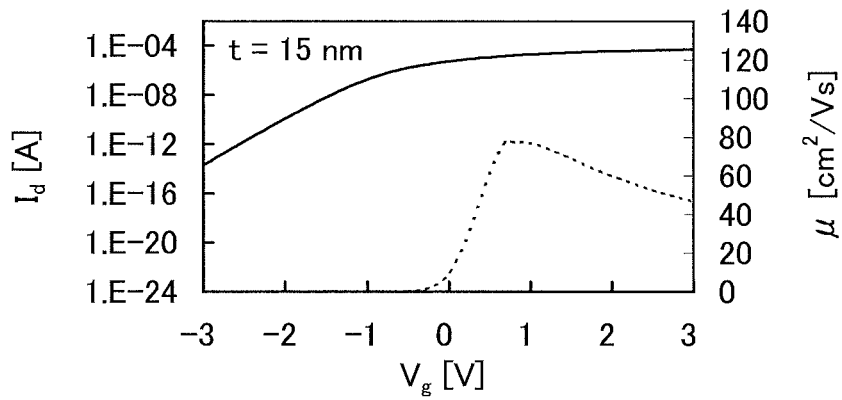
FIGS. 19A to 19C are graphs showing gate voltage dependence of drain current and mobility, which is obtained by calculation.
Figure 19B:
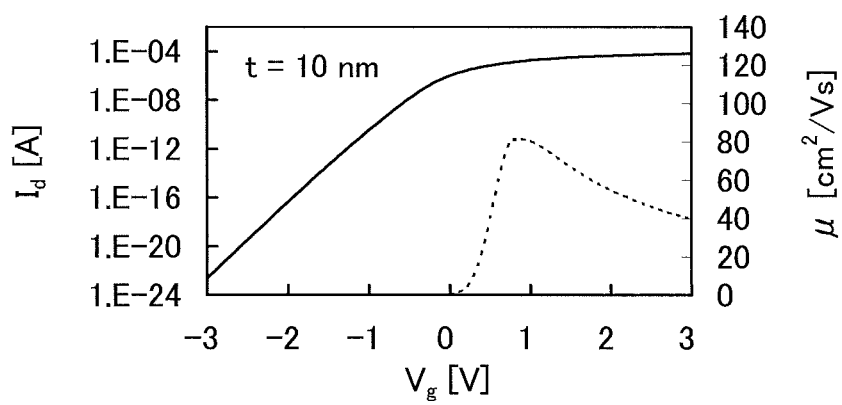
Figure 19C:
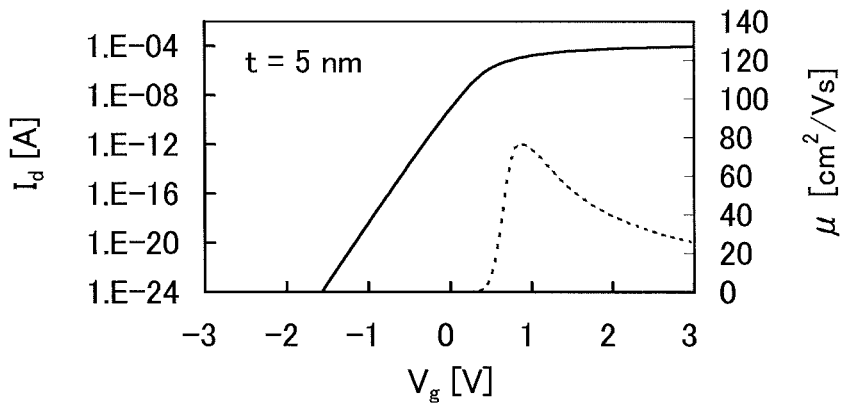

The other parameters used in calculation are as described above. For the calculation, device simulation software Sentaurus Device manufactured by Synopsys, Inc. was used. FIGS. 19A to 19C show the gate voltage ($V_g$, a potential difference between the gate and the source) dependence of the drain current ($I_d$, a solid line) and the mobility ($\mu$, a dotted line) of the transistor having the structure illustrated in FIG. 22A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 19A shows the gate voltage dependence of the transistor in the case where the thickness t of the gate insulating film is 15 nm, FIG. 19B shows that of the transistor in the case where the thickness t of the gate insulating film is 10 nm, and FIG. 19C shows that of the transistor in the case where the thickness t of the gate insulating film is 5 nm. As the thickness t of the gate insulating film is smaller, the drain current $I_d$ (off-state current) particularly in an off state is significantly decreased. In contrast, there is no noticeable change in the peak value of the mobility $\mu$ and the drain current $I_d$ (on-state current) in an ON state. The graphs show that the drain current exceeds 10 µA, which is required in a memory cell and the like, at a gate voltage of around 1 V.

Figure 20A:
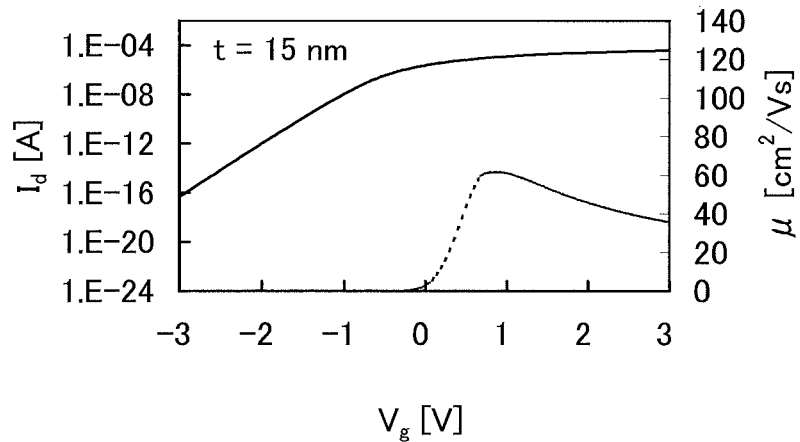
FIGS. 20A to 20C are graphs showing gate voltage dependence of drain current and mobility, which is obtained by calculation.
Figure 20B:
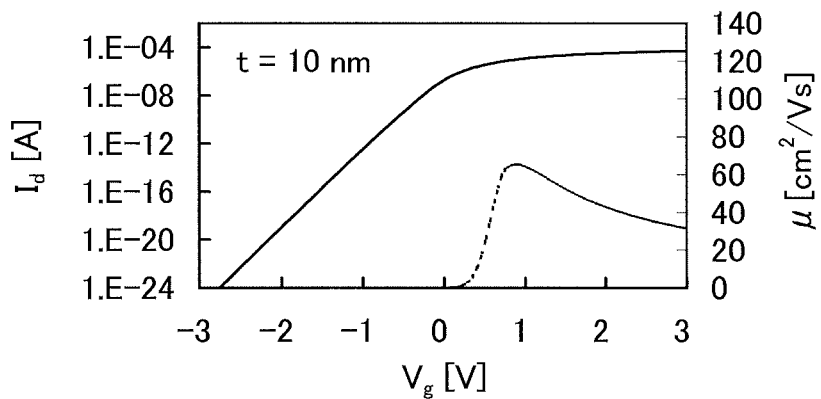
Figure 20C:
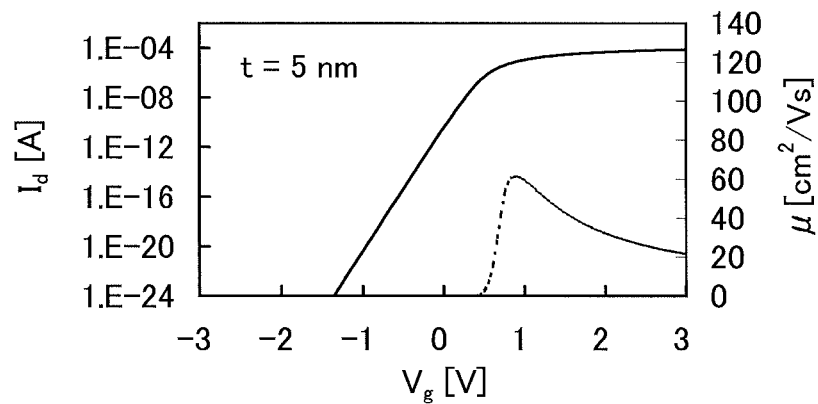

FIGS. 20A to 20C show the gate voltage $V_g$ dependence of the drain current $I_d$ (a solid line) and the mobility $\mu$ (a dotted line) of the transistor having the structure illustrated in FIG. 22B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 20A shows the gate voltage dependence of the transistor in the case where the thickness t of the gate insulating film is 15 nm, FIG. 20B shows that of the transistor in the case where the thickness t of the gate insulating film is 10 nm, and FIG. 20C shows that of the transistor in the case where the thickness t of the gate insulating film is 5 nm.

Figure 21A:
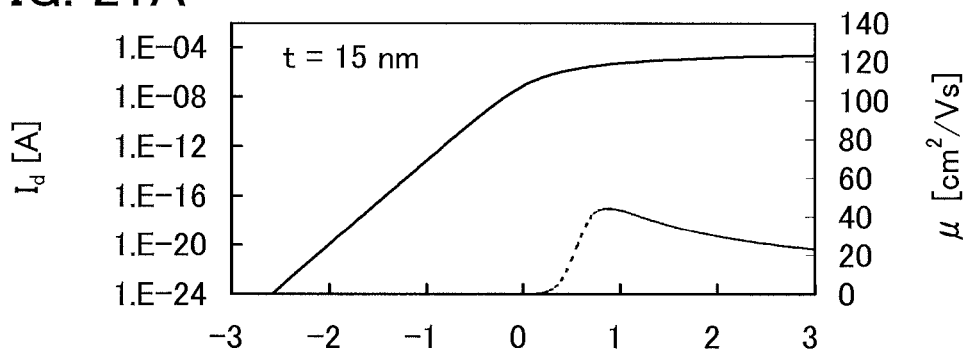
FIGS. 21A to 21C are graphs showing gate voltage dependence of drain current and mobility, which is obtained by calculation.
Figure 21B:
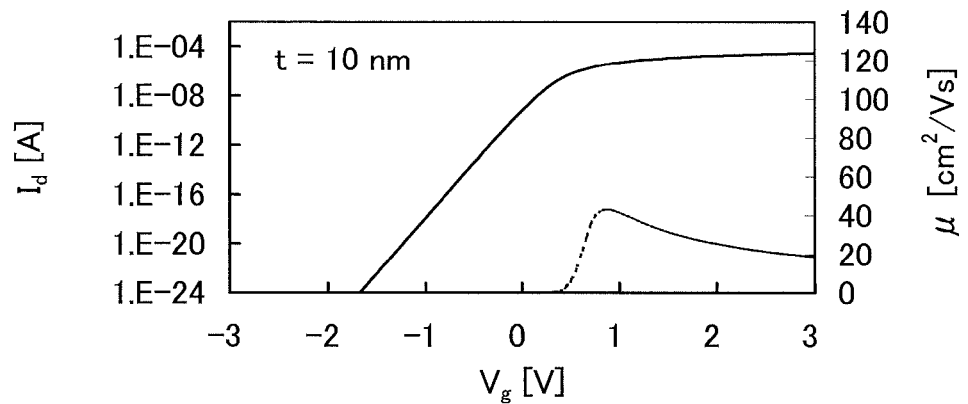
Figure 21C:
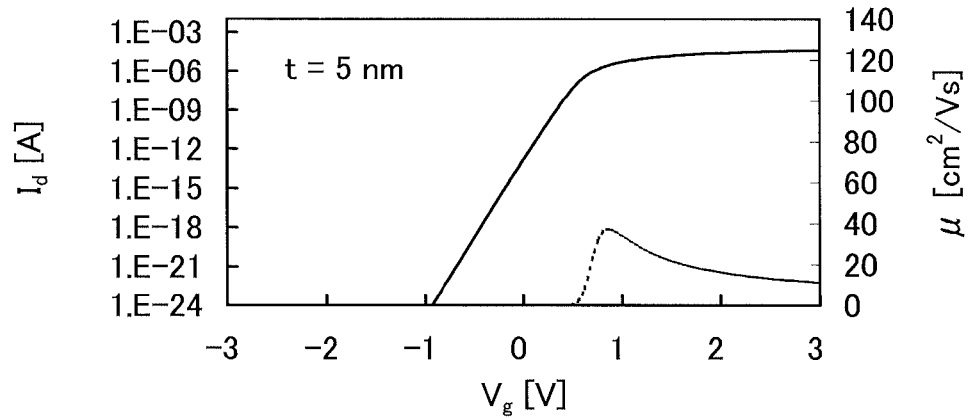
Figure 22A:
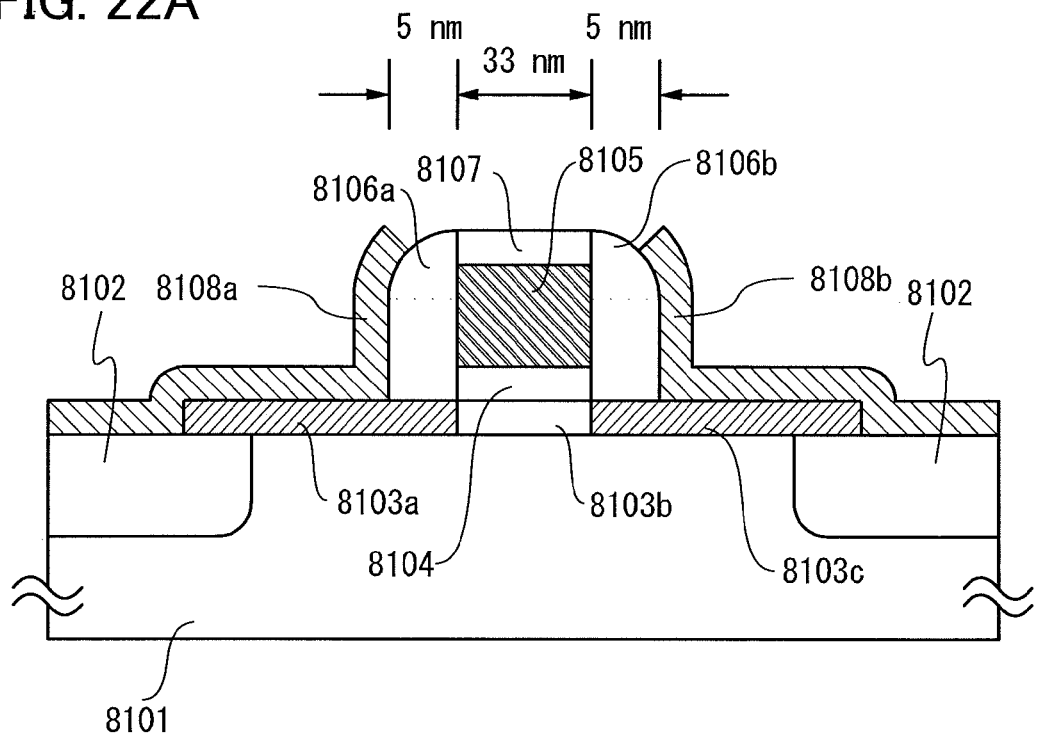
FIGS. 22A and 22B are diagrams each showing a cross-sectional structure of a transistor used for calculation.
Figure 22B:
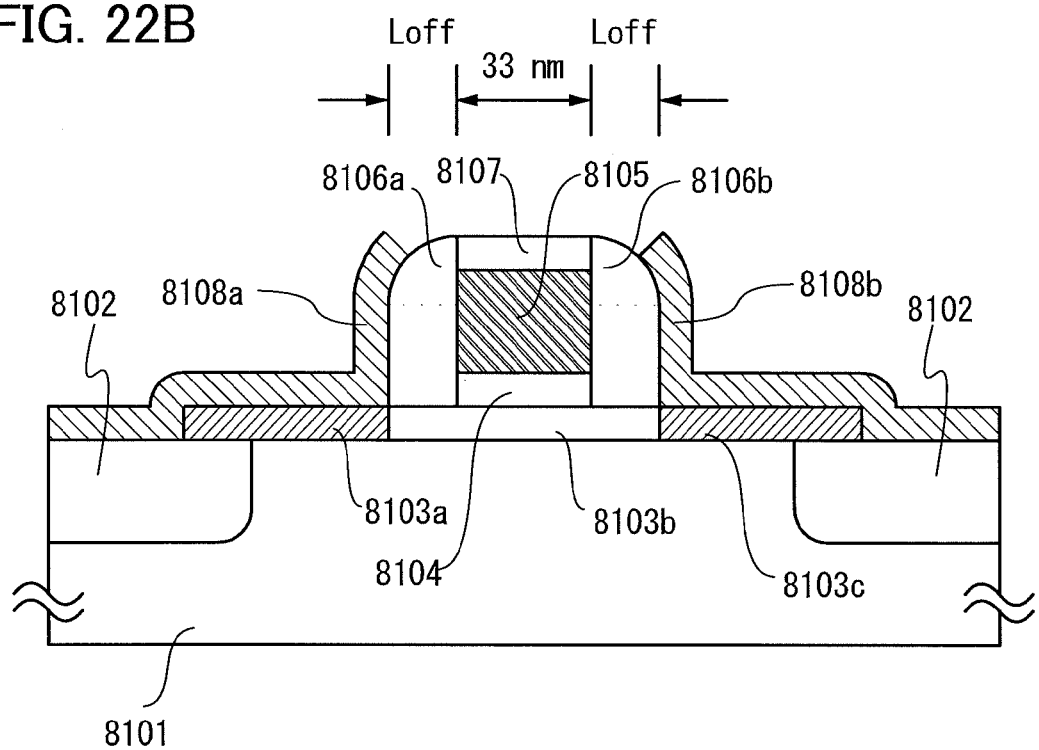

Further, FIGS. 21A to 21C show the gate voltage dependence of the drain current $I_d$ (a solid line) and the mobility $\mu$ (a dotted line) of the transistor having the structure illustrated in FIG. 22B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness t of the gate insulating film is 15 nm, FIG. 21B shows that of the transistor in the case where the thickness t of the gate insulating film is 10 nm, and FIG. 21C shows that of the transistor in the case where the thickness t of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 $cm^2/Vs$ in FIGS. 19A to 19C, approximately 60 $cm^2/Vs$ in FIGS. 20A to 20C, and approximately 40 $cm^2/Vs$ in FIGS. 21A to 21C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA, which is required in a memory cell and the like, at a gate voltage of around 1 V.

This embodiment can be combined with any of the above embodiments as appropriate.

(Embodiment 7)

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more. In this embodiment, the case where the mobility of the transistor is improved by intentionally heating the substrate after formation of the oxide semiconductor film will be described with reference to FIGS. 23A to 23C, FIGS. 24A and 24B, FIGS. 25A and 25B, FIG. 26, FIGS. 27A and 27B, FIG. 28, and FIG. 29.

By intentionally heating the substrate after formation of the oxide semiconductor film including In, Sn, and Zn as main components, the mobility of the transistor can be improved. Further, the threshold voltage of the transistor can be positively shifted to make the transistor normally off.

Figure 23A:
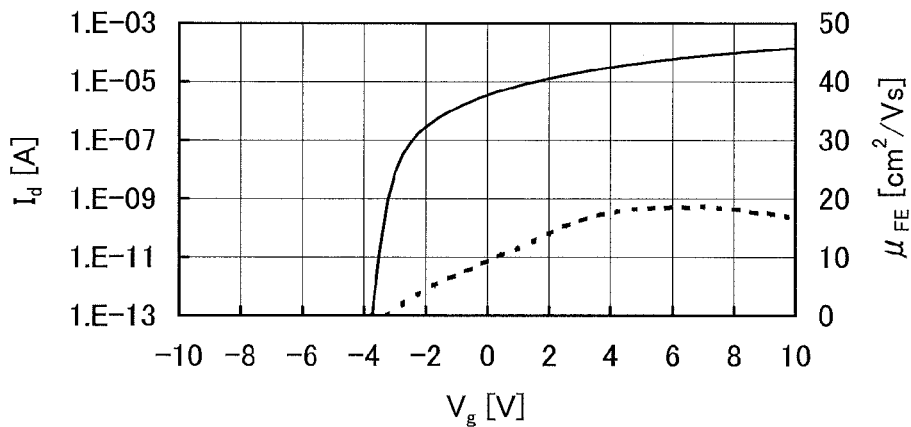
FIGS. 23A to 23C are graphs each showing characteristics of a transistor including an oxide semiconductor film.
Figure 23B:
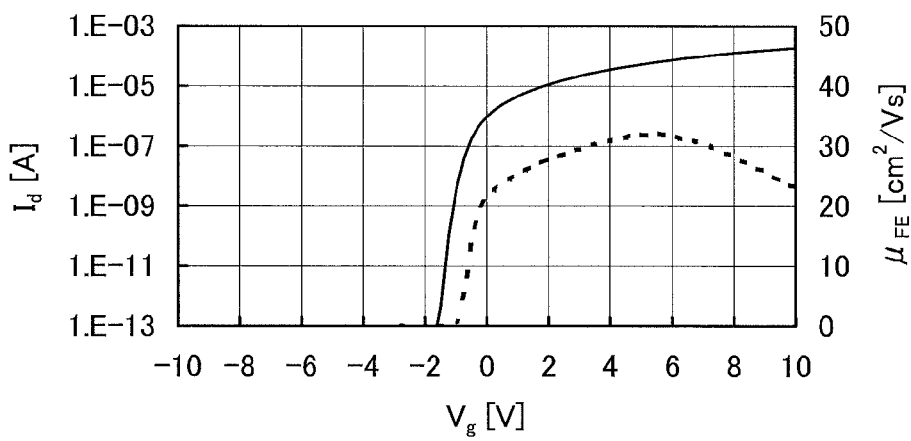
Figure 23C:
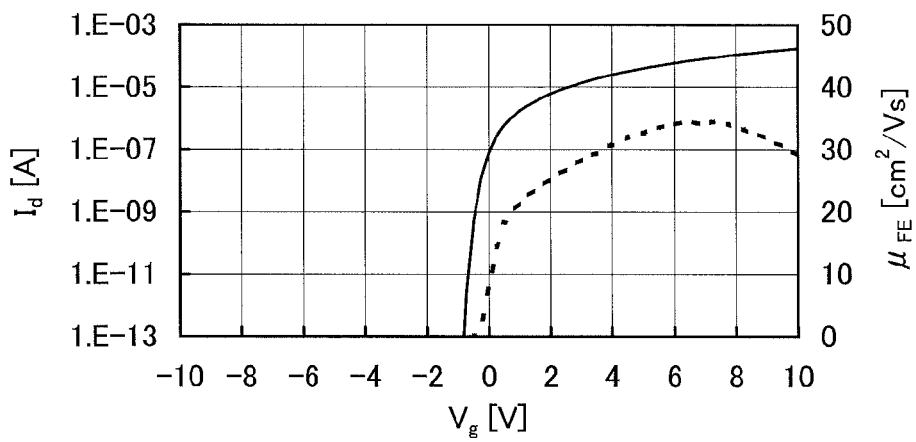

As an example, FIGS. 23A to 23C each show characteristics of a transistor that includes an oxide semiconductor film including In, Sn, and Zn as main components and having a channel length L of 3 µm and a channel width W of 10 µm, and a gate insulating film with a thickness of 100 nm. Note that $V_d$ was set to 10 V.

FIG. 23A shows characteristics of a transistor whose oxide semiconductor film including In, Sn, and Zn as main components was formed by a sputtering method without heating a substrate intentionally. The mobility of the transistor is 18.8 $cm^2/Vs$. On the other hand, when the oxide semiconductor film containing In, Sn, and Zn as main components is formed while heating the substrate intentionally, the mobility can be improved. FIG. 23B shows characteristics of a transistor whose oxide semiconductor film including In, Sn, and Zn as main components was formed while heating a substrate at 200° C. The mobility of the transistor is 32.2 $cm^2/Vs$.

The mobility can be further improved by performing heat treatment after formation of the oxide semiconductor film including In, Sn, and Zn as main components. FIG. 23C shows characteristics of a transistor whose oxide semiconductor film containing In, Sn, and Zn as main components was formed by a sputtering method at 200° C. and then subjected to heat treatment at 650° C. The mobility of the transistor is 34.5 $cm^2/Vs$.

The intentional heating of the substrate is expected to have an effect of reducing moisture taken into the oxide semiconductor film during the formation by a sputtering method. Further, the heat treatment after film formation enables hydrogen, a hydroxyl group, or moisture to be released and removed from the oxide semiconductor film. In this manner, the mobility can be improved. Such an improvement in mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a mobility exceeding 100 cm$^2$/Vs is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor can be formed. In addition, when an oxide semiconductor film is formed using a target of an In—Sn—Zn-based oxide with an atomic ratio of In:Sn:Zn=1:1:1, 2:1:3, 1:2:2, or 20:45:35, a polycrystal or a CAAC is likely to be formed.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to a gate insulating film 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating film 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 24A:
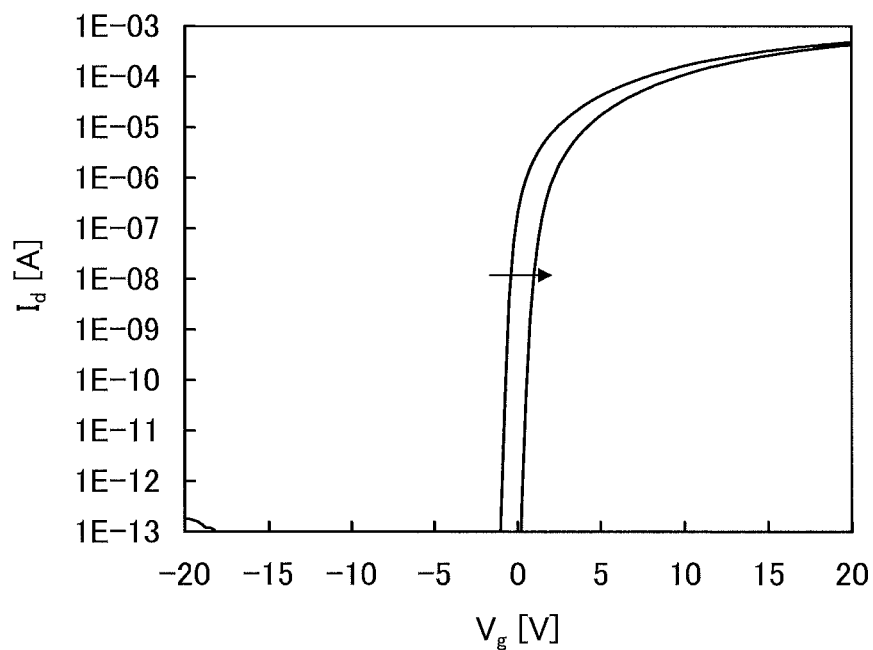
FIGS. 24A and 24B are graphs each showing $V_g$-$I_d$ characteristics of a transistor of Sample 1 which is subjected to a BT test.
Figure 24B:
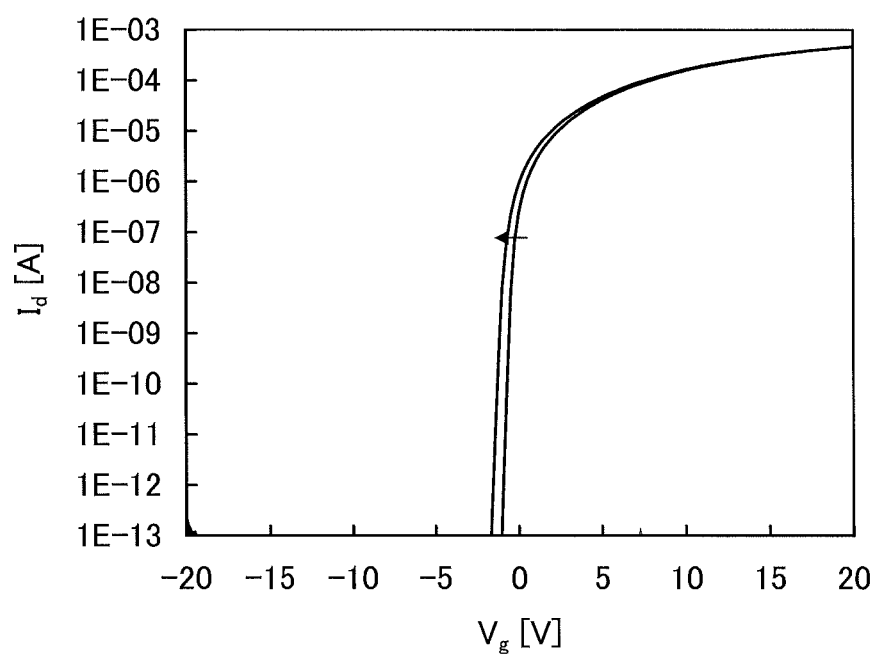
Figure 25A:
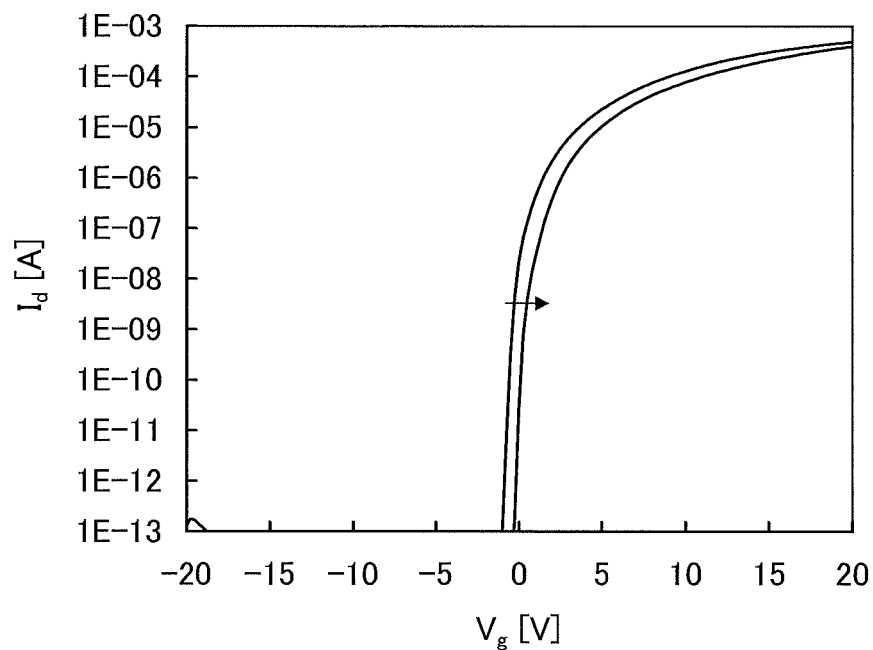
FIGS. 25A and 25B are graphs each showing $V_g$-$I_d$ characteristics of a transistor of Sample 2 which is subjected to a BT test.
Figure 25B:
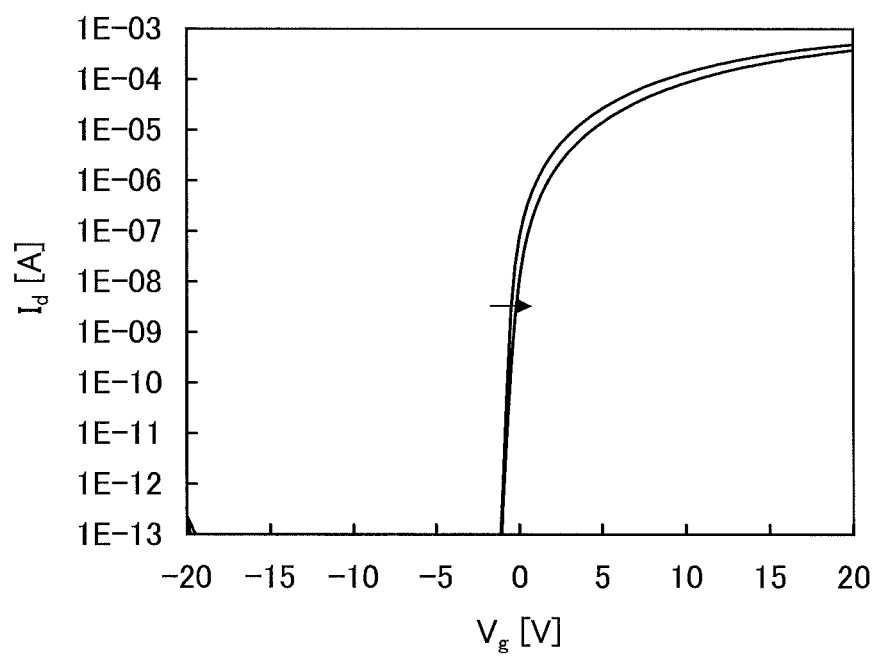

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is contained in the oxide semiconductor by the heat treatment, oxygen deficiency caused constantly can be compensated for with excess oxygen. The excess oxygen is oxygen existing between lattices. When the concentration of excess oxygen is set to higher than or equal to $1 \times 10^{16}$/cm$^3$ and lower than or equal to $2 \times 10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by a sputtering method using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide semiconductor film was conducted. The XRD analysis was conducted using an X-ray diffractometer D8 ADVANCE manufactured by Bruker AXS, and measurement was performed by an out-of-plane method.

Sample A and Sample B were prepared and the XRD analyses were performed thereon. A method for manufacturing Sample A and Sample B will be described below.

First, an In—Sn—Zn-based oxide semiconductor film with a thickness of 100 nm was formed over a quartz substrate that had been subjected to dehydrogenation treatment.

The In—Sn—Zn-based oxide semiconductor film was formed with a sputtering apparatus with a power of 100 W (DC) in an oxygen atmosphere. A target of an In—Sn—Zn-based oxide with an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
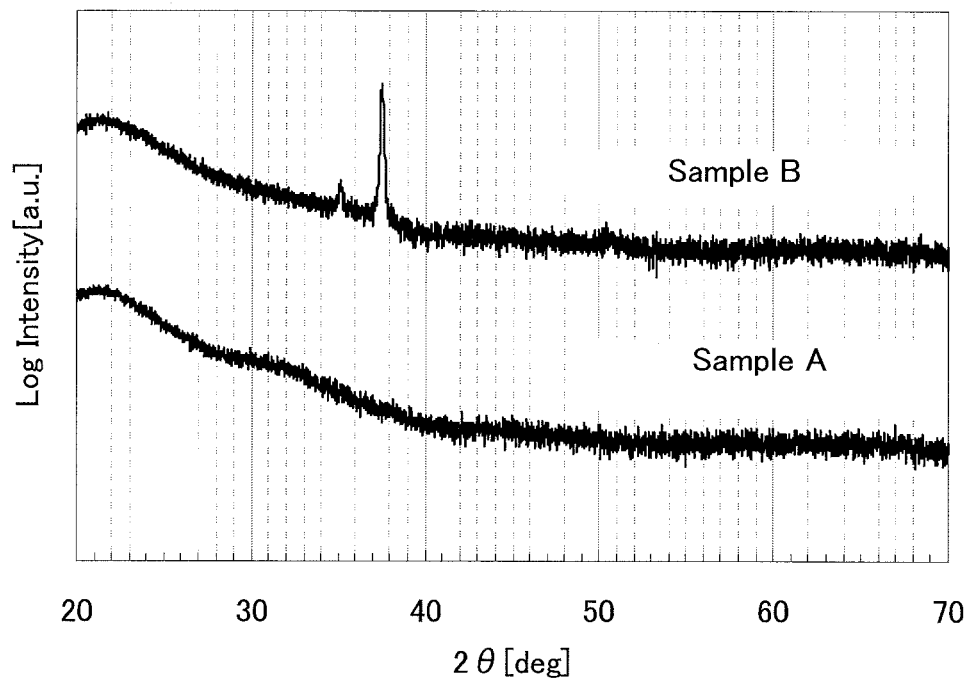
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when $2\theta$ was around 35 deg and 37 deg to 38 deg in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as an impurity which generates a donor from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 29:
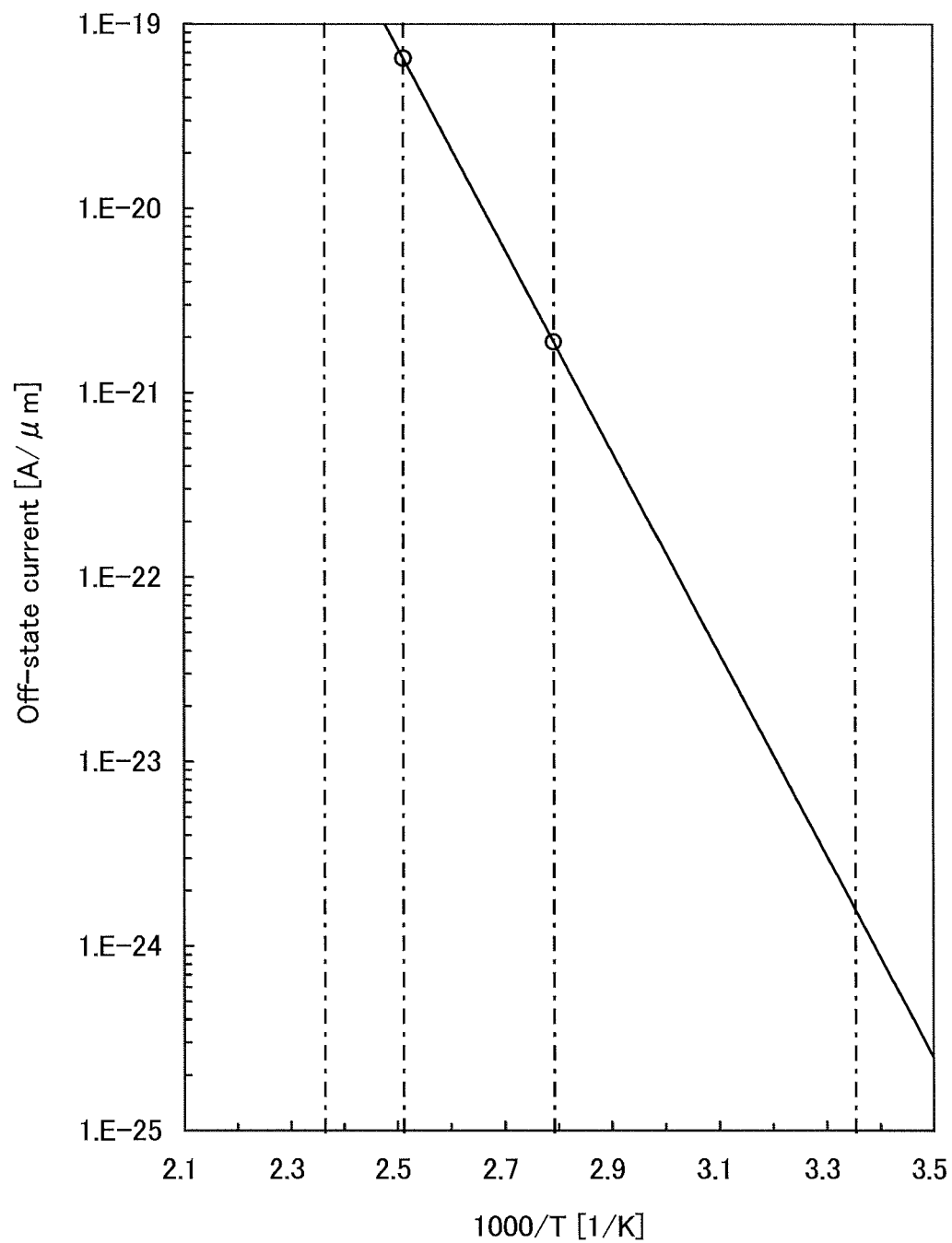
FIG. 29 is a graph showing a relation between the off-state current of a transistor and the substrate temperature in measurement.

FIG. 29 shows a relation between the off-state current of a transistor and the inverse of substrate temperature (absolute temperature) at measurement. In FIG. 29, the horizontal axis represents a value (1000/T) obtained by multiplying an inverse of substrate temperature at measurement by 1000.

As shown in FIG. 29, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being contained in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Note that in the transistor, the width of a portion where the gate electrode overlaps with the source electrode and the drain electrode is referred to as Lov, and the width of a portion of the source electrode and the drain electrode, which does not overlap with an oxide semiconductor film, is referred to as dW.

Figure 26:
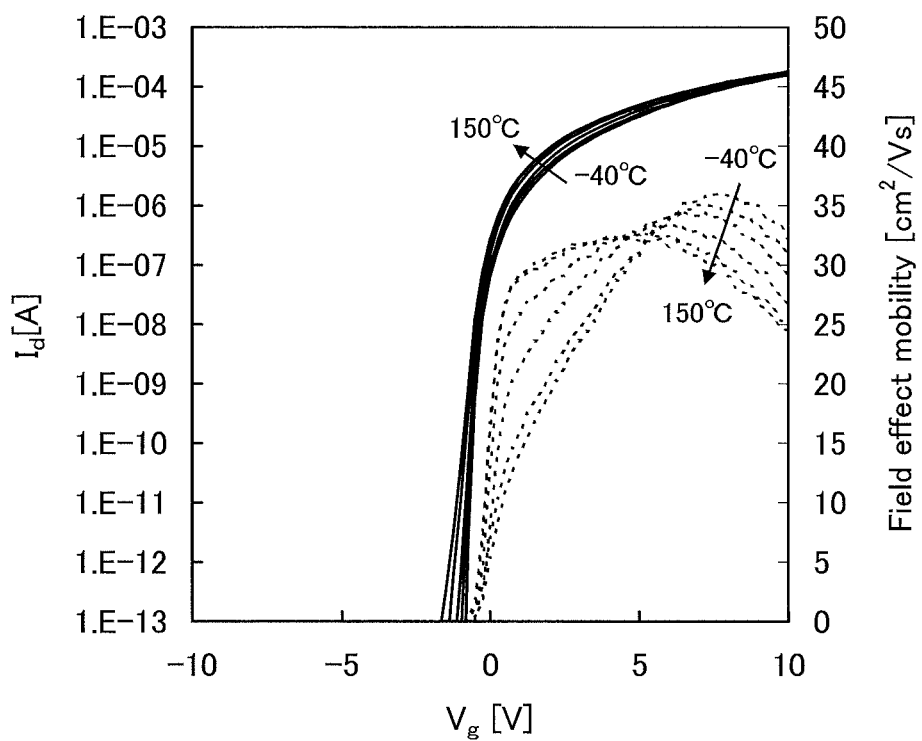
FIG. 26 is a graph showing dependence of $I_d$ and mobility on $V_g$.
Figure 27A:
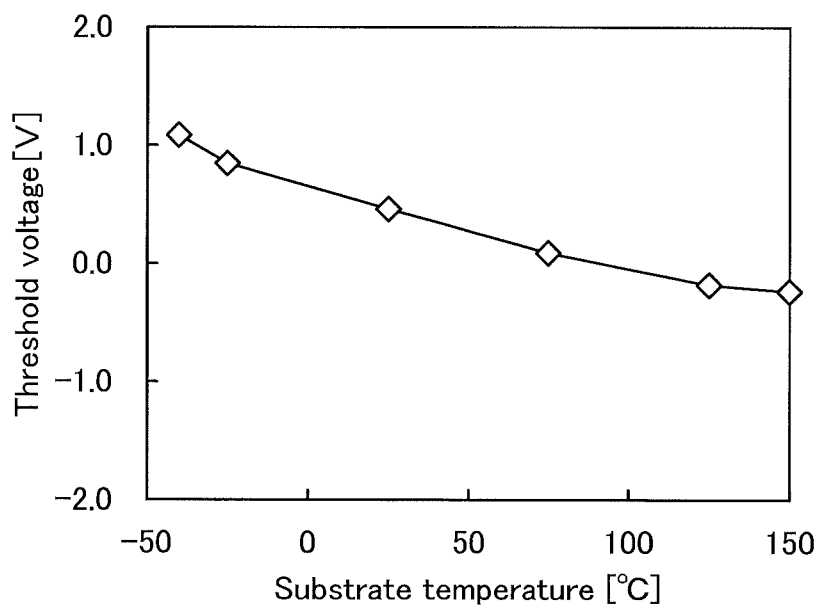
FIG. 27A is a graph showing relation between a substrate temperature and a threshold voltage.

FIG. 26 shows the $V_g$ dependence of $I_d$ (a solid line) and mobility (a dotted line). FIG. 27A shows a relation between the substrate temperature and the threshold voltage, and FIG. 27B shows a relation between the substrate temperature and the mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
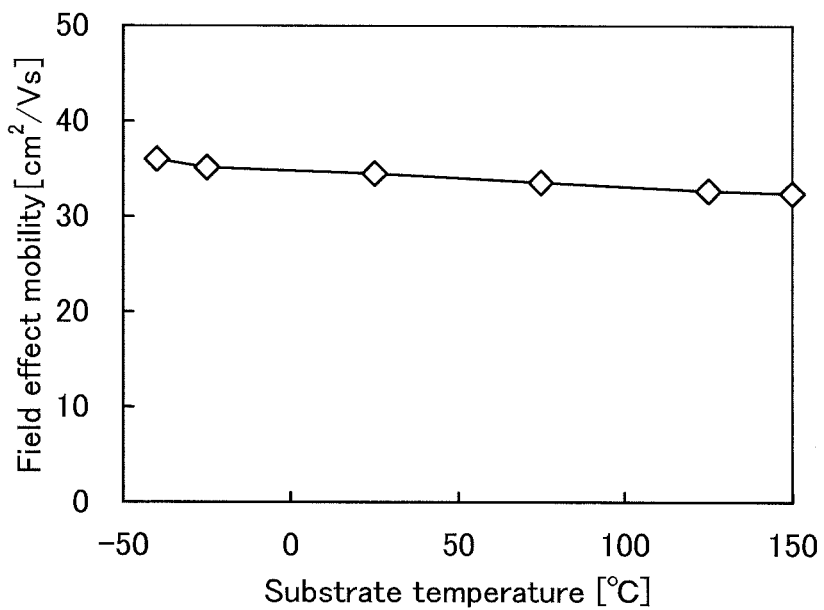
FIG. 27B is a graph showing relation between a substrate temperature and field effect mobility.

From FIG. 27B, it is found that the mobility gets lower as the substrate temperature increases. Note that the mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a mobility of 30 cm$^2$/Vs or higher, preferably 40 cm$^2$/Vs or higher, further preferably 60 cm$^2$/Vs or higher can be obtained with the off-state current maintained at 1 aA/mm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in combination with any of the above embodiments as appropriate.

EXAMPLE 1

In this example, an example of a transistor in which an In—Sn—Zn-based oxide is used for an oxide semiconductor film will be described with reference to FIGS. 30A and 30B and the like.

Figure 30A:
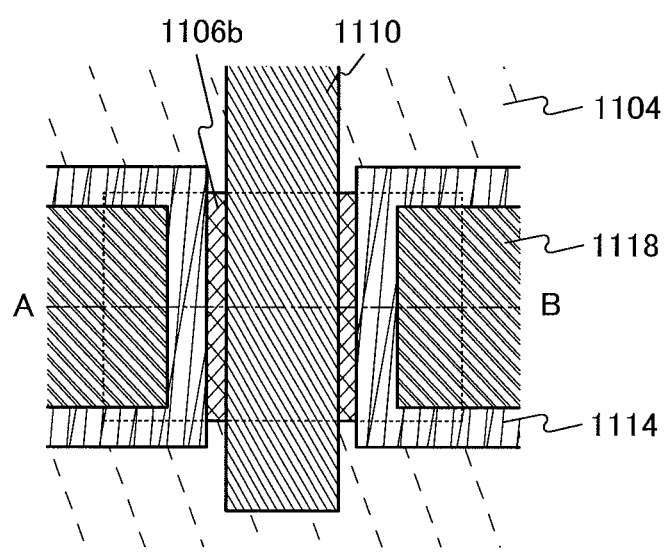
FIGS. 30A and 30B are diagrams showing a structure of a transistor.
Figure 30B:
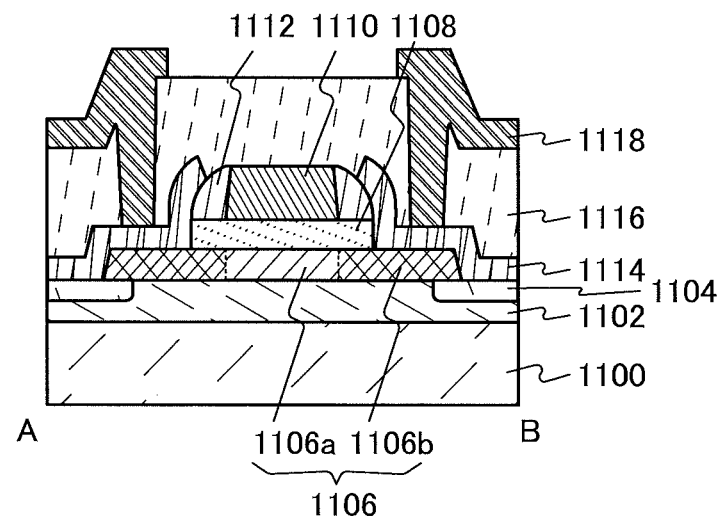

FIGS. 30A and 30B are a top view and a cross-sectional view of a coplanar transistor having a top-gate top-contact structure. FIG. 30A is the top view of the transistor. FIG. 30B illustrates cross section A-B along dashed-dotted line A-B in FIG. 30A.

The transistor illustrated in FIG. 30B includes a substrate 1100, a base insulating film 1102 provided over the substrate 1100, a protective insulating film 1104 provided in the periphery of the base insulating film 1102, an oxide semiconductor film 1106 provided over the base insulating film 1102 and the protective insulating film 1104 and including a high-resistance region 1106a and low-resistance regions 1106b, a gate insulating film 1108 provided over the oxide semiconductor film 1106, a gate electrode 1110 provided so as to overlap with the oxide semiconductor film 1106 with the gate insulating film 1108 provided therebetween, a sidewall insulating film 1112 provided in contact with a side surface of the gate electrode 1110, a pair of electrodes 1114 provided in contact with at least the low-resistance regions 1106b, an interlayer insulating film 1116 provided so as to cover at least the oxide semiconductor film 1106, the gate electrode 1110, and the pair of electrodes 1114, and a wiring 1118 provided so as to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

This example can be implemented in combination with any of the above embodiments as appropriate.

EXAMPLE 2

In this example, another example of a transistor in which an In—Sn—Zn-based oxide semiconductor is used for an oxide semiconductor film will be described below.

Figure 31A:
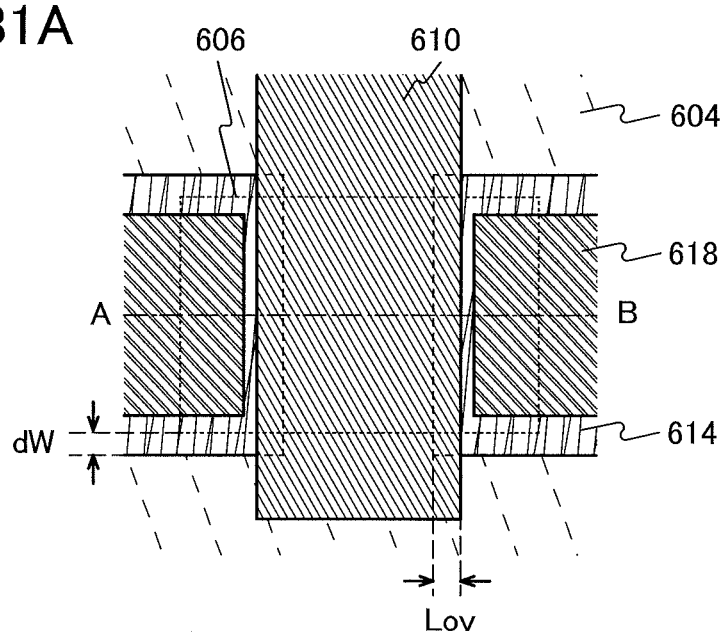
FIGS. 31A and 31B are diagrams showing a structure of a transistor.
Figure 31B:
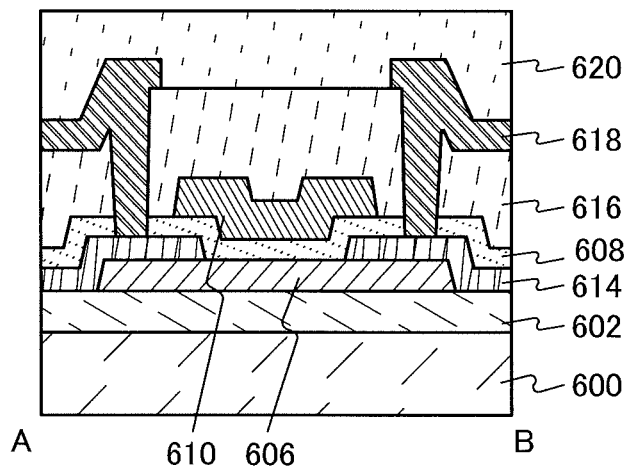

FIGS. 31A and 31B are a top view and a cross-sectional view showing a structure of a transistor manufactured in this example. FIG. 31A is the top view of the transistor. FIG. 31B is a cross-sectional view along dashed-dotted line A—B in FIG. 31A.

The transistor shown in FIG. 31B includes a substrate 600, a base insulating film 602 provided over the substrate 600, an oxide semiconductor film 606 provided over the base insulating film 602, a pair of electrodes 614 in contact with the oxide semiconductor film 606, a gate insulating film 608 provided over the oxide semiconductor film 606 and the pair of electrodes 614, a gate electrode 610 provided to overlap with the oxide semiconductor film 606 with the gate insulating film 608 positioned therebetween, an interlayer insulating film 616 provided to cover the gate insulating layer 608 and the gate electrode 610, wirings 618 connected to the pair of electrodes 614 through openings formed in the interlayer insulating film 616, and a protective film 620 provided to cover the interlayer insulating film 616 and the wirings 618.

As the substrate 600, a glass substrate can be used. As the base insulating film 602, a silicon oxide film can be used. For the oxide semiconductor film 606, an In—Sn—Zn-based oxide semiconductor can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure shown in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This example can be implemented in combination with any of the above embodiments as appropriate.

EXAMPLE 3

A feature of the memory device according to one embodiment of the present invention is that memory capacity per unit area can be increased without complicating the manufacturing process. Thus, with the memory device according to one embodiment of the present invention, a small electronic device which can be manufactured at a low cost or a sophisticated electronic device can be provided.

The memory device according to one embodiment of the present invention can be used for display devices, laptop personal computers, or image reproducing devices provided with recording media (typically, devices which reproduce the content of recording media such as digital versatile discs (DVDs) and have displays for displaying the reproduced images). Other than the above, as an electronic device which can be provided with the memory device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are shown in FIGS. 32A to 32C.

Figure 32A:
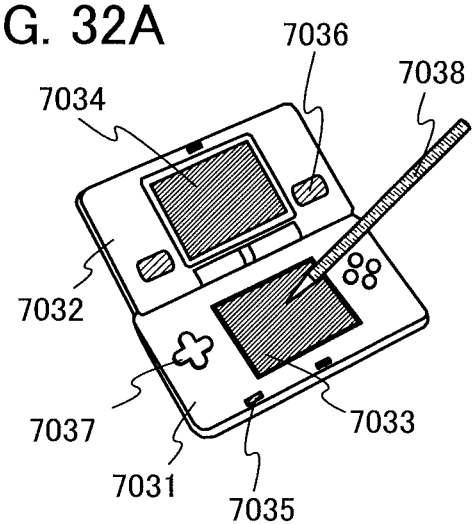
FIGS. 32A to 32C are diagrams showing electronic devices.

FIG. 32A illustrates a portable game machine including a housing 7031, a housing 7032, a display portion 7033, a display portion 7034, a microphone 7035, speakers 7036, an operation key 7037, a stylus 7038, and the like. The memory device according to one embodiment of the present invention can be used for an integrated circuit for controlling driving of the portable game machine. With the use of the memory device which is one embodiment of the present invention for the integrated circuit for controlling the driving of the portable game machine, a small portable game machine which can be manufactured at a low cost and a sophisticated portable game machine can be provided. Although the portable game machine illustrated in FIG. 32A includes two display portions 7033 and 7034, the number of display portions included in the portable game machine is not limited to two.

Figure 32B:
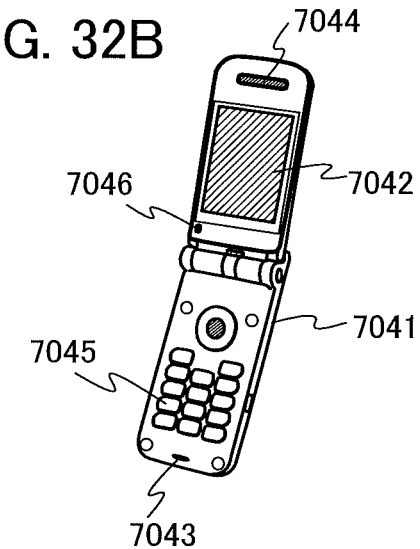

FIG. 32B illustrates a mobile phone including a housing 7041, a display portion 7042, an audio-input portion 7043, an audio-output portion 7044, an operation key 7045, a light-receiving portion 7046, and the like. Light received in the light-receiving portion 7046 is converted into electrical signals, whereby external images can be loaded. The memory device according to one embodiment of the present invention can be used for an integrated circuit for controlling driving of the mobile phone. With the use of the semiconductor device which is one embodiment of the present invention for the integrated circuit for controlling driving of the mobile phone, a small mobile phone which can be manufactured at a low cost or a sophisticated mobile phone can be provided.

Figure 32C:
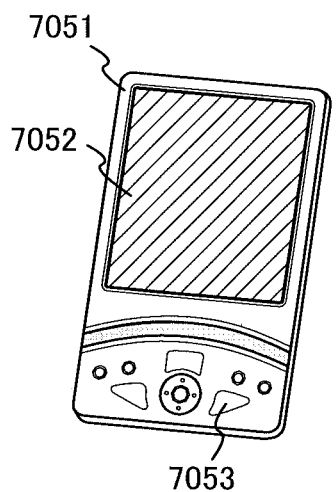

FIG. 32C illustrates a portable information terminal including a housing 7051, a display portion 7052, an operation key 7053, and the like. A modem may be incorporated in the housing 7051 of the portable information terminal illustrated in FIG. 32C. The memory device according to one embodiment of the present invention can be used for an integrated circuit for controlling driving of the portable information terminal. With the use of the semiconductor device which is one embodiment of the present invention for the integrated circuit for controlling driving of the personal digital assistant, a small portable information terminal which can be manufactured at a low cost or a sophisticated portable information terminal can be provided.

This example can be implemented in combination with any of the above embodiments as appropriate.

This application is based on Japanese Patent Application serial no. 2010-253476 filed with Japan Patent Office on Nov.

12, 2010 and Japanese Patent Application serial no. 2011-108889 filed with Japan Patent Office on May 14, 2011, the entire contents of which are hereby incorporated by reference.

What is claimed is:

1. A semiconductor device comprising:
a first memory cell comprising a first switching element and a first capacitor;
a second memory cell comprising a second switching element and a second capacitor;
a first word line;
a second word line;
a first bit line; and
a second bit line,
wherein the first switching element is configured to control an electrical connection between the first bit line and a first electrode of the first capacitor in accordance with a potential applied to the first word line,
wherein the second switching element is configured to control an electrical connection between the second bit line and a first electrode of the second capacitor in accordance with a potential applied to the second word line,
wherein a second electrode of the second capacitor is electrically connected to the first word line,
wherein the first memory cell and the second memory cell are stacked, and
wherein the second memory cell is over the first memory cell.

2. The semiconductor device according to claim 1, wherein the first switching element is a transistor comprising a semiconductor film comprising an oxide semiconductor.

3. The semiconductor device according to claim 2, wherein the oxide semiconductor comprises In, Ga and Zn.

4. The semiconductor device according to claim 2, wherein a hydrogen concentration of the semiconductor film is lower than $1\times10^{19}/cm^3$.

5. A semiconductor device comprising:
a plurality of first memory cells;
a plurality of first word lines;
a plurality of first bit lines;
a plurality of second memory cells;
a plurality of second word lines;
a plurality of second bit lines; and
a capacitor line,
wherein each of the plurality of first memory cells comprises a first switching element and a first capacitor,
wherein each of the plurality of second memory cells comprises a second switching element and a second capacitor,
wherein in at least one of the plurality of first memory cells, in accordance with a potential applied to one of the plurality of first word lines, the first switching element is configured to control an electrical connection between one of the plurality of first bit lines and a first electrode of the first capacitor,
wherein a second electrode of the first capacitor is electrically connected to the capacitor line,
wherein in at least one of the plurality of second memory cells, in accordance with a potential applied to one of the plurality of second word lines, the second switching element is configured to control an electrical connection between one of the plurality of second bit lines and a first electrode of the second capacitor,
wherein a second electrode of the second capacitor is electrically connected to one of the plurality of first word lines,
wherein the plurality of first memory cells and the plurality of second memory cells are stacked,
wherein the plurality of second memory cells is over the plurality of first memory cells,
wherein the plurality of first word lines is over the capacitor line, and
wherein the plurality of second word lines is over the plurality of first word lines.

6. The semiconductor device according to claim 5, wherein the first switching element is a transistor comprising a semiconductor film comprising an oxide semiconductor.

7. The semiconductor device according to claim 6, wherein the oxide semiconductor comprises In, Ga and Zn.

8. The semiconductor device according to claim 6, wherein a hydrogen concentration of the semiconductor film is lower than $1\times10^{19}/cm^3$.

9. A semiconductor device comprising:
a first memory cell comprising a first transistor and a first capacitor;
a second memory cell comprising a second transistor and a second capacitor;
a first word line;
a second word line;
a first bit line; and
a second bit line,
wherein one of a source and a drain of the first transistor is electrically connected to the first bit line,
wherein the other of the source and the drain of the first transistor is electrically connected to a first electrode of the first capacitor,
wherein a gate of the first transistor is electrically connected to the first word line,
wherein one of a source and a drain of the second transistor is electrically connected to the second bit line,
wherein the other of the source and the drain of the second transistor is electrically connected to a first electrode of the second capacitor,
wherein a gate of the second transistor is electrically connected to the second word line,
wherein a second electrode of the second capacitor is electrically connected to the first word line,
wherein the first memory cell and the second memory cell are stacked, and
wherein the second memory cell is over the first memory cell.

10. The semiconductor device according to claim 9, wherein the first transistor comprises a semiconductor film comprising an oxide semiconductor.

11. The semiconductor device according to claim 10, wherein the oxide semiconductor comprises In, Ga and Zn.

12. The semiconductor device according to claim 10, wherein a hydrogen concentration of the semiconductor film is lower than $1\cdot10^{19}/cm^3$.

13. A semiconductor device comprising:
a first memory cell comprising a first transistor and a first capacitor;
a second memory cell comprising a second transistor and a second capacitor;
a first word line;
a second word line;
a first bit line; and
a second bit line,
wherein one of a source and a drain of the first transistor is electrically connected to the first bit line,
wherein the other of the source and the drain of the first transistor is electrically connected to a first electrode of the first capacitor, wherein a gate of the first transistor is electrically connected to the first word line, wherein one of a source and a drain of the second transistor is electrically connected to the second bit line, wherein the other of the source and the drain of the second transistor is electrically connected to a first electrode of the second transistor, wherein a gate of the second transistor is electrically connected to the second word line, wherein a second electrode of the second capacitor is electrically connected to the first word line, wherein the first transistor is over a substrate, wherein an insulating film is over the first transistor, and wherein the second transistor is over the insulating film.

14. The semiconductor device according to claim 13, wherein the first transistor comprises a semiconductor film comprising an oxide semiconductor.

15. The semiconductor device according to claim 14, wherein the oxide semiconductor comprises In, Ga and Zn.

16. The semiconductor device according to claim 14, wherein a hydrogen concentration of the semiconductor film is lower than $1 \times 10^{19}/cm^3$.

17. A semiconductor device comprising:
a first memory cell comprising a first transistor and a first capacitor;
a second memory cell comprising a second transistor and a second capacitor;
a first word line;
a second word line;
a first bit line;
a second bit line; and
a capacitor line,
wherein one of a source and a drain of the first transistor is electrically connected to the first bit line,
wherein the other of the source and the drain of the first transistor is electrically connected to a first electrode of the first capacitor,
wherein a gate of the first transistor is electrically connected to the first word line,
wherein one of a source and a drain of the second transistor is electrically connected to the second bit line,
wherein the other of the source and the drain of the second transistor is electrically connected to a first electrode of the second transistor,
wherein a gate of the second transistor is electrically connected to the second word line,
wherein a second electrode of the second capacitor is electrically connected to the first word line,
wherein a second electrode of the first capacitor is electrically connected to the capacitor line,
wherein the capacitor line is over a substrate,
wherein a first insulating film is over the capacitor line,
wherein the first transistor is over the first insulating film,
wherein a second insulating film is over the first transistor, and
wherein the second transistor is over the second insulating film.

18. The semiconductor device according to claim 17, wherein the first transistor comprises a semiconductor film comprising an oxide semiconductor.

19. The semiconductor device according to claim 18, wherein the oxide semiconductor comprises In, Ga and Zn.

20. The semiconductor device according to claim 18, wherein a hydrogen concentration of the semiconductor film is lower than $1 \times 10^{19}/cm^3$.

* * * * *